(12) United States Patent
Shimizu et al.

(10) Patent No.: US 11,559,758 B2
(45) Date of Patent: *Jan. 24, 2023

(54) FILTERING DEVICE, PURIFICATION DEVICE, CHEMICAL LIQUID MANUFACTURING DEVICE, FILTERED SUBSTANCE TO BE PURIFIED, CHEMICAL LIQUID, AND ACTINIC RAY-SENSITIVE OR RADIATION-SENSITIVE RESIN COMPOSITION

(71) Applicant: FUJIFILM Corporation, Tokyo (JP)

(72) Inventors: Tetsuya Shimizu, Shizuoka (JP); Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/745,493

(22) Filed: Jan. 17, 2020

(65) Prior Publication Data

US 2020/0147528 A1 May 14, 2020

Related U.S. Application Data

(63) Continuation of application No. PCT/JP2018/028018, filed on Jul. 26, 2018.

(30) Foreign Application Priority Data

Jul. 26, 2017 (JP) .............................. JP2017-144363
Jul. 24, 2018 (JP) .............................. JP2018-138625

(51) Int. Cl.
*B01D 29/58* (2006.01)
*B01D 29/00* (2006.01)
(Continued)

(52) U.S. Cl.
CPC ......... *B01D 29/58* (2013.01); *B01D 29/0052* (2013.01); *B01D 29/23* (2013.01);
(Continued)

(58) Field of Classification Search
CPC .... B01D 29/58; B01D 29/0052; B01D 29/23; B01D 39/1623; B01D 61/027;
(Continued)

(56) References Cited

U.S. PATENT DOCUMENTS 6,733,637 B1    5/2004  Burton et al.
2008/0305767 A1  12/2008  Tahara et al.
(Continued)

FOREIGN PATENT DOCUMENTS

CN    201728068 U    2/2011
CN    102471103 A    5/2012
(Continued)

OTHER PUBLICATIONS

English language machine translation of CN106104386A, 35 Pages, No Date.*

(Continued)

*Primary Examiner* — Pranav N Patel
(74) *Attorney, Agent, or Firm* — Sughrue Mion, PLLC

(57) ABSTRACT

An object of the present invention is to provide a filtering device which makes it possible to obtain a chemical liquid having excellent performance and enables filter media to have sufficiently long pot life. Another object of the present invention is to provide a purification device, a chemical liquid manufacturing device, a filtered substance to be purified, a chemical liquid, and an actinic ray-sensitive or radiation-sensitive resin composition. A filtering device according to an embodiment of the present invention has a first filter unit including a first filter, which satisfies at least one condition selected from the group consisting of follow- (Continued)

ing conditions 1 to 3, and a housing accommodating the first filter and a second filter unit including a second filter different from the first filter and a housing accommodating the second filter, in which the first filter unit and the second filter unit are independently disposed in a pipe line through which a substance to be purified is supplied.

Condition 1: the filter has a filter medium including two or more layers containing materials different from each other.

Condition 2: the filter has a filter medium including two or more layers having different pore structures.

Condition 3: the filter has a filter medium including one layer in which different materials are mixed together.

35 Claims, 9 Drawing Sheets

(51) Int. Cl.
  *B01D 29/23*  (2006.01)
  *B01D 39/16*  (2006.01)
  *B01D 61/02*  (2006.01)
  *B01D 63/06*  (2006.01)
  *B01D 69/02*  (2006.01)
  *B01D 69/04*  (2006.01)

(52) U.S. Cl.
  CPC ....... *B01D 39/1623* (2013.01); *B01D 61/027* (2013.01); *B01D 63/065* (2013.01); *B01D 69/02* (2013.01); *B01D 69/04* (2013.01); *B01D 2201/18* (2013.01); *B01D 2201/325* (2013.01); *B01D 2239/02* (2013.01); *B01D 2239/065* (2013.01); *B01D 2239/1208* (2013.01); *B01D 2239/1216* (2013.01); *B01D 2325/02* (2013.01)

(58) Field of Classification Search
  CPC ...... B01D 63/065; B01D 69/02; B01D 69/04; B01D 2201/18; B01D 2201/325; B01D 2239/02; B01D 2239/065; B01D 2239/1208; B01D 2239/1216; B01D 2325/02; B01D 37/00; B01D 2239/025; B01D 39/1692; B01D 63/06; B01D 2319/025; B01D 2319/06; B01D 61/18; B01D 61/58; B01D 63/14; B01D 65/02; B01D 69/00; B01D 71/02; B01D 71/04; B01D 71/10; B01D 71/26; B01D 71/28; B01D 71/32; B01D 71/56; B01D 71/68; G03F 7/26
  See application file for complete search history.

(56) References Cited

U.S. PATENT DOCUMENTS

| | | | |
|---|---|---|---|
| 2012/0118824 A1 | 5/2012 | Kashihara et al. | |
| 2013/0087500 A1 | 4/2013 | Ishizuka et al. | |
| 2014/0061114 A1 | 3/2014 | Ramirez | |
| 2015/0001146 A2 | 1/2015 | Ramirez et al. | |
| 2016/0024005 A1* | 1/2016 | Yokokawa | G03F 7/0045 430/17 |
| 2016/0089622 A1 | 3/2016 | Takashima et al. | |
| 2016/0220958 A1 | 8/2016 | Fukui et al. | |
| 2017/0015692 A1* | 1/2017 | Samec | D21C 11/0007 |
| 2017/0348618 A1 | 12/2017 | Tatsuhara | |

FOREIGN PATENT DOCUMENTS

| | | | |
|---|---|---|---|
| CN | 103648623 | A | 3/2014 |
| CN | 204841427 | U | 12/2015 |
| CN | 106104386 | A | 11/2016 |
| JP | 59-132904 | A | 7/1984 |
| JP | 4-334531 | A | 11/1992 |
| JP | 2003-535836 | A | 12/2003 |
| JP | 2009-119415 | A | 6/2009 |
| JP | 2012-011369 | A | 1/2012 |
| JP | 2014-514158 | A | 6/2014 |
| JP | 2016-071020 | A | 5/2016 |
| JP | 2016-089064 | A | 5/2016 |
| TW | 201536842 | A | 10/2015 |
| WO | 2015/050125 | A1 | 4/2015 |
| WO | 2016/110942 | A1 | 7/2016 |

OTHER PUBLICATIONS

Notice of Reasons for Refusal dated Dec. 8, 2020 from the Japanese Patent Office in JP Application No. 2019-532848.
Notification of Reason for Refusal dated Jan. 11, 2021 from the Korean Intellectual Property Office in KR Application No. 10-2020-7000400.
Communication dated Jul. 8, 2021 from the China National Intellectual Property Administration in CN Application No. 201880047759.1.
Communication dated Aug. 3, 2021 from the Japanese Patent Office in JP application No. 2019-532848.
International Search Report dated Sep. 18, 2018 from the International Searching Authority in International Application No. PCT/JP2018/028018.
International Preliminary Report on Patentability dated Jan. 28, 2020 from the International Bureau in International Application No. PCT/JP2018/028018.
Written Opinion dated Sep. 18, 2018 from the International Bureau in International Application No. PCT/JP2018/028018.
Office Action dated May 4, 2022 in Taiwanese Application No. 107125898.
Communication dated Feb. 15, 2022 from The State Intellectual Property Office of People's Republic English of China in Application No. 201880047759.1.
Office Action dated Oct. 10, 2022 in Chinese Application No. 201880047759.1.
Office Action dated Nov. 22, 2022 in Japanese Application No. 2021-174031.

* cited by examiner

FILTERING DEVICE, PURIFICATION DEVICE, CHEMICAL LIQUID MANUFACTURING DEVICE, FILTERED SUBSTANCE TO BE PURIFIED, CHEMICAL LIQUID, AND ACTINIC RAY-SENSITIVE OR RADIATION-SENSITIVE RESIN COMPOSITION

CROSS-REFERENCE TO RELATED APPLICATIONS

This application is a Continuation of PCT International Application No. PCT/JP2018/028018 filed on Jul. 26, 2018, which claims priority under 35 U.S.C. § 119(a) to Japanese Patent Application No. 2017-144363 filed on Jul. 26, 2017 and Japanese Patent Application No. 2018-138625 filed on Jul. 24, 2018. Each of the above applications is hereby expressly incorporated by reference, in its entirety, into the present application.

BACKGROUND OF THE INVENTION

1. Field of the Invention

The present invention relates to a filtering device, a purification device, a chemical liquid manufacturing device, a filtered substance to be purified, a chemical liquid, and an actinic ray-sensitive or radiation-sensitive resin composition.

2. Description of the Related Art

At the time of manufacturing semiconductor devices, a chemical liquid (typically, an organic solvent) containing a solvent is used. In recent years, there has been a demand for a further reduction in impurities such as metal components contained in the chemical liquid. In addition, the manufacturing of semiconductor devices at a node equal to or smaller than 10 nm is being examined, and accordingly, the aforementioned demand is increasing.

JP2014-514158A describes a filter medium including a non-sieving membrane layer having a predetermined pore size distribution, a sieving membrane layer having a predetermined pore size distribution, and a nylon nanofiber layer which has a predetermined pore size distribution wider than the pore size distribution of the non-sieving membrane layer and the sieving membrane layer, and the like.

SUMMARY OF THE INVENTION

The inventors of the present invention prepared a filter having the filter medium described in JP2014-514158A, and purified a substance to be purified by using the filter. As a result, it has been revealed that because the content of impurities contained in a chemical liquid obtained after purification is small, the performance of the obtained chemical liquid is excellent, but unfortunately, the pot life of the filter medium is short.

An object of the present invention is to provide a filtering device which makes it possible to obtain a chemical liquid having excellent performance and enables filter media to have sufficiently long pot life. Another object of the present invention is to provide a purification device, a chemical liquid manufacturing method, a filtered substance to be purified, a chemical liquid, and an actinic ray-sensitive or radiation-sensitive resin composition.

In order to achieve the aforementioned objects, the inventors of the present invention carried out an intensive examination. As a result, the inventors have found that the object can be achieved by the following constitution.

(1) A filtering device having a first filter unit including a first filter, which satisfies at least one condition selected from the group consisting of conditions 1 to 3 that will be described later, and a housing accommodating the first filter, and a second filter unit including a second filter different from the first filter and a housing accommodating the second filter, in which the first filter unit and the second filter unit are independently disposed in a pipe line through which a substance to be purified is supplied.

(2) The purification device described in (1), in which in a cumulative pore distribution of the filter medium that the first filter has, a difference between a size of cumulative 10% and a size of cumulative 75% is equal to or greater than 3 nm.

(3) The filtering device described in (2), in which a ratio of a size of cumulative 75% to a size of cumulative 10% is 2.0 to 20.0.

(4) The filtering device described in any one of (1) to (3), in which a pore size of a filter medium that the second filter has is equal to or smaller than 200 nm.

(5) The filtering device described in any one of (1) to (4), in which a pore size of a filter medium that the second filter has is equal to or smaller than 100 nm.

(6) The filtering device described in any one of (1) to (5), in which a pore size of a filter medium that the second filter has is equal to or smaller than a pore size of the filter medium that the first filter has.

(7) The filtering device described in any one of (1) to (6), in which the second filter unit is on a secondary side of the first filter unit, and a pore size of a filter medium that the second filter has is equal to or smaller than a pore size of the filter medium that the first filter has.

(8) The filtering device described in any one of (1) to (5), in which the second filter unit is disposed on a primary side, and the first filter unit is disposed on a secondary side.

(9) The filtering device described in (8), in which a pore size of a filter medium that the second filter has is equal to or greater than a pore size of the filter medium that the first filter has.

(10) The filtering device described in (1) to (9), in which the second filter unit is further disposed on a secondary side of the first filter unit, a pore size of a filter medium included in the second filter unit disposed on the secondary side is equal to or smaller than a pore size of the filter medium that the first filter has, and the filter medium that the first filter has includes a layer containing a base material having undergone a surface treatment.

(11) The filtering device described in any one of (1) to (10), in which the first filter has a filter medium including two or more layers containing materials different from each other.

(12) The filtering device described in any one of (1) to (11), in which a filter medium that the second filter has contains the same material as the material of any of the two or more layers.

(13) The filtering device described in any one of (1) to (12), in which in a relationship among Hansen solubility parameters $\delta Dp$, $\delta Pp$, and $\delta Hp$ and an interaction radius R0 of at least one kind of filter medium selected from the group consisting of the filter medium that the first filter has and a filter medium that the second filter has and Hansen solubility parameters $\delta Ds$, $\delta Ps$, and $\delta Hs$ of the substance to be purified, provided that Ra is represented by an equation of Ra²=4 (δDs−δDp)²+(δPs−δPp)²+(δHs−δHp)², a ratio of Ra to R0 is equal to or lower than 1.0.

(14) The filtering device described in any one of (1) to (13), in which the first filter has a filter medium including two or more layers having pore structures different from each other.

(15) The filtering device described in any one of (1) to (14), in which the first filter has a filter medium including a layer having pore structures different from each other in a thickness direction.

(16) The filtering device described in any one of (1) to (15), in which the filter medium that the first filter has includes a layer containing a base material having an ion exchange group.

(17) The filtering device described in any one of (1) to (16), in which the filter medium that the first filter has includes a layer containing a base material having undergone a surface treatment and a layer containing a base material having not undergone a surface treatment.

(18) The filtering device described in any one of (1) to (17), in which at least one kind of filter selected from the group consisting of the first filter and the second filter is capable of being backwashed.

(19) The filtering device described in any one of (1) to (18), in which the filter medium that the first filter has and a filter medium that the second filter has contain at least one kind of material selected from the group consisting of nylon, polyethylene, polypropylene, polyfluorocarbon, cellulose, diatomite, polystyrene, glass, and polysulfone.

(20) The filtering device described in any one of (1) to (19), in which at least one kind of filter medium selected from the group consisting of the filter medium that the first filter has and a filter medium that the second filter has includes at least one kind of layer selected from the group consisting of a nanoporous membrane layer and a nanofiber layer.

(21) The filtering device described in (20), in which the filter medium that the first filter has includes at least the nanoporous membrane layer and the nanofiber layer.

(22) The filtering device described in any one of (1) to (21), in which the filter medium that the first filter has includes a non-sieving membrane layer having a pore size distribution of 10 to 50 nm, a sieving membrane layer having a pore size distribution of 2 to 50 nm, and a nylon nanofiber layer.

(23) The filtering device described in (22), in which the nylon nanofiber layer is between the non-sieving membrane layer and the sieving membrane layer.

(24) The filtering device described in (22), in which the non-sieving membrane layer is between the sieving membrane layer and the nylon nanofiber layer.

(25) The filtering device described in (22), in which the sieving membrane layer is between the non-sieving membrane layer and the nylon nanofiber layer.

(26) The filtering device described in any one of (19) to (25), in which the first filter further includes a porous support constituted with one layer or two or more layers.

(27) The filtering device described in any one of (1) to (26), in which the first filter is capable of being backwashed by causing a washing solution to flow from a secondary side of the first filter unit to a primary side of the first filter unit.

(28) A purification device comprising the filtering device described in any one of (1) to (27) and a tank which is on a primary side of the filtering device and capable of storing a substance to be purified.

(29) The purification device described in (28), in which the secondary side of the first filter unit is connected to the tank through a pipe line, and a filtered substance to be purified having been filtered through at least the first filter is capable of being sent back to the tank through the pipe line.

(30) The purification device described in (28) or (29), further comprising a distillation device on a primary side of the filtering device.

(31) The purification device described in any one of (28) to (30), further comprising a circulable path in the filtering device.

(32) A chemical liquid manufacturing device comprising the filtering device described in any one of (1) to (27) and a mixing device preparing a substance to be purified by mixing one raw material or two or more raw materials together.

(33) A filtered substance to be purified obtained by filtering a substance to be purified by using the filtering device described in any one of (1) to (27).

(34) A chemical liquid filtered using the filtering device described in any one of (1) to (27), containing an organic solvent, in which the organic solvent is at least one kind of compound selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, isoamyl acetate, isopropanol, 4-methyl-2-pentanol, dimethyl sulfoxide, N-methyl-2-pyrrolidone, diethylene glycol, ethylene glycol, dipropylene glycol, propylene glycol, ethylene carbonate, propylene carbonate, sulfolane, cycloheptanone, and 2-heptanone.

(35) A chemical liquid filtered using the filtering device described in any one of (1) to (27), containing water.

(36) The chemical liquid described in (34) or (35) that is for manufacturing semiconductors.

(37) An actinic ray-sensitive or radiation-sensitive resin composition filtered using the filtering device described in any one of (1) to (27).

According to the present invention, it is possible to provide a filtering device which makes it possible to obtain a chemical liquid having excellent performance and enables filter media to have sufficiently long pot life. Furthermore, the present invention can provide a purification device, a chemical liquid manufacturing method, a filtered substance to be purified, a chemical liquid, and an actinic ray-sensitive or radiation-sensitive resin composition.

DESCRIPTION OF THE PREFERRED EMBODIMENTS

Figure 1:
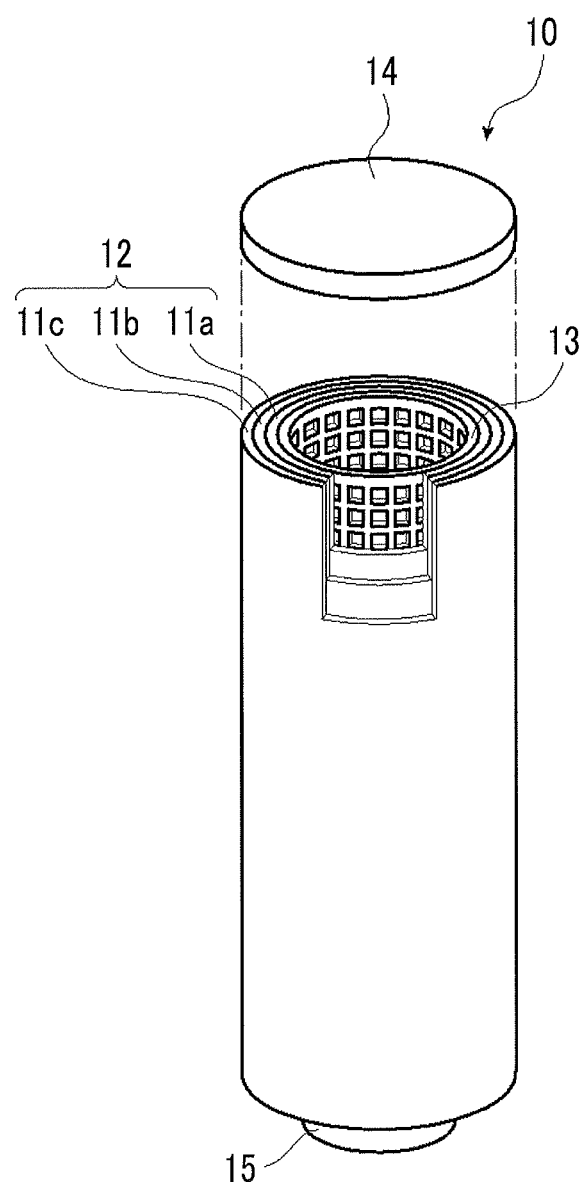
FIG. 1 is an exploded perspective view showing a portion of a typical first filter.

Hereinafter, the present invention will be specifically described.

The following constituents will be described based on typical embodiments of the present invention in some cases, but the present invention is not limited to the embodiments.

In the present specification, a range of numerical values described using "to" means a range including the numerical values listed before and after "to" as a lower limit and an upper limit respectively.

In the present invention, "preparation" means not only the preparation of a specific material by means of synthesis or mixing but also the preparation of a predetermined substance by means of purchase and the like.

In the present specification, "ppm" means "parts-per-million ($10^{-6}$)", "ppb" means "parts-per-billion ($10^{-9}$)", "ppt" means "parts-per-trillion ($10^{-12}$)", and "ppq" means "parts-per-quadrillion ($10^{-15}$)".

In the present invention, 1 Å (angstrom) equals 0.1 nm.

In the present invention, regarding the description of a group (atomic group), in a case where whether the group is substituted or unsubstituted is not described, as long as the effects of the present invention are not impaired, the group includes a group which does not have a substituent and a group which has a substituent. For example, "hydrocarbon group" includes not only a hydrocarbon group which does not have a substituent (unsubstituted hydrocarbon group) but also a hydrocarbon group which has a substituent (substituted hydrocarbon group). The same is true for each compound.

Furthermore, in the present invention, "radiation" means, for example, far ultraviolet rays, extreme ultraviolet (EUV light; Extreme ultraviolet lithography), X-rays, electron beams, and the like. In addition, in the present invention, light means actinic rays or radiation. In the present invention, unless otherwise specified, "exposure" includes not only exposure, far ultraviolet rays, X-rays, and EUV, and the like, but also lithography by particle beams such as Electron beams or ion beams.

[Filtering Device]

The filtering device according to an embodiment of the present invention is a filtering device having a first filter unit including a predetermined first filter and a housing accommodating the first filter and a second filter unit including a second filter different from the first filter and a housing accommodating the second filter, in which the first filter unit and the second filter unit are independently disposed in a pipe line through which a substance to be purified is supplied. The housing of the first filter unit accommodates the first filter having a filter medium satisfying at least one condition selected from the group consisting of conditions 1 to 3 described below. In the following description, the filter medium the first filter has will be referred to as "first filter medium" as well.

Condition 1: the filter has a filter medium including two or more layers containing materials different from each other.

Condition 2: the filter has a filter medium including two or more layers having different pore structures.

Condition 3: the filter has a filter medium including one layer in which different materials are mixed together.

The housing of at least one of the two or more filter units accommodates the second filter.

It is more preferable that the first filter medium satisfies at least one of the condition 1 or the condition 2.

First Embodiment

Hereinafter, the constitution of the filtering device according to the embodiment of the present invention and the materials used in the filtering device will be described. The following filtering device is an example of the embodiments of the present invention, and the constitution of the filtering device and the materials used in the filtering device can be optionally replaced with known constitution and materials as long as the desired effects of the present invention are not impaired.

FIG. 1 is an exploded perspective view showing a portion of a typical first filter among the filters accommodated in the housings that the filtering device according to the embodiment of the present invention comprises. A first filter 10 has a filter medium 12, and the filter medium 12 includes three layers (11a to 11c) (the material and the pore size of each of the layers and the like will be described later).

As shown in FIG. 1, the filter medium 12 is in the form of a cylinder. On the inside of the filter medium 12, a cylindrical core 13 is disposed. The cylindrical core 13 is in the form of mesh, and a liquid can easily pass through the core 13. The top surfaces (bottom surfaces) of the filter medium 12 and the core 13 form concentric circles. Furthermore, a cap 14 is disposed on top of the cylindrical filter medium 12 and the core 13 so as to cover the upper end portions of each of these members. In addition, a liquid inlet 15 for allowing a liquid to flow into the filter from the inside of the core 13 is disposed on the lower end portion of the members.

Figure 2:
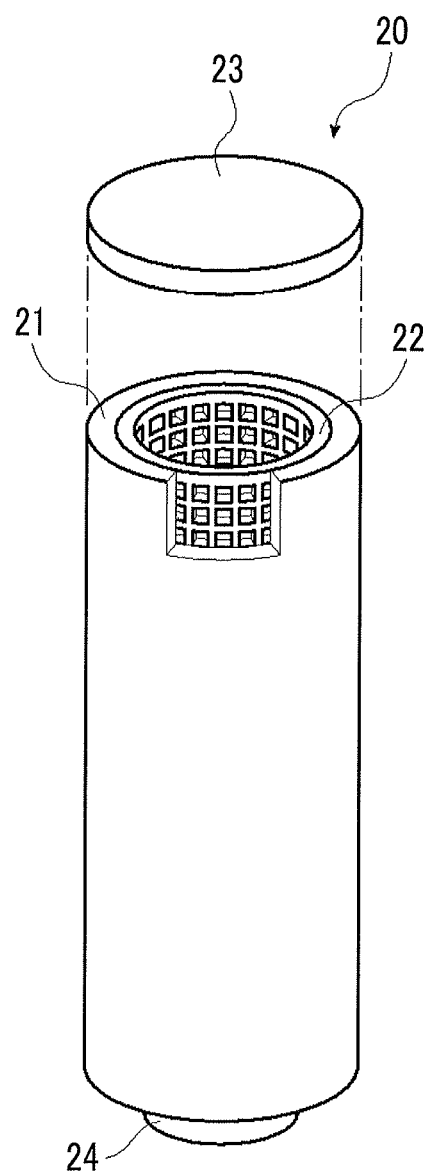
FIG. 2 is an exploded perspective view showing a portion of a typical second filter.

FIG. 2 is an exploded perspective view showing a portion of a typical second filter among the filters accommodated in the housings that the filtering device according to the embodiment of the present invention comprises. A second filter 20 has a cylindrical second filter medium 21 and a cylindrical core 22 for supporting the second filter medium 21 while contacting the inside of the second filter medium 21. A cylindrical core 22 is in the form of a mesh, and a liquid can easily pass through the core 22. The top surfaces (bottom surfaces) of the second filter medium 21 and the core 22 form concentric circles. A cap 23 is disposed on top of the cylindrical second filter medium 21 and the core 22 so as to cover the upper end portion of each of these members. Furthermore, a liquid inlet 24 for taking out a liquid from the inside of the core 22 is disposed on the lower end portion of the members. In addition, a protector, which is constituted to enable a liquid to easily pass through, may be disposed on the outside of the second filter medium 21.

Figure 3:
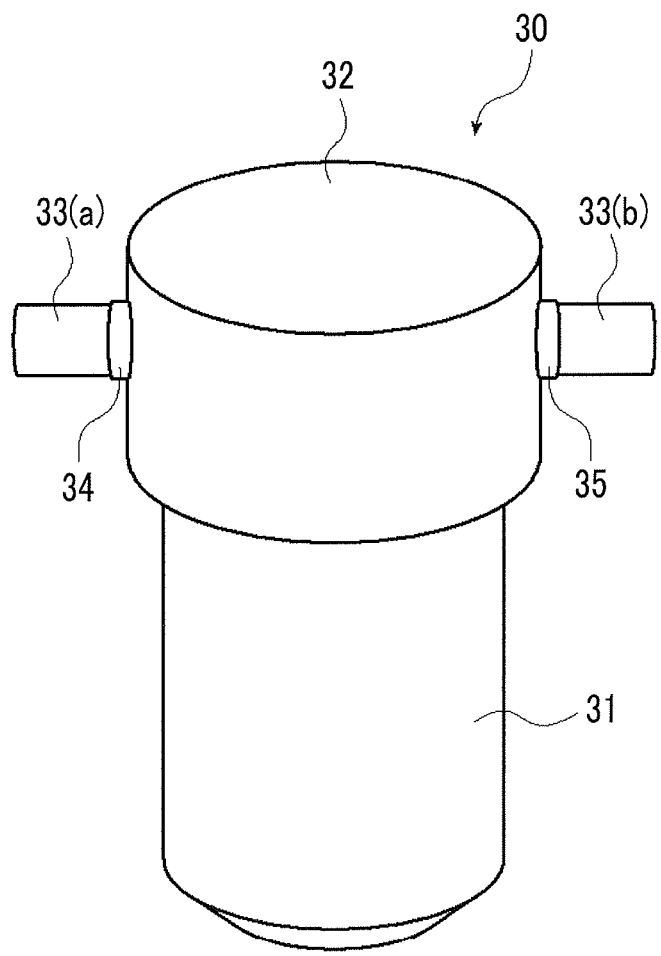
FIG. 3 is a perspective view showing an example of a filter unit.

FIG. 3 is a perspective view showing an example of the filter unit according to an embodiment of the present invention. A filter unit 30 has a housing including a body 31 and a lid 32 and a filter not shown in the drawing that is accommodated in the housing. A liquid inlet 34 for being connected to a pipe line 33(a) and a liquid outlet 35 for being connected to a pipe line 33(b) are disposed on the lid 32.

The filter unit 30 shown in FIG. 3 comprises the liquid inlet 34 and the liquid outlet 35 on the lid 32, but the filter unit according to the embodiment of the present invention is not limited thereto. As will be described later, the liquid inlet and the liquid outlet can be disposed at any location on the lid 32 and/or the body 31. Furthermore, the housing included in the filter unit 30 shown in FIG. 3 comprises the lid 32 and the body 31, but the housing that the filter unit comprises is not limited thereto. The lid and the body may be molded as an integral member.

Figure 4:
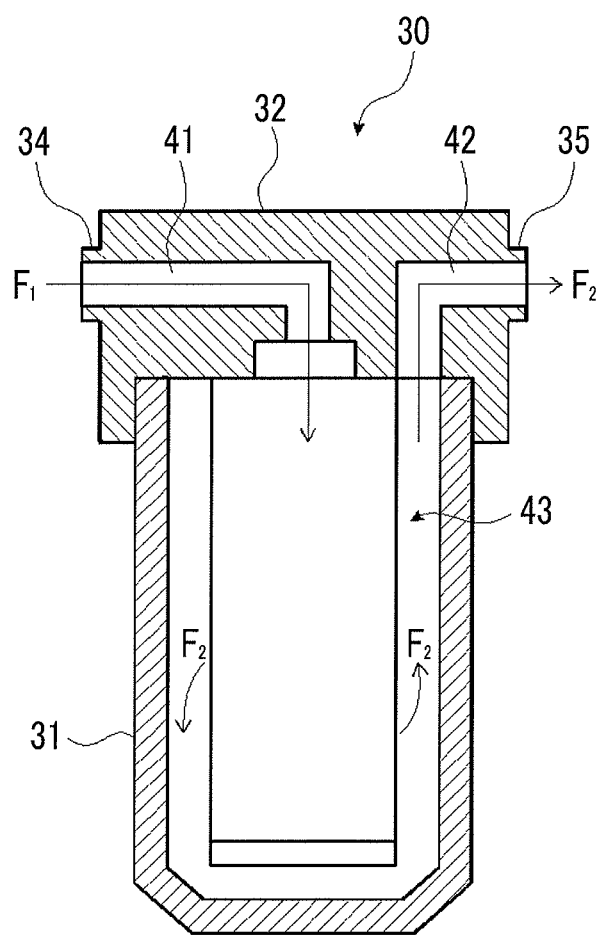
FIG. 4 is partial cross-sectional view of a filter unit that a filtering device comprises.

FIG. 4 is a cross-sectional view of a portion of the filter unit 30 that the filtering device according to the embodiment of the present invention comprises. The filter unit 30 comprises the liquid inlet 34 and the liquid outlet 35 on the lid 32. The liquid inlet 34 is connected to an internal pipe line 41, and the liquid outlet 35 is connected to an internal pipe line 42. The flow of a substance to be purified is indicated by $F_1$. The substance to be purified having flowed into the filter unit from the liquid inlet 34 flows into the body 31 through the internal pipe line 41 disposed in the interior of the lid 32, passes through the filter medium from the core of the filter 43, and flows into the external surface. In this process, the substance to be purified is purified.

The purified substance to be purified having flowed out to the outer surface passes through the internal pipe line 42 and taken out of the liquid outlet 35 (along the flow indicated by $F_2$ in FIG. 4).

In FIG. 2 and FIG. 3, the liquid inlet 34 and the liquid outlet 35 are disposed on the lid 32 of the housing. However, the housing that the filter unit comprises is not limited thereto, and the liquid inlet 34 and the liquid outlet 35 can be disposed at any location on the housing. In this case, the liquid inlet 34 may be disposed such that the substance to be purified flows into the filter 43 from the outside of the filter 43, and the liquid outlet 35 may be disposed such that the purified substance to be purified is taken out from the inside of the core of the filter 43. The structure described above merely shows an example of the filter unit according to the embodiment of the present invention, and the filter units that the filtering device according to the embodiment of the present invention comprises is not limited to the structure.

Figure 5:
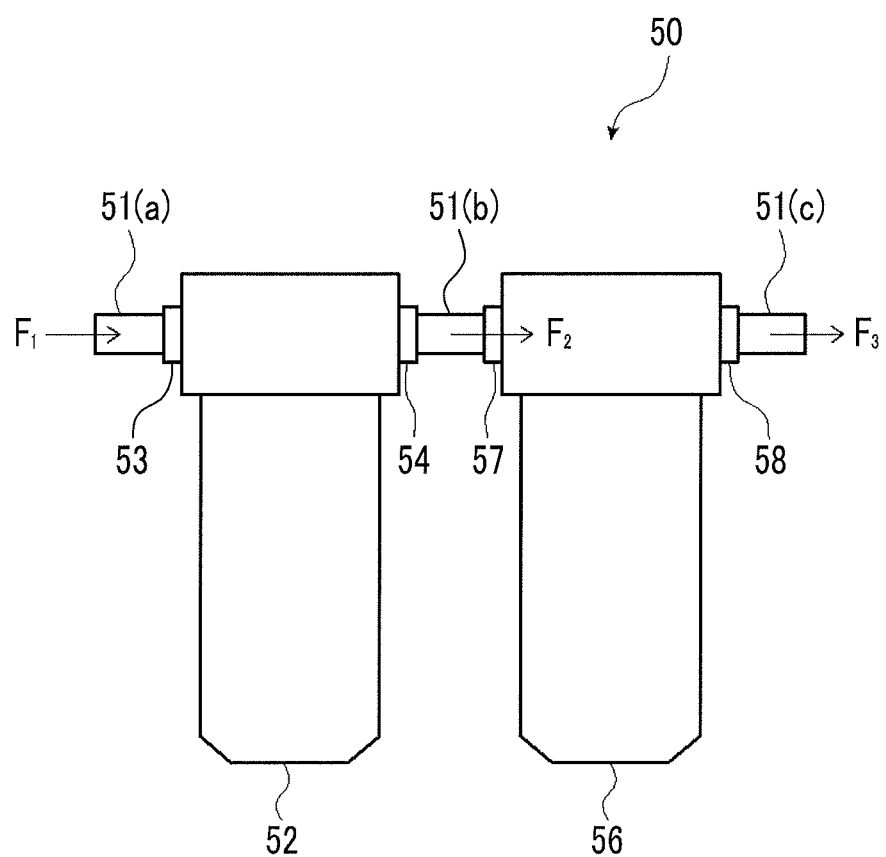
FIG. 5 is a schematic view of a filtering device according to a first embodiment of the present invention.

FIG. 5 is a schematic view of a filtering device 50 according to a first embodiment of the present invention. In pipe lines (represented by 51(a) to 51(c)), through which the substance to be purified is supplied, of the filtering device 50, a primary filter unit 52 and a secondary filter unit 56 are disposed in this order in a direction along which the substance to be purified is supplied. The primary filter unit 52 (a filter unit disposed on the primary side) is connected through the pipe lines 51(a) and 51(b), a liquid inlet 53, and a liquid outlet 54. The secondary filter unit 56 (a filter unit disposed on the secondary side) is connected through the pipe lines 51(b) and 51(c), a liquid inlet 57, and a liquid outlet 58.

In the filtering device 50 according to the above embodiment, the housing of the primary filter unit 52 accommodates the second filter 20. Furthermore, the housing of the secondary filter unit 56 (a filter unit disposed on the secondary side) between the filter units described above accommodates the first filter 10. That is, in the filtering device 50, the second filter unit is disposed on the primary side of the first filter unit.

The flow of the substance to be purified is indicated by $F_1$ to $F_3$. The substance to be purified having flowed into the filtering device from the liquid inlet 53 along the $F_1$ direction is purified by the second filter of the primary filter unit 52, and then taken out of the liquid outlet 54. Thereafter, the substance to be purified flows in a pipe line 51 along the direction indicated by $F_2$, purified by flowing into the first filter in the secondary filter unit 56 from the liquid inlet 57, and then taken out of the filtering device (typically, to a filling device connected to the filtering device through a pipe line and the like) along the $F_3$ direction from the liquid outlet 58.

In the filtering device 50, the housing of the primary filter unit 52 accommodates the second filter 20, and the housing of the secondary filter unit 56 accommodates the first filter 10. However, the filtering device according to the embodiment of the present invention is not limited thereto. The housing of the primary filter unit 52 may accommodate the first filter, and the housing of the secondary filter unit 56 may accommodate the second filter. That is, the first filter unit may be disposed on the primary side of the second filter unit. In a case where the first filter unit is disposed on the primary side of the second filter unit, the pore size of the filter medium the second filter has may be equal to or smaller than the pore size of the filter medium of the first filter.

Hereinafter, the forms of the members in the filtering device according to the embodiment of the present invention will be specifically described.

<First Filter>

In the filtering device according to the above embodiment, the housing of the secondary filter unit 56 accommodates the first filter. The filter medium 12 that the first filter of the filtering device according to the first embodiment of the present invention comprises includes a nylon nanoporous membrane layer 11a containing polyamide, a nanofiber layer 11b containing nylon, and a nanoporous membrane layer 11c containing ultra-high-molecular-weight polyethylene (UPE) in this order from the primary side (because the filter shown in FIG. 1 is in the form of a filter in which the substance to be purified flows into the filter from a liquid inlet 15, passes through the filter medium 12, and then flows to the outside, "primary side" means the core side).

As described above, in the filtering device according to the embodiment of the present invention, the first filter medium may satisfy at least one of the predetermined conditions 1 to 3, and the aforementioned structure is a form of the first filter. Accordingly, for example, the first filter medium may be in the form of a filter medium including two layers consisting of the nanoporous membrane layer 11a containing polyamide and the nanoporous membrane layer 11c containing UPE or in the form of a filter medium including one layer containing a mixture of polyamide and UPE. The materials of each of the layers included in the first filter can be arbitrarily selected according to the properties of the substance to be purified, the form (particles, colloid, and the like) of the substance to be filtered, and the like.

In the present specification, "porous membrane" means a membrane which retains components (residual liquid) in the substance to be purified such as gel, particles, colloid, cells, and a polyoligomer but allows the components that are substantially smaller than pores to pass through. The retention of components in the substance to be purified by the porous membrane depends, for example, on the operation conditions such as a face velocity, the use of a surfactant, pH, and a combination of these in some cases, and may also depend on the pore size and the structure of the porous membrane and the size and the structure of particles (whether the particles are hard particles or gel, and the like) supposed to be removed. In a preferred embodiment, the porous membrane is a nanoporous membrane. In the present specification, the nanoporous membrane means a porous membrane having a pore size of 1.0 to 100 nm.

In the present specification, the pore size of a filter medium means a pore size and a pore size distribution determined by bubble point of isopropanol (IPA).

In view of further improving the effects of the present invention, in a cumulative pore distribution of the filter medium the first filter has, a difference between a size of cumulative 10% and a size of cumulative 75% (size of cumulative 75%–size of cumulative 10%) is preferably equal to or greater than 3 nm. The upper limit of the difference is not particularly limited, but is preferably equal to or smaller than 50 nm and more preferably equal to or smaller than 20 nm.

The cumulative pore distribution can be measured using a pore size distribution analyzer "NANOPALM POROMETER" manufactured by SEIKA CORPORATION. The cumulative pore distribution refers to an integrated value of $dV/d\,\log_{10}(D)$ (V represents the volume of pores, and D represents the diameter of pores) of pores having a pore size greater than 0 to a predetermined pore size. "Size of cumulative 10%" means a pore size (nm) accounting for cumulative 10% on the cumulative pore distribution curve (size of pores accounting for 10% of the total volume of pores), and "size of cumulative 75%" means a pore size (nm) accounting for cumulative 75% on the cumulative pore distribution curve (size of pores accounting for 75% of the total volume of pores).

The ratio of the size of cumulative 75% to the size of cumulative 10% (size of cumulative 75%/size of cumulative 10%) is not particularly limited. However, in view of further improving the effects of the present invention, the ratio is preferably 2.0 to 20.0.

In the filter medium described above, the surface pore size within the surface on the primary side is different from the surface pore size within the surface on the secondary side. It is preferable that the surface pore size on the primary side is large. Particularly, in the filter medium described above, it is preferable that the pore size decreases toward the other surface side from one surface side.

The pore size of the filter medium the first filter has is not particularly limited, but is preferably 1 to 100 nm, more preferably 2 to 50 nm, and even more preferably equal to or greater than 2 nm and less than 50 nm.

The pore size distribution of the polyamide membrane layer as the nanoporous membrane layer is not particularly limited. The pore size distribution measured based on IPA or HFE7200 porometry bubble point is preferably 5 to 100 nm, more preferably 5 to 50 nm, and even more preferably 10 to 50 nm.

The pore size distribution of the UPE membrane layer as the nanoporous membrane layer is not particularly limited, but is preferably 2 to 200 nm, more preferably 2 to 100 nm, and even more preferably 2 to 50 nm. It is preferable that the nanofiber layer has a pore size distribution wider than any of the pore size distribution of the polyamide membrane layer or the pore size distribution of the UPE membrane layer.

The polyamide membrane layer is typically a non-sieving membrane layer. The non-sieving membrane layer means a layer trapping particles through a non-sieving retention mechanism or a layer optimized for trapping particles.

In a case where the substance to be purified contains gel as an impurity, the gel is mainly negatively charged. In order to remove the gel, the polyamide (particularly, nylon) membrane layer functions as a non-sieving membrane. Typically, the non-sieving membrane layer includes nylon membrane layers such as a nylon-6 membrane layer and a nylon-6,6 membrane layer, but the present invention is not limited thereto.

"Non-sieving retention mechanism" used in the present specification refers to retention resulting from the mechanism such as blocking, diffusion, and adsorption irrelevant to the pressure reduction of the filter or the bubble point of the porous membrane.

The non-sieving retention includes a retention mechanism such as blocking, diffusion, and adsorption removing particles supposed to be removed from the substance to be purified irrespective of the pressure reduction of the filter or the bubble point of the filter medium. The adsorption of particles onto the membrane surface is mediated, for example, by the intermolecular van der Waals force, electrostatic force, and the like. In a case where the particles moving in the non-sieving membrane layer having a serpiginous path cannot rapidly change direction so as not to contact the non-sieving membrane, a blocking effect is exerted. The transport of particles by diffusion is mainly caused by the random movement or the Brownian motion of small particles that results in a certain probability that the particles may collide with the filter medium. In a case where there is no repulsive force between the particles and the filter medium, the non-sieving retention mechanism can be activated. Accordingly, a non-sieving retention rate (%) can be evaluated under a neutral condition (for example, at around the isoelectric point of the membrane).

Typically, the UPE membrane layer is a sieving membrane layer. The sieving membrane layer means a layer trapping particles mainly through a sieving retention mechanism or a layer optimized for trapping particles through a sieving retention mechanism.

Typical examples of the sieving membrane layer include a polytetrafluoroethylene (PTFE) membrane and a UPE membrane, but the present invention is not limited thereto.

"Sieving retention mechanism" refers to retention caused in a case where the particles are larger than the pores of the porous membrane. The sieving retainability can be improved by forming a filter cake (aggregate of particles to be removed on the surface of the membrane). The filter cake effectively functions as a secondary filter.

The sieving retention rate can be evaluated using various surfactants. Because the particles are larger than the pores of the porous membrane, the particles are retained by sieving. As the surfactants, sodium dodecyl sulfate (SDS) or Triton X-100 can be used. The amount of the surfactant to be used can be selected such that the amount becomes larger than critical micelle concentration (CMC). The concentration of the surfactant higher than CMC can be measured using a tensiometer monitoring the surface tension of a fluid. The content of the surfactant is preferably within a range of 0.1% (w/w) to 0.3% (w/w), which provides sieving conditions. It is preferable that the porous membrane has a retention rate of 90% to 99.99%, 95% to 99.99%, 98% to 99.99%, or 99% to 99.99% under the sieving conditions. In some embodiments, it is preferable that the porous membrane has at least a retention rate equal to or higher than 90% (preferably equal to or higher than 95%, more preferably equal to or higher than 98%, and even more preferably equal to or higher than 99%) under the sieving conditions.

By combining the nanofiber layer and the nanoporous membrane layer, a filter medium is obtained through which the substance to be purified can be filtered within a time equal to or shorter than the time taken for a single nanoporous membrane layer to filter the substance to be purified. The combination of the nanofiber layer and the nanoporous membrane layer exhibits a better particle retainability in a liquid compared to a single nanoporous membrane layer in a liquid. The first filter included in the filtering device according to the above embodiment comprises the filter medium (the first filter medium) including the nanoporous membrane layer containing polyamide, the nanoporous membrane layer containing ultra-high-molecular-weight polyethylene (UPE), and a nanofiber layer containing nylon, but the first filter medium that the filtering device according to the embodiment of the present invention comprises is not limited thereto. For example, the nanoporous membrane layer may be formed of other polyolefins, polyfluorocarbons, and the like.

In a case where the nanofiber layer is a nylon nanofiber layer, the nanofiber layer can more efficiently retain the particles in the substance to be purified. Accordingly, it is possible to improve the particle retainability without increasing the time necessary for the substance to be purified to flow down for filtration. Typically, the nanofiber layer has a porous support (for example, porous nonwoven cloth), which will be described later, and a fibrous layer formed on the porous support in many cases. The nanofiber layer included in the first filter medium according to the embodiment of the present invention includes a porous support made of nylon and a fibrous layer made of nylon formed on the porous support.

For example, the nanofiber layer is in the form of a layer including a porous support (porous nonwoven cloth, manufactured by Asahi Kasei Corporation, material: nylon, weight: 40 g/m$^2$, "NO0540") and a fibrous layer formed on the support by an electrospinning method. However, the present invention is not limited thereto.

The material of the fibrous layer is not particularly limited as long as the material is a polymer that can form the fibrous layer. Examples of the polymer include polyamide and the like. Examples of the polyamide include nylon 6, nylon 6,6, and the like. The polymer forming the fibrous layer may be poly(ethersulfone). In a case where the nanofiber layer is on the primary side of the porous membrane layer, it is preferable that the surface energy of the nanofiber layer is higher than the surface energy of the polymer as the material of the porous membrane layer which is under the nanofiber layer. Examples of combinations satisfying the above condition include a combination of a nanofiber layer made of nylon material and a porous membrane layer made of polyethylene (UPE).

As the method for manufacturing the fibrous layer, known methods can be used without particular limitation. Examples of the method for manufacturing the nanofiber layer include electrospinning, electroblowing, melt blowing, and the like.

The nanofiber layer may be self-supported by itself. However, typically, the nanofiber layer is self-supported by including a porous support. The fibrous layer formed on the porous support may be peeled off and singly used as a nanofiber layer.

A liquid can be transmitted through the porous support on which the nanofiber layer can be formed. The porous support itself may have any filtration function. In a case where the fibrous layer is formed on the porous support, by pleating the porous support, a pleated nanofiber layer is obtained. Furthermore, in a case where the fibrous layer is formed on the porous support, the hardness of the nanofiber layer and the hardness of the filter medium including the nanofiber layer can be improved.

In a case where the porous support itself forms a filter medium, typically, the porous support forms a depth-type filter medium. That is, each of the fibrous layer and the porous support has a filtration function.

Examples of materials of the porous support include nylon 6, nylon 6,6, aramid, polyethylene terephthalate, polyether sulfone, and the like. Specifically, examples thereof include "NO5040" containing nylon manufactured by Asahi Kasei Corporation.

The structure of the nanoporous membrane (for example, a porous membrane containing UPE, PTFE, and the like) is not particularly limited. The nanoporous membrane has, for example, a lace shape, a string shape, a node shape, and the like.

The size distribution of pores in the nanoporous membrane and the positional distribution of pore size in the membrane are not particularly limited. The size distribution may be narrower, and the positional distribution of pore size in the membrane may be symmetric. Furthermore, the size distribution may be wider, and the positional distribution of pore size in the membrane may be asymmetric (this membrane is referred to as "asymmetric porous membrane" as well). In the asymmetric porous membrane, the size of the pores changes in the membrane. Typically, the pore size increases toward the other surface of the membrane from one surface of the membrane. In this case, the surface containing pores having a large pore size is called "open side" as well, and the surface containing pores having a small pore size is called "tight side" as well.

Examples of the asymmetric porous membrane include a membrane in which the pore size is minimized at a position in the thickness direction of the membrane (this is called "hourglass shape" as well).

In a case where the asymmetric porous membrane is used such that large pores are on the primary side, in other words, in a case where the primary side is used as the open side, a pre-filtration effect can be exerted.

In a case where the porous membrane is an asymmetric porous membrane, the nanofiber layer may be laminated on any of "tight side" or "open side" in the asymmetric porous membrane. Particularly, it is preferable that "open side" contacts the nanofiber layer.

The porous membrane layer may contain a thermoplastic polymer such as polyether sulfone (PESU), perfluoroalkoxyalkane (PFA, a copolymer of tetrafluoroethylene and perfluoroalkoxyalkane), polyamide, or a polyolefin, or may contain polytetrafluoroethylene and the like.

Particularly, as a material of the porous membrane, ultra-high-molecular-weight polyethylene is preferable. The ultra-high-molecular-weight polyethylene means thermoplastic polyethylene having a very long chain. The molecular weight thereof is equal to or greater than 1,000,000. Typically, the molecular weight thereof is preferably 2,000,000 to 6,000,000.

In a case where the first filter medium includes the nanoporous membrane layer, the nanoporous membrane layer may be a sintered nanoparticle membrane layer. The sintered nanoparticle membrane layer means a layer having a nanopore size that is obtained by sintering nanoparticles. Specifically, it is possible to use the layers described in JP2013-047389A and JP2016-141756A.

In the present specification, in a case where a filter has a filter medium including two or more layers having different pore structures, typically, the layers are combined as below, for example. The following combinations may be further combined with each other. In the following examples, what is listed before and after "/" represents the pore structure of each layer.

Nanoporous membrane layer/nanofiber layer

Asymmetric porous membrane layer/symmetric porous membrane layer

The pore size distribution varies among layers.

The positional distribution of pores in each layer varies among layers.

The shape of the pores varies among layers.

Particularly, in view of obtaining a filtering device having further improved effects of the present invention, it is preferable that the filter medium includes a nanoporous membrane layer and a nanofiber layer.

In a case where the first filter medium includes a nylon nanofiber layer, for example, layers are combined as below A non-sieving membrane layer is between a sieving membrane layer and a nylon nanofiber layer.

A sieving membrane layer is between a non-sieving membrane layer and a nylon nanofiber layer.

A nylon nanofiber layer is between a sieving membrane layer and a non-sieving membrane layer.

Each of the layers included in the first filter medium the first filter comprises may be formed of a material other than the materials described above. Examples of the material of each of the layers of the filter medium include an inorganic material and an organic material. Examples of the inorganic material include a metal, glass, diatomite, and the like. Examples of the organic material include a polymer. Examples of the polymer include nylon such as 6-nylon and 6,6-nylon; a polyolefin such as polyethylene and polypropylene; polystyrene; polyimide; polyamide imide; polysulfone; polyfluorocarbon such as polytetrafluoroethylene, perfluoroalkoxyalkane, a perfluoroethylene propene copolymer, an ethylene.tetrafluoroethylene copolymer, an ethylene-chlorotrifluoroethylene copolymer, polychlorotrifluoroethylene, polyvinylidene fluoride, and polyvinyl fluoride; polyvinyl alcohol; polyester; cellulose; cellulose acetate; and the like.

Among these, in view of obtaining a filtering device having further improved effects of the present invention, at least one kind of material is preferable which is selected from the group consisting of nylon, polyethylene, polypropylene, polufluorocarbon, cellulose, diatomite, polystyrene, glass, and polysulfone.

The filter medium may include a layer containing a base material having undergone a surface treatment. As the method for performing the surface treatment on the filter medium, known methods can be used without particular limitation. Examples of the surface treatment method include a chemical modification treatment, a plasma treatment, a hydrophobization treatment, coating, a gas treatment, sintering, and the like. Among these, a chemical modification treatment and a plasma treatment are preferable.

The plasma treatment is preferable because the surface of the filter medium is hydrophilized by this treatment. Although the water contact angle on the surface of the filter medium hydrophilized by the plasma treatment is not particularly limited, a static contact angle measured at 25° C. by using a contact angle meter is preferably equal to or smaller than 60°, more preferably equal to or smaller than 50°, and even more preferably equal to or smaller than 30°.

As the chemical modification treatment, a method of introducing ion exchange groups into the base material is preferable.

That is, the filter medium is preferably obtained by using various materials exemplified above as a base material and introducing ion exchange groups into the base material. Typically, it is preferable that the filter medium includes a layer, which contains a base material having ion exchange groups, on a surface of the base material described above. Although there is no particular limitation, as the surface-treated base material, a base material obtained by introducing ion exchange groups into the aforementioned polymer is preferable because the manufacturing of such a base material is easier.

Examples of the ion exchange groups include cation exchange groups such as a sulfonic acid group, a carboxy group, a phosphoric acid group, and the like and anion exchange groups such as secondary, tertiary, quaternary ammonium groups, and the like. The method for introducing ion exchange groups into the polymer is not particularly limited, and examples thereof include a method of reacting a compound, which has ion exchange groups and polymerizable groups, with the polymer such that the compound is grafted on the polymer typically.

For example, in a case where polyolefin (polyethylene, polypropylene, or the like) fiber is used as a base material, the fiber is irradiated with ionizing radiation (α-rays, β-rays, γ-rays, X-rays, electron beams, and the like) such that an active portion (radical) is generated in the polymer base material. After being irradiated, the base material is immersed in a solution containing a monomer such that the monomer is graft-polymerized with the base material. As a result, polyolefin fiber to which the monomer is bonded as a side chain by graft polymerization is generated. The generated polyolefin fiber having the monomer as a side chain is reacted by being brought into contact with the compound having anion exchange groups or cation exchange groups, and as a result, an end product is obtained in which ion exchange groups are introduced into the graft-polymerized side chain monomer. In this product, the ion exchange groups are introduced not into the polyolefin fiber as a main chain but into the side chain that is graft-polymerized with the main chain.

The filter medium may be constituted with woven cloth or nonwoven cloth, in which ion exchange groups are formed by a radiation graft polymerization method, combined with a conventional filter medium such as glass wool, woven cloth, or nonwoven cloth.

The first filter medium may include a layer having pore structures that are different from each other in the thickness direction. Examples of the pore structures that are different from each other in the thickness direction include a structure in which the surface pore size within the surface on the primary side of the first filter medium is different from the surface pore size within the surface on the secondary side of the filter medium.

The first filter has the first filter medium, and the first filter medium has the characteristics described above. Therefore, the first filter tend to be capable of more efficiently removing impurities in the substance to be purified. Particularly, in a case where the first filter medium includes two or more layers containing materials different from each other, such a tendency becomes marked.

<Second Filter>

In the filtering device according to the above embodiment, the housing of the primary filter unit 52 accommodates the second filter. The second filter medium 21 that the second filter of the filtering device according to the first embodiment of the present invention comprises contains polytetrafluoroethylene.

The pore size of the second filter medium is not particularly limited. However, in view of obtaining a filtering device having further improved effects of the present invention, the pore size is preferably equal to or smaller than 200 nm, more preferably equal to or smaller than 100 nm, even more preferably equal to or smaller than 50 nm, particularly preferably equal to or smaller than 10 nm, and most preferably equal to or smaller than 5 nm. The lower limit thereof is preferably equal to or greater than 1 nm, and more preferably equal to or greater than 2 nm.

The pore size of the second filter medium is not particularly limited. However, in view of obtaining a filtering device having further improved effects of the present invention, it is preferable that the pore size of the filter medium the second filter has is equal to or smaller than the pore size of the first filter medium. In a case where the pore size of the second filter medium is equal to or smaller than the pore size of the first filter medium, this means that provided that a plurality of housings the filtering device has accommodate two or more second filters, the pore size of the second filter medium the second filter has is equal to or smaller than the pore size of the first filter medium.

The pore size of the second filter medium the second filter has may be equal to or greater than the pore size of the first filter medium the first filter has.

The ratio of the pore size of the second filter medium to the pore size of the first filter medium (pore size of second filter medium/pore size of first filter medium) is not particularly limited, but is preferably 0.1 to 10, more preferably 0.1 to 1.0, even more preferably equal to or higher than 0.1 and less than 1, and particularly preferably 0.1 to 0.9.

As the material of the second filter medium, it is possible to use those described above as the material of the first filter medium without particular limitation. Particularly, in view of obtaining a filtering device having further improved effects of the present invention, it is preferable that the second filter medium contains at least one kind of material selected from the group consisting of nylon, polyethylene, polypropylene, polyfluorocarbon, cellulose, diatomite, polystyrene, glass, and polysulfone.

The second filter medium may be different from the first filter medium in terms of at least one kind of item selected from the group consisting of the material, the layer constitution, the pore structure, and the pore size.

In view of obtaining a filtering device having further improved effects of the present invention, it is preferable that the second filter medium contains the same material as any one of the two layers the first filter medium has.

Some aspects that have not been additionally described as suitable aspects of the second filter medium are the same as the aspects described above as the suitable aspects of the first filter medium.

The temperature at which the filtering device according to the above embodiment is operated is not particularly limited. Generally, it is preferable that the filtering device is operated at a temperature lower than room temperature. In this case, it is preferable that impurities derived from the filter medium are not eluted into the substance to be purified.

In order to prevent the impurities derived from the filter medium from being eluted into the substance to be purified, the value of a distance (Ra) between the substance to be purified and the material of the filter medium in the Hansen space and the radius of an interaction sphere of the material of the filter medium, that is, the value of an interaction radius (R0) may be adjusted.

That is, in view of obtaining a filtering device having further improved effects of the present invention, in a relationship among Hansen solubility parameters $\delta Dp$, $\delta Pp$, and $\delta Hp$ and an interaction radius R0 of at least one kind of filter medium selected from the group consisting of the filter medium the first filter has and the filter medium the second filter has and Hansen solubility parameters $\delta Ds$, $\delta Ps$, and $\delta Hs$ of a substance to be purified, provided that Ra is represented by an equation of $Ra^2 = 4(\delta Ds - \delta Dp)^2 + (\delta Ps - \delta Pp)^2 + (\delta Hs - \delta Hp)^2$, a ratio of Ra to R0 is preferably equal to or lower than 1.0.

The above relationship is more preferably satisfied in the relationship between at least the second filter medium (the filter medium the second filter has) and the substance to be purified, and particularly preferably satisfied in the relationship between each of the first filter medium and the second filter medium and the substance to be purified.

In a case where the first filter medium is a filter medium including two or more layers containing materials different from each other, "the first filter medium satisfies the above relationship" means that the above relationship is satisfied in at least one of the layers. It is more preferable that the above relationship is satisfied in all the layers.

The ratio (Ra/R0) of the value of the distance (Ra) between the substance to be purified and the material of the filter medium in the Hansen space to the value of the interaction radius (R0) of the material of the filter medium is not particularly limited. However, in view of making it more difficult for impurities to be eluted into the substance to be purified from the filter medium, the ratio is preferably equal to or lower than 1.0, more preferably equal to or lower than 0.98, even more preferably equal to or lower than 0.95, and particularly preferably equal to or lower than 0.93. The lower limit thereof is not particularly limited, but is preferably equal to or higher than 0.5, more preferably equal to or higher than 0.6, and even more preferably equal to or higher than 0.7.

In a case where Ra/R0 is within the above range, the material of the filter medium is hardly dissolved in the substance to be purified. That is, the impurities derived from the filter medium are hardly eluted into the substance to be purified.

In the present specification, as the Hansen solubility parameters and the like, it is possible to use those described in "Charles M. Hansen, "Hansen Solubility Parameters: A User's Handbook", CRC Press (2007)" and "The CRC Handbook and Solubility Parameters and Cohesion Parameters (1999)" edited by Allan F. M. Barton (1999).

The Hansen solubility parameters and the like can also be calculated using "Molecular Modeling Pro" software, version 5. 1. 9 (ChemSW, Fairfield Calif., www.chemsw.com) or Hansen Solubility from Dynacomp Software.

The value of R0 may be determined by experiments, or values of R0 described in documents and the like may be used.

Ra is calculated from three components of Hansen solubility parameters, that is, a dispersion force component ($\delta D$), a polarity or dipolar interaction component ($\delta P$), and a hydrogen bond component ($\delta H$). The unit of the Hansen solubility parameters is $(MPa)^{1/2}$.

The above three components can be regarded as coordinates in a three-dimensional space (Hansen space). In a case where the material of the filter medium and the substance to be purified are plotted on the Hansen space, the shorter the distance is between the material of the filter medium and the substance to be purified, the easier it is for them to mutually dissolve. That is, impurities derived from the filter medium are hardly eluted into the substance to be purified.

At this time, the distance Ra between the Hansen solubility parameters of the material of the filter medium and the Hansen solubility parameters of the substance to be purified is represented by the following equation.

$$Ra^2 = 4(\delta Ds - \delta Dp)^2 + (\delta Ps - \delta Pp)^2 + (\delta Hs - \delta Hp)^2 \quad \text{(Equation)}$$

In the above equation, each of δDp, δPp, and δHp represents each component of the Hansen solubility parameters of the material of the filter medium, and each of δDs, δPs, and δHs represents each component of the Hansen solubility parameters of the substance to be purified. Ra is compared with the radius (R0) of an interaction sphere based on the Hansen solubility parameters of the material of the filter medium.

The following table shows examples of the values of the components of Hansen solubility parameters of organic solvents as substances to be purified and Ra/R0 determined in a case where polyethylene is used as a filter medium.

TABLE 1

| | Dispersion (δD) | Polarity (δP) | Hydrogen bond (δH) | Ra/R0 (with ethylene) |
|---|---|---|---|---|
| PGMEA | 16 | 5.6 | 9.8 | 0.92 |
| 1-Butanol | 15.8 | 3.7 | 6.3 | 0.54 |
| Ethyl acetate | 15.8 | 5.3 | 7.2 | 0.51 |
| Isoamyl acetate | 15.3 | 3.1 | 7 | 0.52 |
| Diethyl carbonate | 16.6 | 3.1 | 6.1 | 0.55 |
| Methyl ethyl ketone | 16 | 9 | 5.1 | 0.5 |
| Acetone | 15.5 | 10.4 | 7 | 0.84 |
| Methyl isobutyl ketone | 15.3 | 6.1 | 4.1 | 0.23 |
| Cyclohexanone | 17.8 | 6.3 | 5.1 | 0.76 |
| Diethyl ketone | 15.8 | 7.6 | 4.7 | 0.43 |
| di-(isobutyl)ketone | 16 | 3.7 | 4.1 | 0.37 |
| Methylene chloride | 18.2 | 6.3 | 6.1 | 0.9 |
| 1,1-Dichloroethylene | 17 | 6.8 | 4.5 | 0.58 |
| Chloroform | 17.8 | 3.1 | 5.7 | 0.83 |
| Tetrahydrofuran | 16.8 | 5.6 | 8 | 0.8 |
| Hexane | 14.9 | 0 | 0 | 0.72 |
| Heptane | 15.3 | 0 | 0 | 0.72 |
| Octane | 15.5 | 0 | 0 | 0.72 |
| Toluene | 18 | 1.4 | 2 | 0.87 |

Second Embodiment

The filtering device according to a second embodiment of the present invention is a filtering device comprising the second filter unit on the primary side and the secondary side of the first filter unit.

Figure 6:
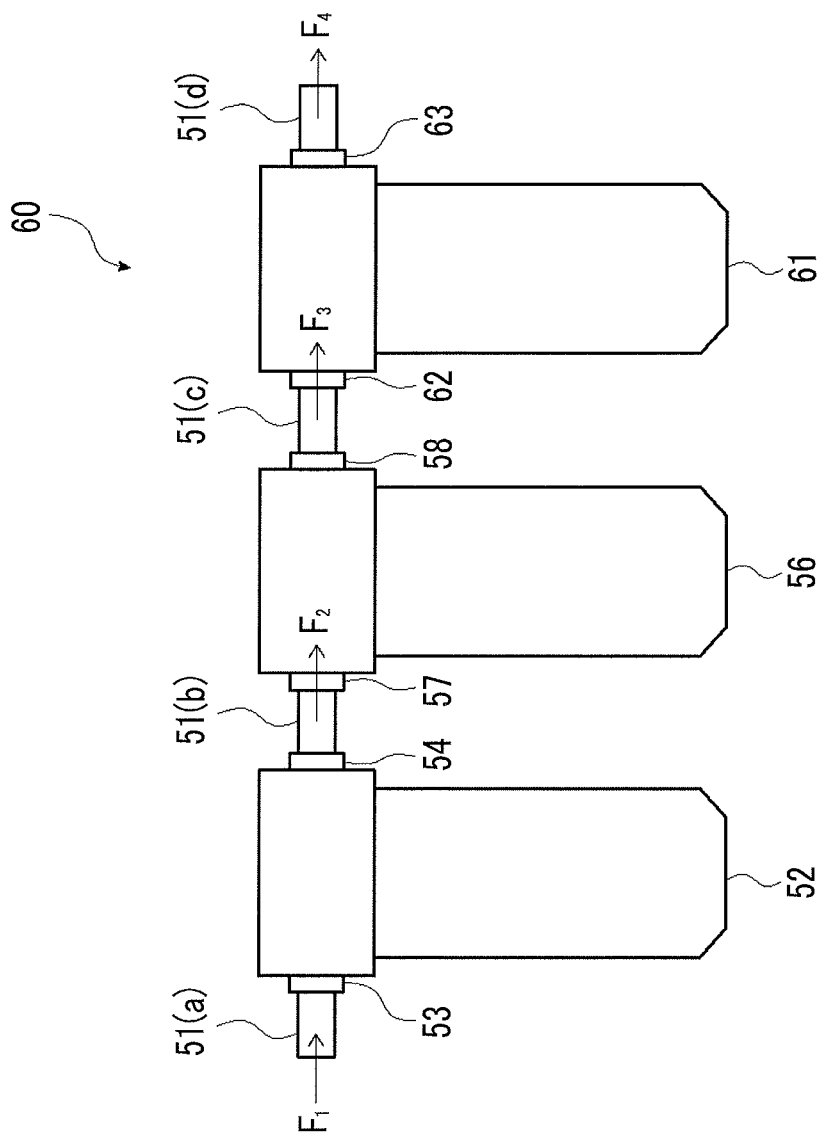
FIG. 6 is a schematic view of the filtering device according to a second embodiment of the present invention.

FIG. 6 is a schematic view of a filtering device 60 according to the second embodiment of the present invention. In pipe lines (including 51(a) to 51(d)), through which the substance to be purified is supplied, of the filtering device 60, the primary filter unit 52, the secondary filter unit 56, and the tertiary filter unit 61 are disposed in this order in a direction along which the substance to be purified is supplied.

The tertiary filter unit 61 is connected through the pipe lines 51(c) and 51(d), a liquid inlet 62, and a liquid outlet 63.

In the filtering device 60 according to the above embodiment, the housing of the primary filter unit 52 accommodated the second filter, the housing of the secondary filter unit 56 accommodates the first filter, and the housing of the tertiary filter unit 61 accommodates the second filter. That is, the second filter unit is disposed on the primary side of the first filter unit, and another second filter unit is disposed on the secondary side of the first filter unit.

The flow of the substance to be purified is indicated by $F_1$ to $F_4$. The substance to be purified, which is supplied from the pipe line 51(a) and flows into the primary filter unit 52 through the liquid inlet 53 along the $F_1$ direction, is purified by the second filter accommodated in the primary filter unit 52 and then taken out of the liquid outlet 54. Then, the substance to be purified flows in the pipe line 51(b) along the $F_2$ direction and flows into the secondary filter unit 56 through the liquid inlet 57. The substance to be purified is purified by the first filter accommodated in the secondary filter unit 56 and then taken out of the liquid outlet 58. Thereafter, the substance to be purified flows in the pipe line 51(c) along the $F_3$ direction and flows into the tertiary filter unit 61 through the liquid inlet 62. The substance to be purified is purified by the second filter accommodated in the tertiary filter unit 61, taken out of the liquid outlet 63, and flows in the pipe line 51(d) along the $F_4$ direction.

Hereinafter, the filter media that the filtering device according to the present embodiment comprises will be specifically described.

<First Filter Medium>

The material of the first filter medium is not particularly limited. However, in view of obtaining a filtering device having further improved effects of the present invention, it is preferable that the filter medium includes a layer containing a base material having undergone a surface treatment. The form of the base material having undergone a surface treatment is as described above.

The first filter medium satisfies a predetermined condition. For example, the first filter medium according to the present embodiment may be in the form of a filter medium including a layer containing a base material having undergone a surface treatment and a layer containing a base material having not undergone a surface treatment (this base material is preferably the same as the aforementioned base material).

<Second Filter Media>

As the material and the pore size of the two second filter media, those described in the first embodiment can be used without particular limitation. Particularly, in view of obtaining a filtering device having further improved effects of the present invention, it is preferable that the pore size of the second filter medium of the second filter accommodated in the housing of the tertiary filter unit 61 is equal to or smaller than the pore size of the first filter medium. Generally, the pore size of the second filter on the secondary side is preferably 1.0 to 50 nm, more preferably 1.0 to 10 nm, and even more preferably 1.0 to 2.0 nm.

Modification Example of Second Embodiment

A modification example of the filtering device according to the second embodiment described above is a filtering device in which the second filter unit is disposed on the primary side of the first filter unit, another second filter unit is additionally disposed on the secondary side of the first filter unit, the pore size of the filter medium of the second filter unit disposed on the secondary side is equal to or smaller than the pore size of the filter medium of the first filter unit, and the filter medium of the first filter includes a layer containing a base material having undergone a surface treatment.

The form of each of the portions of the filtering device according to the present embodiment is as described above.

Another Embodiment

The filtering device according to another embodiment of the present invention is a filtering device having a constitution in which the first filter can be backwashed by causing a washing solution to flow from the secondary side of the first filter unit to the primary side of the filter unit.

Examples of the constitution in which the first filter can be backwashed include a constitution comprising a washing solution supply device on the secondary side of the filter unit. Typically, the washing solution supply device comprises a washing solution storage tank connected to the secondary side of the filter unit through a pipe line and pumps and valves disposed in the pipe line. For backwashing, the washing solution is supplied into the pipe line from the washing solution storage tank and transported to the primary side from the secondary side of the filter unit under pressure or without pressure such that the first filter is washed in this process.

The washing solution that can be used in the above process is not particularly limited, and examples thereof include the chemical liquid which will be described later, a washing solution obtained by diluting the chemical liquid, solvents contained in the chemical liquid (an organic solvent and/or water), a mixture of the above solvents, and the like.

The filtering device according to the present embodiment has a constitution in which the first filter can be backwashed. However, the filtering device according to the embodiment of the present invention is not limited thereto and may have a constitution in which one second filter or a plurality of second filters can be backwashed.

[Purification Device]

Figure 7:
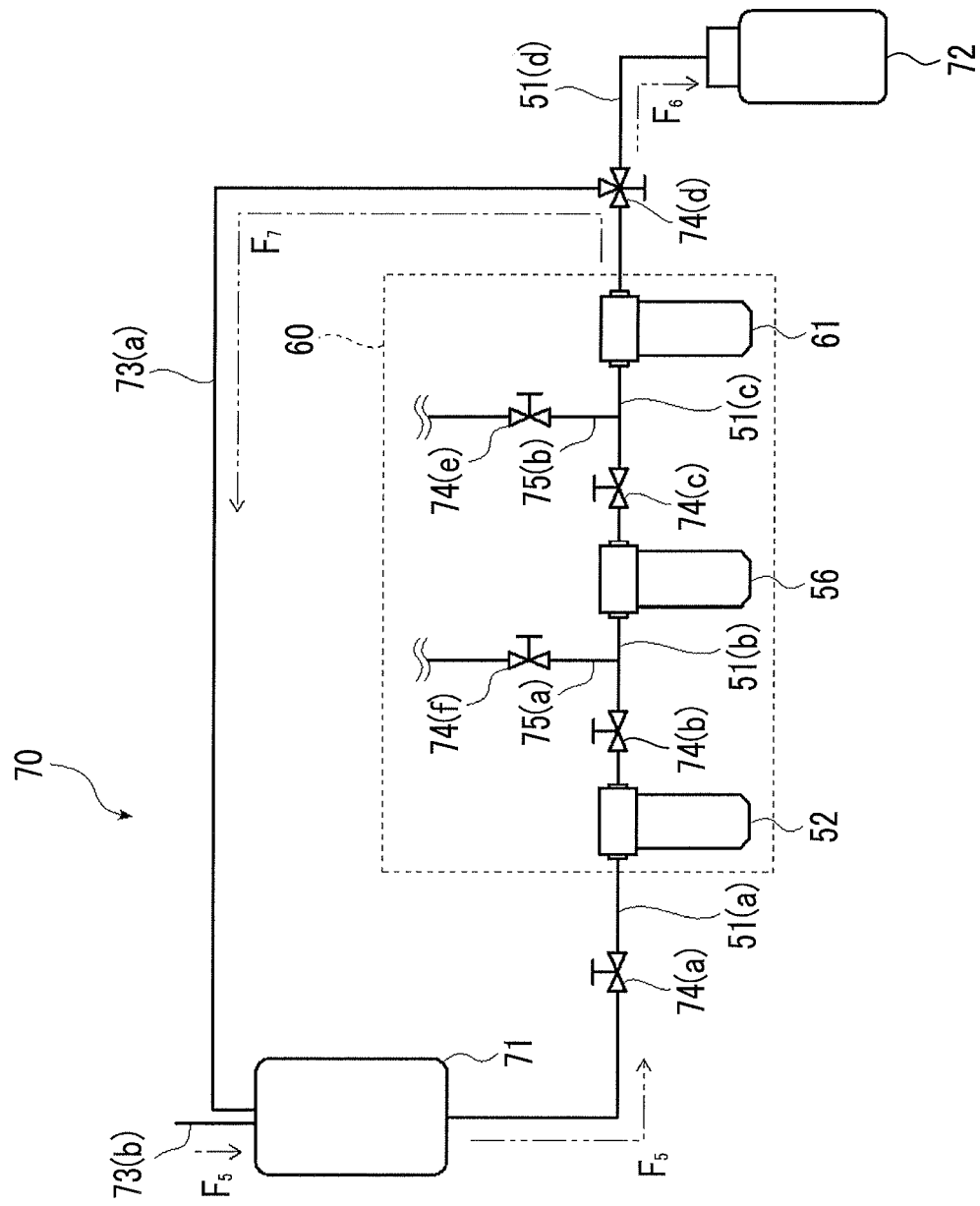
FIG. 7 is a schematic view of a chemical liquid purification device according to an embodiment of the present invention.

FIG. 7 is a schematic view of a chemical liquid purification device according to an embodiment of the present invention. A chemical liquid purification device 70 according to the embodiment of the present invention comprises the filtering device 60 described above in pipe lines.

The filtering device 60 is connected to a manufacturing tank 71 through the pipe line 51(a) and to a filling device 72 through the pipe line 51(d). The pipe line 51(d) is branched by a valve 74(d) and connected to the manufacturing tank 71 through a circulation pipe line 73(a).

The circulation pipe line 73(a) corresponds to a circulable path.

In the chemical liquid purification device 70, a substance to be purified is supplied to the manufacturing tank 71 through the pipe line 73(b) which will be described later and stored in the manufacturing tank 71. The stored substance to be purified flows into the filtering device 60 through the pipe line 51(a) and purified (along the $F_5$ direction in the drawing).

The substance to be purified (chemical liquid) purified by the filtering device 60 is transported to the filling device 72 through the pipe line 51(a) and fills up a container, thereby manufacturing a chemical liquid storage body which will be described later (along the $F_6$ direction in the drawing).

In a case where the substance to be purified that has been purified by the filtering device 60 is purified again by the filtering device, by causing the substance to be purified, which has been purified through the tertiary filter unit 61, to be branched from the pipe line 51(d) by the valve 74(d) and sending the substance to be purified back to the manufacturing tank 71 through the circulation pipe line 73(a), the procedure described above can be repeated (along the $F_7$ direction in the drawing).

In a case where a constitution is adopted in which the substance to be purified having been purified by the tertiary filter unit 61 can be transported to the manufacturing tank 71, the substance to be purified can be filtered while circulating in the filtering device. Therefore, a chemical liquid having further improved defect inhibition performance can be manufactured.

In the purification device shown in FIG. 7, the valve 74(d) is disposed in the pipe line 51(d). However, the purification device according to the embodiment of the present invention is not limited thereto. The valve 74(d) may be disposed in the pipe line 51(c), or the purification device does not have the valve 74(d). In the purification device without the valve 74(d), the substance to be purified having been purified is not transported to the manufacturing tank.

The aforementioned purification device has a constitution in which the first filter can be backwashed by causing a washing solution to flow from the secondary side to the primary side. In a case where the first filter is backwashed, a valve 74(e) and a valve 74(f) are opened such that the washing solution is supplied from a pipe line 75(b) (at this time, it is preferable that a valve 74(b) and the valve 74(d) are closed). The pipe line 75(b) is connected to a washing solution supply device not shown in the drawing. Then, the supplied washing solution flows to the secondary filter unit 56 from the secondary side, washes the first filter accommodated in the housing of the secondary filter unit 56, and is collected from a pipe line 75(a). The pipe line 75(a) is connected to the washing solution supply device not shown in the drawing.

In a case where the purification device has a constitution in which the first filter can be backwashed as described above, the pot life of the first filter can be further increased.

The filtering device according to the above embodiment has a constitution in which the first filter (secondary filter unit 56) can be backwashed. However, the purification device according to the embodiment of the present invention is not limited thereto, and may have a constitution in which the primary filter unit 52 and the tertiary filter unit 61 can also be backwashed.

Second Embodiment of Purification Device

Figure 8:
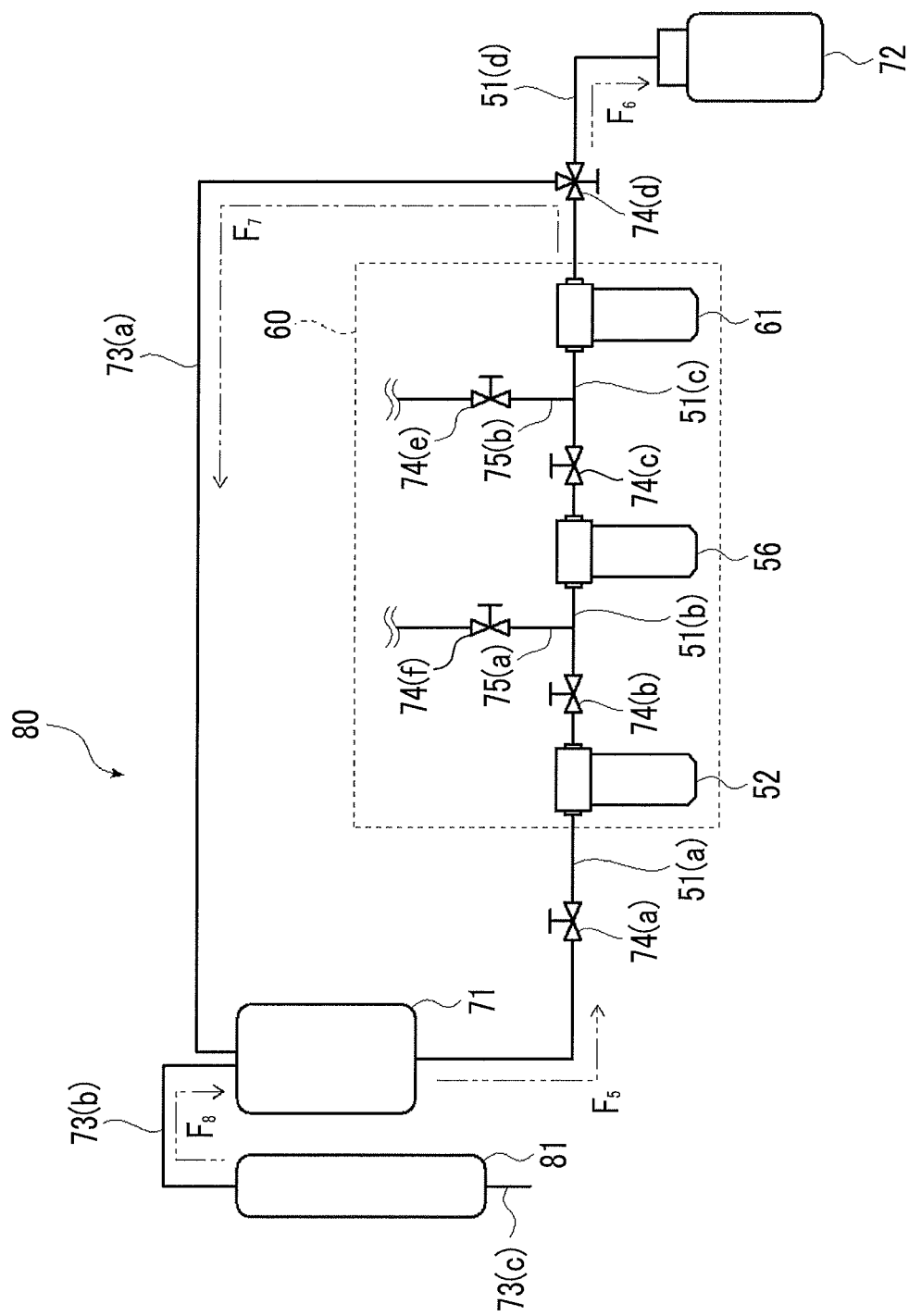
FIG. 8 is a schematic view of the chemical liquid purification device according to a second embodiment of the present invention.

The purification device according to a second embodiment of the present invention is a chemical liquid purification device further comprising a distillation device on the primary side of the filtering device. FIG. 8 is a schematic view of the chemical liquid purification device according to the above embodiment.

A chemical liquid purification device 80 according to the present embodiment has the same constitution as the purification device 70 described above in pipe lines.

In the purification device 80, the manufacturing tank 71 is connected to a distillation column 81 through a pipe line 83(b). A substance to be purified is supplied to the distillation column 81 through a pipe line 73(c). The substance to be purified that has been distilled in the distillation column 81 is introduced into the manufacturing tank 71 through the pipe line 73(b) (along the $F_8$ direction in the drawing). After the substance to be purified is introduced into the manufacturing tank 71, by the same method as that described above, the chemical liquid is purified.

In the purification device 80, the manufacturing tank is disposed in a pipe line. However, the chemical liquid purification device according to the present embodiment may not comprise the manufacturing tank. That is, the primary side of the filtering device 60 and the distillation column may be connected to each other through a pipe line.

[Manufacturing Device]

Figure 9:
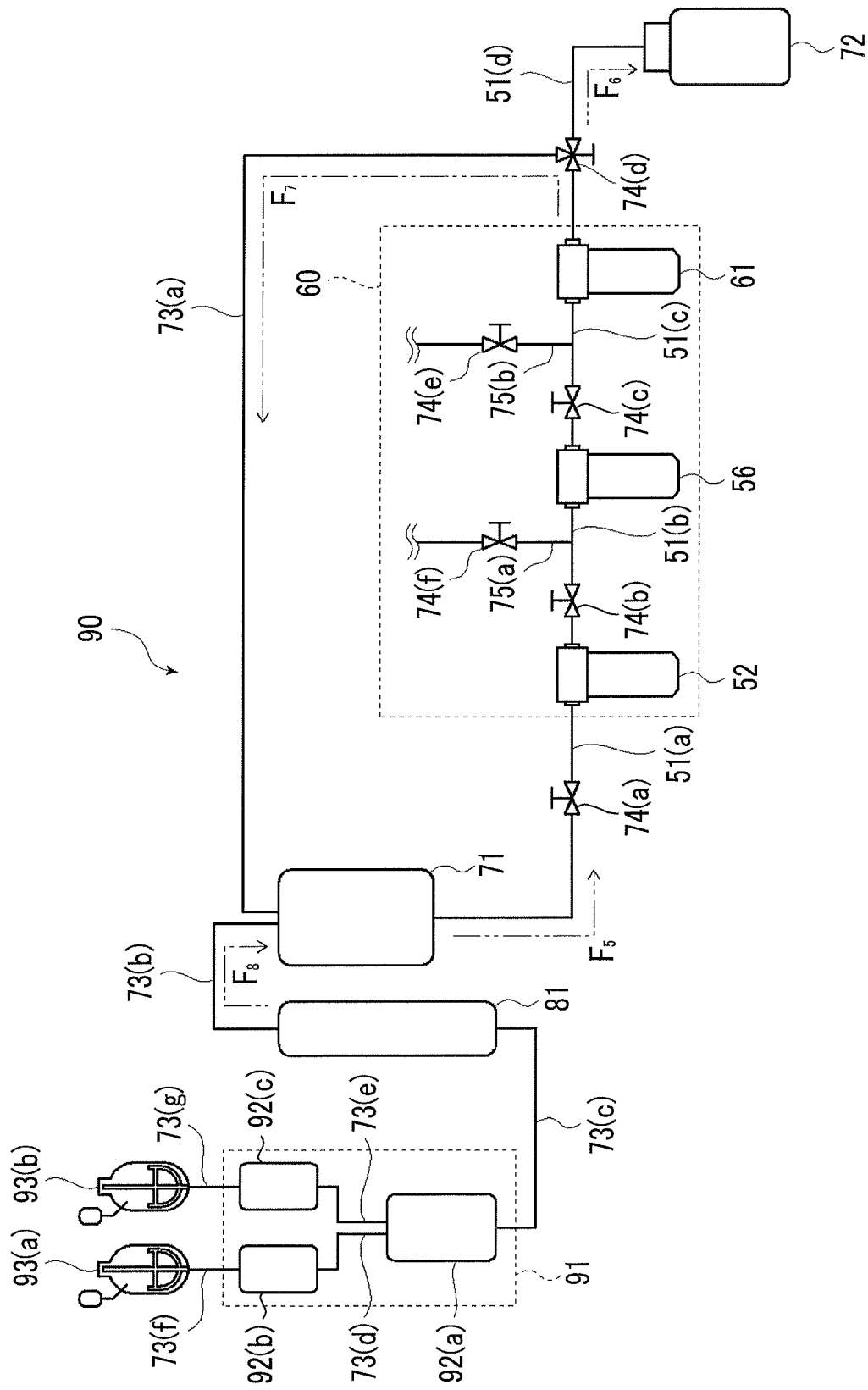
FIG. 9 is a schematic view of a manufacturing device according to an embodiment of the present invention.

FIG. 9 is a schematic view of the manufacturing device according to an embodiment of the present invention. A chemical liquid manufacturing device 90 according to the present embodiment has the same constitution as the aforementioned purification device 80 in a pipe line, and the distillation column 81 is connected to a mixing device 91 through the pipe line 73(*b*). The mixing device 91 is constituted with a plurality of storage tanks (92(*a*), 92(*b*), and 92(*c*)) and pipe lines 73(*d*) and 73(*c*) connecting the storage tanks to each other. The storage tanks 92(*b*) and 92(*c*) are connected to the storage tank 92(*a*) through the pipe lines 73(*d*) and 73(*e*) respectively.

Furthermore, the storage tank 92(*b*) and the storage tank 92(*c*) are connected to reactors 93(*a*) and 93(*b*) through pipe lines 73(*f*) and 73(*g*) respectively.

The method for manufacturing a chemical liquid by using the manufacturing device 90 will be described. First, raw materials are reacted in the reactors 93(*a*) and 93(*b*), thereby generating reactants.

The reactants are not particularly limited, and examples thereof include those described above as the components contained in the chemical liquid. For example, examples of the reactants include an organic solvent contained in the chemical liquid.

As the method for obtaining the reactants, known methods can be used without particular limitation. Examples thereof include a method of obtaining reactants by reacting one material or a plurality of materials in the presence of a catalyst.

More specifically, examples thereof include a step of obtaining butyl acetate by reacting acetic acid and n-butanol in the presence of sulfuric acid, a step of obtaining 1-hexanol by reacting ethylene, oxygen, and water in the presence of $Al(C_2H_5)_3$, a step of obtaining 4-methyl-2-pentanol by reacting cis-4-methyl-2-pentene in the presence of Diisopinocampheyl borane (Ipc2BH), a step of obtaining propylene glycol 1-monomethyl ether 2-acetate (PGMEA) by reacting propylene oxide, methanol, and acetic acid in the presence of sulfuric acid, a step of obtaining isopropyl alcohol (IPA) by reacting acetone and hydrogen in the presence of copper oxide-zinc oxide-aluminum oxide, a method of obtaining ethyl lactate by reacting lactic acid and ethanol, and the like.

Then, the obtained reactants are mixed together by a predetermined amount by the mixing device 91, thereby preparing a chemical liquid composed as desired. Specifically, the reactants generated by the reactors 93(*a*) and 93(*b*) pass through the pipe lines 73(*f*) and 73(*g*) by type and transported to the storage tanks 92(*b*) and 92(*c*). The transported reactants are transported to the storage tank 92(*a*) through the pipe lines 73(*d*) and 73(*e*) and mixed together by a predetermined amount, thereby preparing a substance to be purified.

Thereafter, the obtained substance to be purified is purified using the distillation column 81. That is, the substance to be purified is transported to the distillation column 81 through the pipe line 73(*c*) and distilled. The distilled substance to be purified is transported to the manufacturing tank 71 through the pipe line 73(*b*), and then the chemical liquid is purified using the purification device 70 by the same method as that described above.

The chemical liquid manufacturing device 90 according to the above embodiment comprises the mixing device 91 on the primary side of the filtering device 60. However, the chemical liquid manufacturing device according to the embodiment of the present invention is not limited thereto, and may comprise the mixing device 91 on the secondary side of the filtering device 60.

Although the filtering device, the purification device, and the manufacturing device described above comprise valves and pumps for transporting the substance to be purified in each of the pipe lines, the valves and the pumps are not shown in the drawing.

[Anticorrosive Material]

In the filtering device, the purification device, and the manufacturing device described above, the material of a liquid contact portion of each unit (the manufacturing tank, the pipe line, the filling device, or the like) is not particularly limited. In view of obtaining a chemical liquid having further improved defect inhibition performance, the liquid contact portion is preferably formed of at least one kind of material (anticorrosive material) selected from the group consisting of a fluororesin and an electropolished metallic material, the metallic material preferably contains at least one kind of metal selected from the group consisting of chromium and nickel, and the total content of chromium and nickel with respect to the total mass of the metallic material is preferably greater than 25% by mass. In a case where the liquid contact portion is formed of the material described above, for example, each of the members described above is formed of the material described above, or the liquid contact portion of each of the members described above is coated with the material described above such that a coating layer is formed.

<Electropolished Metallic Material (Metallic Material Having Undergone Electopolishing)>

The metallic material used for manufacturing the aforementioned electropolished metallic material is not particularly limited as long as the metallic material contains at least one kind of metal selected from the group consisting of chromium and nickel, and the total content of chromium and nickel with respect to the total mass of the metallic material is greater than 25% by mass. Examples thereof include stainless steel, a nickel-chromium alloy, and the like.

The total content of chromium and nickel in the metallic material with respect to the total mass of the metallic material is preferably equal to or greater than 25% by mass, and more preferably equal to or greater than 30% by mass.

The upper limit of the total content of chromium and nickel in the metallic material is not particularly limited, but is preferably equal to or smaller than 90% by mass in general.

As the stainless steel, known stainless steel can be used without particular limitation. Among these, an alloy with a nickel content equal to or higher than 8% by mass is preferable, and austenite-based stainless steel with a nickel content equal to or higher than 8% by mass is more preferable. Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), SUS316L (Ni content: 12% by mass, Cr content: 16% by mass), and the like.

The Ni content and the Cr content in the above parenthesis is a content ratio with respect to the total mass of the metallic material.

As the nickel-chromium alloy, known nickel-chromium alloys can be used without particular limitation. Among these, a nickel-chromium alloy is preferable in which the nickel content is 40% to 75% by mass and the chromium content is 1% to 30% by mass with respect to the total mass of the metallic material.

Examples of the nickel-chromium alloy include HASTELLOY (trade name, the same is true for the following description), MONEL (trade name, the same is true for the following description), INCONEL (trade name, the same is true for the following description), and the like. More specifically, examples thereof include HASTELLOY C-276 (Ni content: 63% by mass, Cr content: 16% by mass), HASTELLOY C (Ni content: 60% by mass, Cr content: 17% by mass), HASTELLOY C-22 (Ni content: 61% by mass, Cr content: 22% by mass), and the like.

Furthermore, if necessary, the nickel-chromium alloy may further contain boron, silicon, tungsten, molybdenum, copper, cobalt, and the like in addition to the aforementioned alloy.

As the method for electropolishing the metallic material, known methods can be used without particular limitation. For example, it is possible to use the methods described in paragraphs "0011" to "0014" in JP2015-227501A, paragraphs "0036" to "0042" in JP2008-264929A, and the like.

Presumably, in a case where the metallic material is electropolished, the chromium content in a passive layer on the surface thereof may become higher than the chromium content in the parent phase. Therefore, from each unit having the inner wall coated with the electropolished metallic material or the inner wall formed of the electropolished metallic material, metal components are hardly eluted into the substance to be purified.

The metallic material may have undergone buffing. As the buffing method, known methods can be used without particular limitation. The size of abrasive grains used for finishing the buffing is not particularly limited, but is preferably equal to or smaller than #400 because such grains make it easy to further reduce the surface asperity of the metallic material. The buffing is preferably performed before the electropolishing.

<Fluororesin>

As the fluororesin, known fluororesins can be used without particular limitation as long as they are resins (polymers) containing fluorine atoms. Examples of the fluororesin include polytetrafluoroethylene, polychlorotrifluoroethylene, polyvinylidene fluoride, a tetrafluoroethylene-hexafluoropropylene copolymer, a tetrafluoroethyl ene-perfluoroalkylvinylether copolymer, a tetrafluoroethylene-ethylene copolymer, a chlorotrifluoroethylene-ethylene copolymer, a cyclized perfluoro (butenyl vinyl ether) polymer (CYTOP (registered trademark)), and the like.

The method for manufacturing each of the above members is not particularly limited, and the members can be manufactured by known methods. For example, by using a method of bonding fluororesin lining to the liquid contact portion of each of the members containing a metal, a resin, or the like or a method of forming a coating film by coating the liquid contact portion of each of the members containing a metal, a resin, or the like with a composition containing a fluororesin, each of the members with inner wall coated with the aforementioned material (anticorrosive material) can be manufactured.

Furthermore, for example, by a method of electropolishing the liquid contact portion of each of the members containing a metallic material in which the total content of chromium and nickel with respect to the total mass of the metallic material is greater than 25% by mass, each of the members with inner wall formed of the material (anticorrosive material) can be manufactured.

<Chemical Liquid>

The chemical liquid that can be manufactured using the purification device described above is not particularly limited, and examples thereof include known chemical liquids. Among these, a chemical liquid for manufacturing semiconductors is preferable.

(First Aspect of Chemical Liquid)

The chemical liquid according to an embodiment of the present invention contains a solvent. The solvent is not particularly limited, and examples thereof include water or an organic solvent.

The content of the solvent in the chemical liquid is not particularly limited, but is preferably 97.0% to 99.999% by mass and more preferably 99.9% to 99.9% by mass with respect to the total mass of the chemical liquid in general. One kind of organic solvent may be used singly, or two or more kinds of solvents may be used in combination. In a case where two or more kinds of organic solvents are used in combination, the total content thereof is preferably within the above range.

In the present specification, a solvent means water and/or one liquid organic compound which is contained in the chemical liquid in an amount greater than 10,000 mass ppm with respect to the total mass of the chemical liquid. That is, in the present specification, water and/or a liquid organic compound contained in the chemical liquid in an amount greater than 10,000 mass ppm with respect to the total mass of the chemical liquid corresponds to a solvent.

In the present specification, "liquid" means that the compound stays in liquid form at 25° C. under atmospheric pressure.

The type of the organic solvent is not particularly limited, and known organic solvents can be used. Examples of the organic solvent include alkylene glycol monoalkyl ether carboxylate, alkylene glycol monoalkyl ether, a lactic acid alkyl ester, alkyl alkoxypropionate, cyclic lactone (preferably having 4 to 10 carbon atoms), a monoketone compound which may have a ring (preferably having 4 to 10 carbon atoms), alkylene carbonate (for example, diethyl carboate or the like), alkoxyalkyl acetate, alkyl pyruvate, and the like.

Furthermore, as the organic solvent, those described in JP2016-057614A, JP2014-219664A, JP2016-138219A, and JP2015-135379A may be used.

As the organic solvent, at least one kind of organic solvent is preferable which is selected from the group consisting of propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, isoamyl acetate, isopropanol, and 4-methyl-2-pentanol, dimethyl sulfoxide, N-methyl-2-pyrrolidone, diethylene glycol, ethylene glycol, dipropylene glycol, propylene glycol, ethylene carbonate, propylene carbonate, sulfolane, cycloheptanone, and 2-heptanone.

The chemical liquid may contain other components in addition to the organic solvent. Examples of those other components include metal impurities, organic impurities, fluoride ions, and the like.

The chemical liquid may contain metal impurities (metal particles and metal ions). The definition of the metal ions and the method for measuring the metal ions are as described above.

The content of metal particles in the chemical liquid is not particularly limited. Generally, the content of metal particles with respect to the total mass of the chemical liquid is preferably equal to or smaller than 100 mass ppt, more preferably equal to or smaller than 50 mass ppt, and even more preferably equal to or smaller than 30 mass ppt. The lower limit thereof is not particularly limited, but is preferably equal to or greater than 0.001 mass ppt in general. The chemical liquid may contain one kind of metal particles or two or more kinds of metal particles. In a case where the chemical liquid contains two or more kinds of metal particles, the total content thereof is preferably within the above range.

The content of metal ions in the chemical liquid is not particularly limited. Generally, the content of metal ions with respect to the total mass of the chemical liquid is preferably equal to or smaller than 100 mass ppt, more preferably equal to or smaller than 50 mass ppt, and even more preferably equal to or smaller than 30 mass ppt. The lower limit thereof is not particularly limited, but is preferably equal to or greater than 0.001 mass ppt in general. The chemical liquid may contain one kind of metal ions or two or more kinds of metal ions. In a case where the chemical liquid contains two or more kinds of metal ions, the total content thereof is preferably within the above range.

The chemical liquid may contain organic impurities. The definition of the organic impurities and the method for measuring the organic impurities are as described above.

The content of the organic impurities in the chemical liquid is not particularly limited. In view of obtaining a chemical liquid having further improved effects of the present invention, the content of the organic impurities with respect to the total mass of the chemical liquid is preferably equal to or smaller than 10 mass ppb, more preferably equal to or smaller than 5 mass ppb, and even more preferably equal to or smaller than 3 mass ppb. The lower limit thereof is not particularly limited. It is preferable that the chemical liquid does not contain organic impurities.

In a case where the chemical liquid contains organic impurities, the organic impurities function as ligands for a metal and form a complex with the metal. This type of complex is highly hydrophobic and easily remains on the surface of a semiconductor substrate treated with the chemical liquid. As a result, the complex easily forms a defect.

The chemical liquid may contain fluoride ions. The definition of the fluoride ions and the method for measuring the fluoride ions are as described above.

The content of fluoride ions in the chemical liquid is not particularly limited. In view of obtaining a chemical liquid having further improved effects of the present invention, the content of fluoride ions with respect to the total mass of the chemical liquid is preferably equal to or smaller than 1 mass ppm, more preferably equal to or smaller than 0.5 mass ppm, and even more preferably equal to or smaller than 0.3 mass ppm. The lower limit is not particularly limited. It is preferable that the chemical liquid does not contain fluoride ions.

Second Embodiment of Chemical Liquid

The chemical liquid according to a second embodiment of the present invention may be an actinic ray-sensitive or radiation-sensitive resin composition. The actinic ray-sensitive or radiation-sensitive resin composition is not particularly limited, but is preferably an actinic ray-sensitive or radiation-sensitive resin composition described below.

(Actinic Ray-Sensitive or Radiation-Sensitive Resin Composition)

(A) Resin

Typically, it is preferable that the actinic ray-sensitive or radiation-sensitive resin composition contains a resin whose polarity increases by the action of an acid such that the solubility of the resin in a developer containing an organic solvent decreases.

The resin (hereinafter, referred to as "resin (A)" as well) whose polarity increases by the action of an acid such that the solubility of the resin in a developer containing an organic solvent decreases is preferably a resin (hereinafter, referred to as "acid-decomposable resin" or "acid-decomposable resin (A)" as well) having a group (hereinafter, referred to as "acid-decomposable group" as well), which generates an alkali-soluble group by being decomposed by the action of an acid, on either or both of the main chain and side chain of the resin.

The resin (A) is more preferably a resin having a monocyclic or polycyclic alicyclic hydrocarbon structure (hereinafter, referred to as "alicyclic hydrocarbon-based acid-decomposable resin" as well). The resin having a monocyclic or polycyclic alicyclic hydrocarbon structure has high hydrophobicity. It is considered that in a case where a region, which is irradiated with light of low intensity, in an actinic ray-sensitive or radiation-sensitive film is developed using an organic developer, the developability of the resin may be improved.

The actinic ray-sensitive or radiation-sensitive resin composition containing the resin (A) can be suitably used in a case where the composition is irradiated with an ArF excimer laser light.

Examples of the alkali-soluble group contained in the resin (A) include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

As the alkali-soluble group, for example, a carboxylic acid group, a fluorinated alcohol group (preferably hexafluoroisopropanol), or a sulfonic acid group is preferable.

The group that can be decomposed by an acid (acid-decomposable group) is a group obtained by the substitution of hydrogen atoms in the alkali-soluble group with a group leaving by an acid.

Examples of the group leaving by an acid include —C($R_{36}$)($R_{37}$)($R_{38}$), —C($R_{36}$)($R_{37}$)(O$R_{39}$), C($R_{01}$)($R_{02}$)(O$R_{39}$), and the like.

In the formulae, $R_{36}$ to $R_{39}$ each independently represent an alkyl group, a cycloalkyl group, an aryl group, an aralkyl group, or an alkenyl group. $R_{36}$ and $R_{37}$ may form a ring by being bonded to each other.

$R_{01}$ and $R_{02}$ each independently represent a hydrogen atom, an alkyl group, a cycloalkyl group, an aryl group, or an alkenyl group.

As the acid-decomposable group, a cumyl ester group, an enol ester group, an acetal ester group, a tertiary alkyl ester group, and the like are preferable, and a tertiary alkyl ester group is more preferable.

As the resin (A), resins containing repeating units having partial structures represented by the following Formula (pI) to General Formula (pV) are preferable.

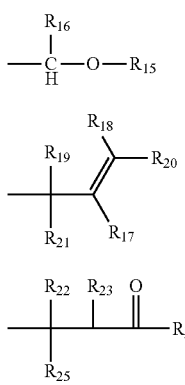

(pIII)

(pIV)

(pV)

In General Formulae (pI) to (pV), $R_{11}$ represents a methyl group, an ethyl group, a n-propyl group, an isopropyl group, a n-butyl group, an isobutyl group, or a sec-butyl group, and Z represents an atomic group necessary for forming a cycloalkyl group together with carbon atoms.

$R_{12}$ to $R_{16}$ each independently represent a linear or branched alkyl group or cycloalkyl group having 1 to 4 carbon atoms. Here, at least one of $R_{12}$, $R_{13}$, or $R_{14}$ or any of $R_{15}$ or $R_{16}$ represents a cycloalkyl group.

$R_{17}$ to $R_{21}$ each independently represent a hydrogen atom or a linear or branched alkyl group or cycloalkyl group having 1 to 4 carbon atoms. Here, at least one of $R_{17}$, $R_{18}$, $R_{19}$, $R_{20}$, or $R_{21}$ represents a cycloalkyl group. Furthermore, any of $R_{19}$ or $R_{21}$ represents a linear or branched alkyl group or cycloalkyl group having 1 to 4 carbon atoms.

$R_{22}$ to $R_{25}$ each independently represent a hydrogen atom or a linear or branched alkyl group or cycloalkyl group having 1 to 4 carbon atoms. Here, at least one of $R_{22}$, $R_{23}$, $R_{24}$, or $R_{25}$ represents a cycloalkyl group. Furthermore $R_{23}$ and $R_{24}$ may form a ring by being bonded to each other.

In Formulae (pI) to (pV), the alkyl group represented by $R_{12}$ to $R_{25}$ is a linear or branched alkyl group having 1 to 4 carbon atoms.

The cycloalkyl group represented by $R_{11}$ to $R_{25}$ or the cycloalkyl group formed of Z and carbon atoms may be monocyclic or polycyclic. Specifically, examples thereof include a group having monocyclo structure, a bicyclo structure, a tricyclo structure, or a tetracyclo structure containing 5 or more carbon atoms. The number of carbon atoms in the group is preferably 6 to 30, and more preferably 7 to 25. The cycloalkyl group may have a substituent.

As the cycloalkyl group, for example, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group are preferable. As the cycloalkyl group, for example, an adamantyl group, a norbornyl group, a cyclohexyl group, a cyclopentyl group, a tetracyclododecanyl group, or a tricyclodecanyl group is more preferable.

The alkyl group or the cycloalkyl group may further have a substituent such as an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms). The alkyl group, the alkoxy group, or the alkoxycarbonyl group may further have a substituent such as a hydroxyl group, a halogen atom, and an alkoxy group.

The structures represented by Formulae (pI) to (pV) in the aforementioned resin can be used for protecting the alkali-soluble group. Examples of the alkali-soluble group include various groups known in the field of the related art.

Specifically, examples of the structures include structures established by the substitution of hydrogen atoms of a carboxylic acid group, a sulfonic acid group, a phenol group, and a thiol group with the structures represented by General Formulae (pI) to (pV). As such structures, structures established by the substitution of hydrogen atoms of a carboxylic acid group or a sulfonic acid group with the structures represented by General Formulae (pI) to (pV) are preferable.

As the repeating unit contained in the alkali-soluble group protected by the structures represented by Formulae (pI) to (pV), a repeating unit represented by the following Formula (pA) is preferable.

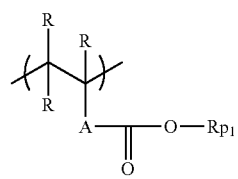

(pA)

R represents a hydrogen atom, a halogen atom, or a linear or branched alkyl group having 1 to 4 carbon atoms. A plurality of R's may be the same as or different from each other.

A represents a single group selected from the group consisting of a single bond, an alkylene group, an ether group, a thioether group, a carbonyl group, an ester group, an amide group, a sulfonamide group, a urethane group, and a urea group or represents a combination of two or more groups described above. A is preferably a single bond.

$Rp_1$ represents a group represented by any of Formulae (pI) to (pV).

As the repeating unit represented by Formula (pA), a repeating unit formed of 2-alkyl-2-adamantyl (meth)acrylate or dialkyl(1-adamantyl)methyl (meth)acrylate is preferable.

Specific examples of the repeating unit represented by Formula (pA) are as below, but the present invention is not limited thereto.

(Rx in the formulae represents $CH_3$ and $CH_2OH$ and Rxa and Rxb each represent an alkyl group having 1 to 4 carbon atoms.)

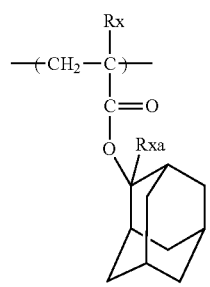

1

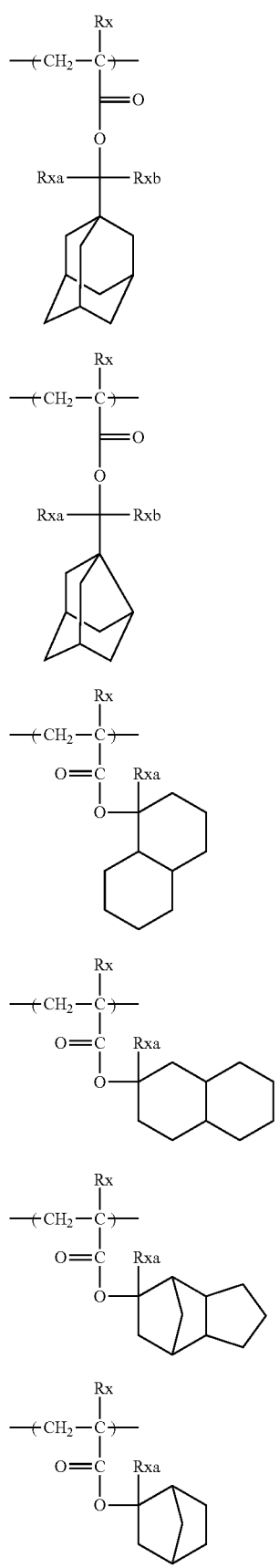
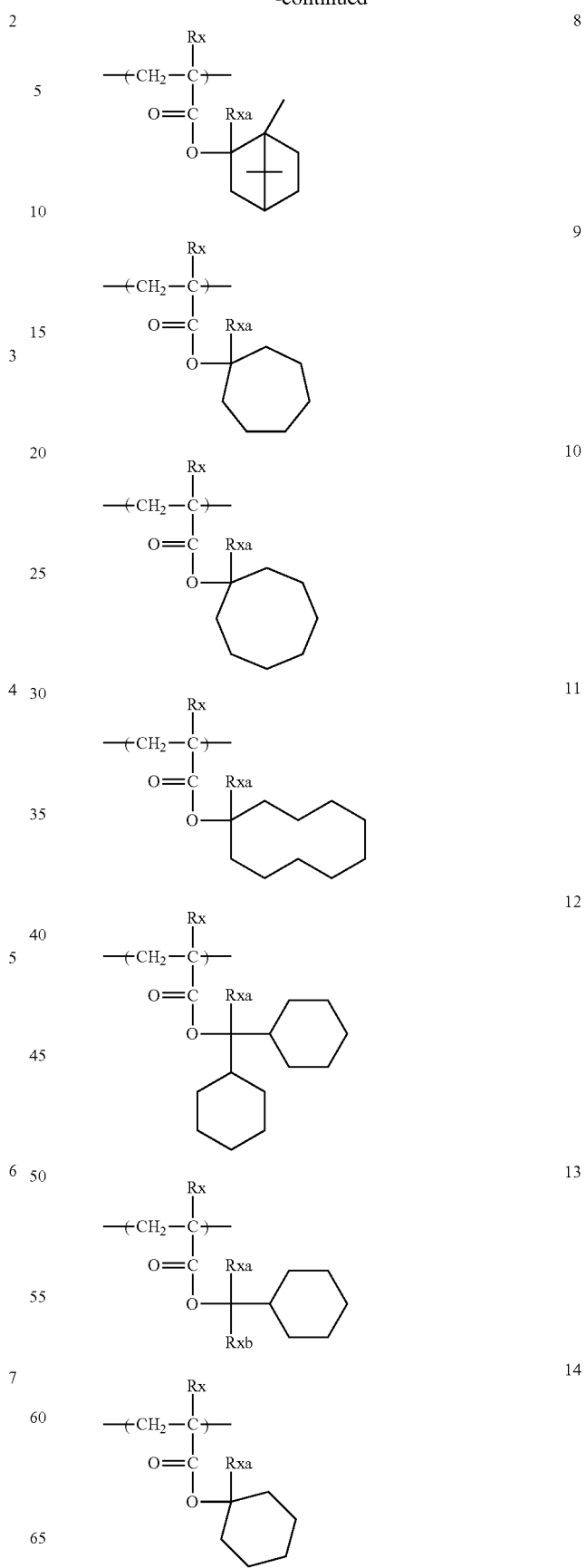

15

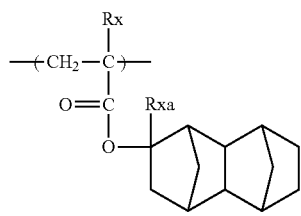

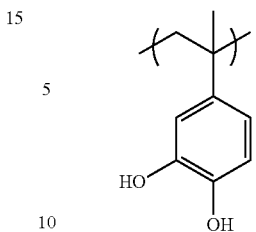

In an aspect, the repeating unit having an acid-decomposable group is an acid-decomposable repeating unit having an acid leaving group a having 4 to 7 carbon atoms. It is preferable that the repeating unit having an acid-decomposable group satisfies any of the following conditions (i-1) to (iv-1).

- (i-1): a resin in which the maximum number of carbon atoms in the acid leaving group a is 4 and a protection rate is equal to or lower than 70 mol %.
- (ii-1): a resin in which the maximum number of carbon atoms in the acid leaving group a is 5 and a protection rate is equal to or lower than 60 mol %.
- (iii-1): a resin in which the maximum number of carbon atoms in the acid leaving group a is 6 and a protection rate is equal to or lower than 47 mol %.
- (iv-1): a resin in which the maximum number of carbon atoms in the acid leaving group a is 7 and a protection rate is equal to or lower than 45 mol %.

The protection rate means a ratio of all the acid-decomposable repeating units contained in the resin to all the repeating units contained in the resin.

Furthermore, the number of carbon atoms in the acid leaving group a means the number of carbon atoms contained in the leaving group.

In a case where any of the above conditions is satisfied, it is possible to reduce the shrinkage amount of a resist film, increase Depth of Focus (DOF), and reduce line edge roughness (LER).

In a case where a resist film is irradiated with a KrF excimer laser light, electron beams, X-rays, or high energy rays (EUV or the like) having a wavelength equal to or shorter than 50 nm, the resin (A) preferably contains a repeating unit having an aromatic hydrocarbon group and more preferably contains a repeating unit having a phenolic hydroxyl group. As the repeating unit having a phenolic hydroxyl group, the following repeating units are particularly preferable.

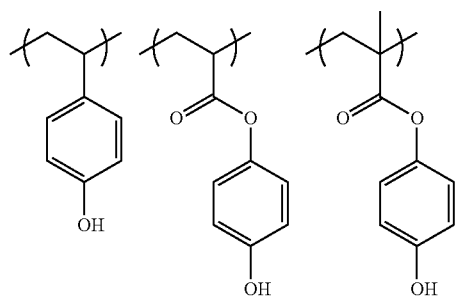

In the resin (A), one kind of repeating unit having an acid-decomposable group may be used singly, or two or more kinds of repeating units having an acid-decomposable group may be used in combination.

It is preferable that the resin (A) contains a repeating unit having a lactone structure or a sultone structure (a cyclic sulfonic acid ester).

Any of lactone groups or sultone groups can be used as long as they have a lactone structure or a sultone structure. Among these, a 5- to 7-membered lactone structure or sultone structure is preferable, and a structure in which another ring structure is fused with a 5- to 7-membered lactone structure or sultone structure by forming a bicyclo structure or a spiro structure is more preferable. It is more preferable that the resin (A) has a repeating unit having a lactone structure or a sultone structure represented by any of the following General Formulae (LC1-1) to (LC1-17) and General Formulae (SL1-1) and (SL1-2). Furthermore, the lactone structure or the sultone structure may be directly bonded to the main chain thereof. As the lactone structure or the sultone structure, the structures represented by General Formula (LC1-1), General Formula (LC1-4), General Formula (LC1-5), and General Formula (LC1-8) are preferable, and the structure represented by General Formula (LC1-4) is more preferable. In a case where a specific lactone structure or sultone structure is used, LWR and development defects are improved.

LC1-1

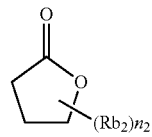

LC1-2

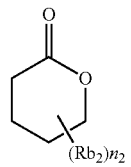

LC1-3

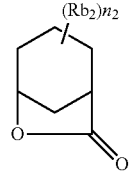

-continued
LC1-4
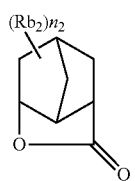
LC1-5
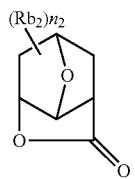
LC1-6
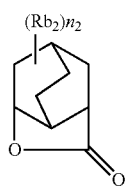
LC1-7
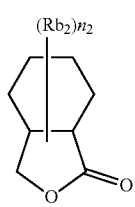
LC1-8
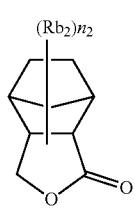
LC1-9
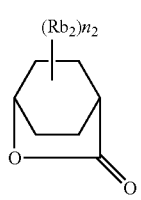
LC1-10
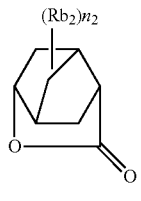
LC1-11
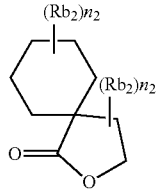
LC1-12
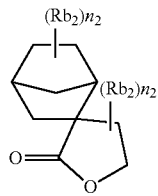
LC1-13
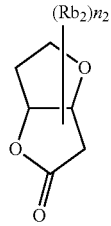
LC1-14
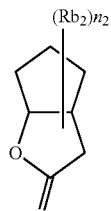
LC1-15
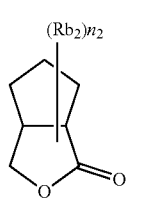
LC1-16
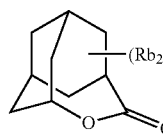
LC1-17
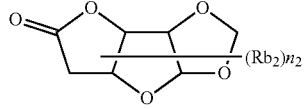
SL1-1
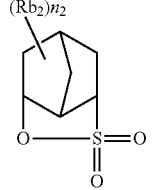
SL1-2
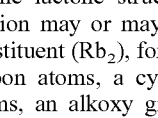
The lactone structure portion or the sultone structure portion may or may not have a substituent ($Rb_2$). As the substituent ($Rb_2$), for example, an alkyl group having 1 to 8 carbon atoms, a cycloalkyl group having 4 to 7 carbon atoms, an alkoxy group having 1 to 8 carbon atoms, an alkoxycarbonyl group having 2 to 8 carbon atoms, a carboxyl group, a halogen atom, a hydroxyl group, a cyano group, an acid-decomposable group, and the like are preferable. Among these, an alkyl group having 1 to 4 carbon atoms, a cyano group, or an acid-decomposable group is more preferable. $n_2$ represents an integer of 0 to 4. In a case where $n_2$ is equal to or greater than 2, a plurality of substituents ($Rb_2$) may be the same as or different from each other, or a plurality of substituents ($Rb_2$) may form a ring by being bonded to each other.

Generally, the repeating unit having a lactone group or a sultone group has optical isomers, and any of these optical isomers may be used. Furthermore, one kind of optical isomer may be used singly, or a plurality of optical isomers may be used by being mixed together. In a case where one kind of optical isomer is mainly used, the optical purity (ee) thereof is preferably equal to or higher than 90%, and more preferably equal to or higher than 95%.

In a case where the resin (A) contains a plurality of kinds of repeating units having a lactone structure or a sultone structure, the total content of the repeating units with respect to all the repeating units in the resin is preferably 15 to 60 mol %, more preferably 20 to 50 mol %, and even more preferably 30 to 50 mol %.

In order to improve the effects, two or more kinds of repeating units having a lactone or sultone structure can be used in combination.

In a case where the actinic ray-sensitive or radiation-sensitive resin composition is for ArF exposure, in view of the transparency with respect to ArF light, it is preferable that the resin (A) does not have an aromatic group.

It is preferable that all the repeating units in the resin (A) are constituted with a (meth)acrylate-based repeating unit. In this case, it is possible to use any of a resin in which all the repeating units are methacrylate-based repeating units, a resin in which all the repeating units are acrylate-based repeating units, and a resin in which all the repeating units are a mixture of methacrylate-based repeating unit/acrylate-based repeating unit. It is preferable that the ratio of the acrylate-based repeating unit to all the repeating units is equal to or lower than 50 mol %.

As the resin (A), for example, the resins described in paragraphs "0152" to "0158" in JP2008-309878A are preferable, but the present invention is not limited thereto.

The resin (A) can be synthesized by common methods (for example, radical polymerization). Examples of the general synthesis methods include a batch polymerization method in which polymerization is performed by dissolving monomer species and an initiator in a solvent and heating the solution, a dropping polymerization method in which a solution containing monomer species and an initiator is added dropwise to a heated solvent for 1 to 10 hours, and the like. Among these, a dropping polymerization method is preferable. Examples of the reaction solvent include ethers such as tetrahydrofuran, 1,4-dioxane, and diisopropyl ether; ketones such as methyl ethyl ketone and methyl isobutyl ketone; an ester solvent such as ethyl acetate; an amide solvent such as dimethylformamide and dimethylacetamide; a solvent dissolving the actinic ray-sensitive or radiation-sensitive resin composition such as propylene glycol monomethyl ether acetate, propylene glycol monomethyl ether, and cyclohexanone that will be described later; and the like. It is more preferable to polymerize the resin (A) by using the same solvent as the solvent used in the actinic ray-sensitive or radiation-sensitive resin composition. In a case where such a solvent is used, the occurrence of particles during storage can be further inhibited.

It is preferable to perform the polymerization reaction in an atmosphere of inert gas such as nitrogen and/or argon. The polymerization is initiated using a commercial radical initiator (an azo-based initiator, a peroxide, or the like) as a polymerization initiator. As the radical initiator, an azo-based initiator is preferable. As the azo-based initiator, an azo-based initiator having an ester group, a cyano group, or a carboxyl group is preferable. For example, as the initiator, azobisisobutyronitrile, azobisdimethylvaleronitrile, dimethyl 2,2'-azobis(2-methylpropionate), and the like are preferable. The initiator is added as desired or added in divided portions, the reaction product is added to a solvent after the reaction ends, and a desired polymer is collected by a method such as collecting powder or solids. The concentration of the reaction is 5% to 50% by mass, and preferably 10% to 30% by mass. The reaction temperature is generally 10° C. to 150° C., preferably 30° C. to 120° C., and even more preferably 60° C. to 100° C.

For purification, it is possible to use general methods such as a liquid-liquid extraction method in which residual monomers or oligomer components are removed by rinsing with water or by combining appropriate solvents; a purification method performed in a solution state such as ultrafiltration for extracting and removing only the components having a molecular weight equal to or smaller than a specific value; a reprecipitation method in which a resin solution is added dropwise to a poor solvent so as to coagulate the resin in the poor solvent and remove residual monomers and the like; and a purification method performed in a solid state in which resin slurry separated by filtration is washed with a poor solvent.

The weight-average molecular weight (Mw) of the resin (A) expressed in terms of polystyrene by gel permeation chromatography (GPC) is preferably 1,000 to 200,000, more preferably 1,000 to 20,000, and even more preferably 1,000 to 15,000. In a case where the weight-average molecular weight is 1,000 to 200,000, it is possible to prevent the deterioration of heat resistance or dry etching resistance, the deterioration of developability, or the deterioration of film forming properties resulting from high viscosity.

The dispersity (molecular weight distribution) in the resin (A) that is represented by the ratio (Mw/Mn) of the weight-average molecular weight (Mw) and the number-average molecular weight (Mn) is generally 1 to 5. The dispersity of the resin (A) used is generally within a range of 1 to 5, preferably within a range of 1 to 3, more preferably within a range of 1.2 to 3.0, and even more preferably within a range of 1.2 to 2.0. The lower the dispersity, the better the resolution and the pattern shape. Furthermore, the lateral wall of a pattern becomes smooth, and the roughness becomes excellent.

In the entirety of the actinic ray-sensitive or radiation-sensitive resin composition, the content rate of the resin (A) in the total solid contents of the actinic ray-sensitive or radiation-sensitive resin composition is preferably 50% to 99.9% by mass, and more preferably 60% to 99.0% by mass.

One kind of resin (A) may be used singly, or two or more kinds of resins (A) may be used in combination.

From the viewpoint of the compatibility between the resin (A) and a composition for forming a protective film, it is preferable that the resin (A) does not contain a fluorine atom and a silicon atom.

(B) Compound Generating Acid by being Irradiated with Actinic Rays or Radiation

Typically, the actinic ray-sensitive or radiation-sensitive resin composition contains a compound (referred to as "photoacid generator" as well) generating an acid by being irradiated with actinic rays or radiation.

As such a photoacid generator, it is possible to appropriately select and use known compounds, which generate an acid by being irradiated with actinic rays or radiation, or a mixture thereof used in a photoinitiator for photo-cationic polymerization, a photoinitiator for photo-radical polymerization, a colorant-type photodecolorizer, a photo-discoloring agent, a micro resist, and the like.

Examples of the photoacid generator include a diazonium salt, a phosphonium salt, a sulfonium salt, an iodonium salt, imide sulfonate, oxime sulfonate, diazo disulfone, disulfone, and o-nitrobenzyl sulfonate.

Furthermore, it is possible to use compounds obtained by introducing the groups or the compounds generating an acid by being irradiated with actinic rays or radiation into a main chain or a side chain of a polymer, such as the compounds described in U.S. Pat. No. 3,489,137A, GE3914407A, JP1988-026653A (JP-H63-026653A), JP1980-164824A (JP-H55-164824A), JP1987-069263A (JP-H62-069263A), JP1988-146038A (JP-S63-146038A), JP1988-163452A (JP-S63-163452A), JP1987-153853A (JP-S62-153853A), JP1988-146029A (JP-S63-146029A), and the like.

In addition, it is possible to use the compounds generating an acid by light described in U.S. Pat. No. 3,779,778A, EU126,712A, and the like.

The photoacid generator contained in the actinic ray-sensitive or radiation-sensitive resin composition is preferably a compound that generates an acid having a cyclic structure by being irradiated with actinic rays or radiation. As the cyclic structure, a monocyclic or polycyclic alicyclic group is preferable, and a polycyclic alicyclic group is more preferable. It is preferable that the carbon atoms constituting the ring structure of the alicyclic group do not include carbonyl carbon.

As the photoacid generator contained in the actinic ray-sensitive or radiation-sensitive resin composition, for example, a compound (specific acid generator) represented by the following Formula (3) is suitable which generates an acid by being irradiated with actinic rays or radiation.

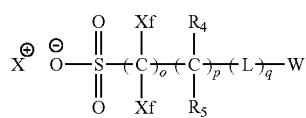 (3)

(Anion)

In Formula (3), Xf's each independently represent a fluorine atom or an alkyl group substituted with at least one fluorine atom.

$R_4$ and $R_5$ each independently represent a hydrogen atom, a fluorine atom, an alkyl group, or an alkyl group substituted with at least one fluorine atom. In a case where there is a plurality of $R_4$'s or $R_5$'s, $R_4$'s or $R_5$'s may be the same as or different from each other respectively.

L represents a divalent linking group. In a case where there is a plurality of L's, L's may be the same as or different from each other.

W represents an organic group having a cyclic structure.

o represents an integer of 1 to 3. p represents an integer of 0 to 10. q represents an integer of 0 to 10.

Xf represents a fluorine atom or an alkyl group substituted with at least one fluorine atom. The number of carbon atoms in the alkyl group is preferably 1 to 10, and more preferably 1 to 4. Furthermore, the alkyl group substituted with at least one fluorine atom is preferably a perfluoroalkyl group.

Xf is preferably a fluorine atom or a perfluoroalkyl group having 1 to 4 carbon atoms. Xf is more preferably a fluorine atom or $CF_3$. Particularly, it is preferable that both the Xf's represent a fluorine atom.

$R_4$ and $R_5$ each independently represent a hydrogen atom, a fluorine atom, or an alkyl group substituted with at least one fluorine atom. In a case where there is a plurality of $R_4$'s or $R_5$'s, $R_4$'s or $R_5$'s may be the same as or different from each other respectively.

The alkyl group represented by $R_4$ and $R_5$ may have a substituent and preferably has 1 to 4 carbon atoms. As $R_4$ and $R_5$, a hydrogen atom is preferable.

Specific examples and suitable aspects of the alkyl group substituted with at least one fluorine atom are the same as specific examples and suitable aspects of Xf in General Formula (3).

L represents a divalent linking group. In a case where there is a plurality of L's, L's may be the same as or different from each other.

Examples of the divalent linking group include —COO— (—C(=O)—O—), —OCO—, —CONH—, —NHCO—, —CO—, —O—, —S—, —SO—, —SO$_2$—, an alkylene group (preferably having 1 to 6 carbon atoms), a cycloalkylene group (preferably having 3 to 10 carbon atoms), an alkenylene group (preferably having 2 to 6 carbon atoms), a divalent linking group obtained by combining a plurality of groups described above, and the like. Among these, —COO—, —OCO—, —CONH—, —NHCO—, —CO—, —O—, —SO$_2$—, —COO-alkylene group-, —OCO-alkylene group-, —CONH-alkylene group-, or —NHCO-alkylene group-is preferable, and —COO—, —OCO—, —CONH, —SO$_2$—, —COO-alkylene group-, or —OCO-alkylene group-is more preferable.

W represents an organic group having a cyclic structure. W is particularly preferably a cyclic organic group.

Examples of the cyclic organic group include an alicyclic group, an aryl group, and a heterocyclic group.

The alicyclic group may be monocyclic or polycyclic. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, from the viewpoint of suppressing diffusivity in a film during a post exposure bake (PEB) step and improving Mask Error Enhancement Factor (MEEF), alicyclic groups having a bulky structure containing 7 or more carbon atoms, such as a norbornyl group, a tricyclodecanyl group, a tetracyclodecanyl group, a tetracyclododecanyl group, an diamantyl group, and an adamantyl group, are preferable.

The aryl group may be monocyclic or polycyclic. Examples of the aryl group include a phenyl group, a naphthyl group, a phenanthryl group, an anthryl group, and the like. Among these, a naphthyl group having a relatively low absorbance at 193 nm is preferable.

The heterocyclic group may be monocyclic or polycyclic. The polycyclic heterocyclic group can further inhibit the diffusion of an acid. Furthermore, the heterocyclic group may or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring that does not have aromaticity include a tetrahydropyran ring, a lactone ring, a sultone ring, and a decahydroisoquinoline ring. As the heterocyclic ring in the heterocyclic group, a furan ring, a thiophene ring, a pyridine ring, or a decahydroisoquinoline ring is particularly preferable. Examples of the lactone ring and the sultone ring include the lactone structure and the sultone structure exemplified regarding the resin described above.

The cyclic organic group may have a substituent. Examples of the substituent include an alkyl group (the alkyl group may be linear or branched and preferably has 1 to 12 carbon atoms), a cycloalkyl group (the cycloalkyl group may be monocyclic, polycyclic, or spirocyclic and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. The carbon (carbon contributing to the formation of a ring) constituting the cyclic organic group may be carbonyl carbon.

o represents an integer of 1 to 3. p represents an integer of 0 to 10. q represents an integer of 0 to 10.

In an aspect, o in Formula (3) is preferably an integer of 1 to 3, p in Formula (3) is an integer of 1 to 10, and q in Formula (3) is preferably 0. Xf is preferably a fluorine atom. $R_4$ and $R_5$ preferably both represent a hydrogen atom. W is preferably a polycyclic hydrocarbon group. o is more preferably 1 or 2, and even more preferably 1. p is more preferably a an integer of 1 to 3, even more preferably 1 or 2, and particularly preferably 1. W is more preferably a polycyclic cycloalkyl group, and even more preferably an adamantyl group or a diamantyl group.

In the anion represented by General Formula (3), as the combination of the partial structures other than W, for example, $SO_3^-$—$CF_2$—$CH_2$—OCO—, $SO_3^-$—$CF_2$—CHF—$CH_2$—OCO—, $SO_3^-$—$CF_2$—COO—, $SO_3^-$—$CF_2$—$CF_2$—$CH_2$—, and $SO_3^-$—$CF_2$—$CH(CF_3)$—OCO— are preferable.

(Cation)

In General Formula (3), $X^+$ represents a cation.

$X^+$ is not particularly limited as long as it is a cation. For example, a cation (portion other than $Z^-$) in Formula (ZI) or (ZII), which will be described later, is preferable as a suitable aspect thereof (Suitable Aspect)

For example, a compound represented by the following General Formula (ZI) or (ZII) is a suitable aspect of the specific acid generator.

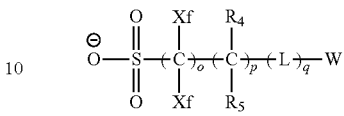

In General Formula (ZI), $R_{201}$, $R_{202}$, and $R_{203}$ each independently represent an organic group.

The number of carbon atoms in the organic group represented by $R_{201}$, $R_{202}$, and $R_{203}$ is generally 1 to 30, and preferably 1 to 20.

At least two groups among $R_{201}$ to $R_{203}$ may form a ring structure by being bonded to each other, and the ring may contain an oxygen atom, a sulfur atom, an ester bond, an amide bond, or a carbonyl group. Examples of the group formed by the bonding of two groups among $R_{201}$ to $R_{203}$ include an alkylene group (for example, a butylene group or a pentylene group).

$Z^-$ represents the anion in Formula (3). Specifically, $Z^-$ represents the following anion.

Examples of the organic group represented by $R_{201}$, $R_{202}$, and $R_{203}$ include the corresponding groups in the compounds (ZI-1), (ZI-2), (ZI-3), and (ZI-4) which will be described later.

The acid generator may be a compound having a plurality of structures represented by Formula (ZI). For example, the acid generator may be a compound having a structure in which at least one of $R_{201}$, $R_{202}$, or $R_{203}$ in the compound represented by Formula (ZI) is bonded to at least one of $R_{201}$, $R_{202}$, or $R_{203}$ in another compound represented by Formula (ZI) through a single bond or a linking group.

As the (ZI) component, for example, the compound (ZI-1), the compound (ZI-2), the compound (ZI-3), and the compound (ZI-4) that will be described below are more preferable.

First, the compound (ZI-1) will be described.

The compound (ZI-1) is an aryl sulfonium compound in which at least one of $R_{201}$, $R_{202}$, or $R_{203}$ in General Formula (ZI) is an aryl group. That is, the compound (ZI-1) is a compound having aryl sulfonium as a cation.

In the aryl sulfonium compound, all the $R_{201}$ to $R_{203}$ may be an aryl group. Alternatively, some of $R_{201}$ to $R_{203}$ are an aryl group, and others may be an alkyl group or a cycloalkyl group.

Examples of the aryl sulfonium compound include a triaryl sulfonium compound, a diaryl alkyl sulfonium compound, an aryl dialkyl sulfonium compound, a diaryl cycloalkyl sulfonium compound, and an aryl dicycloalkyl sulfonium compound.

As the aryl group in the aryl sulfonium compound, a phenyl group or a naphthyl group is preferable, and a phenyl group is more preferable. The aryl group may be an aryl group having a heterocyclic structure containing an oxygen atom, a nitrogen atom, a sulfur atom, and the like. Examples of the heterocyclic structure include a pyrrole residue, a furan residue, a thiophene residue, an indole residue, a benzofuran residue, a benzothiophene residue, and the like. In a case where the aryl sulfonium compound has two or more aryl groups, two or more of the aryl groups may be the same as or different from each other.

As the alkyl group or the cycloalkyl group that the aryl sulfonium compound has if necessary, a linear or branched alkyl group having 1 to 15 carbon atoms or a cycloalkyl group having 3 to 15 carbon atoms are preferable. Examples thereof include a methyl group, an ethyl group, a propyl group, a n-butyl group, a sec-butyl group, a t-butyl group, a cyclopropyl group, a cyclobutyl group, a cyclohexyl group, and the like.

The aryl group, the alkyl group, and the cycloalkyl group represented by $R_{201}$ to $R_{203}$ may have a substituent such as an alkyl group (having 1 to 15 carbon atoms for example), a cycloalkyl group (having 3 to 15 carbon atoms for example), an aryl group (having 6 to 14 carbon atoms for example), an alkoxy group (having 1 to 15 carbon atoms for example), a halogen atom, a hydroxyl group, or a phenylthio group.

Next, the compound (ZI-2) will be described.

The compound (ZI-2) is a compound in which $R_{201}$ to $R_{203}$ in Formula (ZI) each independently represent an organic group that does not have an aromatic ring. The aromatic ring mentioned herein includes the aromatic ring containing a heteroatom.

The number of carbon atoms in the organic group represented by $R_{201}$ to $R_{203}$ that does not have an aromatic ring is generally 1 to 30, and preferably 1 to 20.

$R_{201}$ to $R_{203}$ preferably each independently represent an alkyl group, a cycloalkyl group, an allyl group, or a vinyl group, more preferably each independently represent a linear or branched 2-oxoalkyl group, a 2-oxocycloalkyl group, or an alkoxycarbonylmethyl group, and even more preferably each independently represent a linear or branched 2-oxoalkyl group.

As the alkyl group and the cycloalkyl group represented by $R_{201}$ to $R_{203}$, for example, a linear or branched alkyl group having 1 to 10 carbon atoms (for example, a methyl group, an ethyl group, a propyl group, a butyl group, and a pentyl group) and a cycloalkyl group having 3 to 10 carbon atoms (a cyclopentyl group, a cyclohexyl group, and a norbornyl group) are preferable.

$R_{201}$ to $R_{203}$ may be further substituted with a halogen atom, an alkoxy group (having 1 to 5 carbon atoms for example), a hydroxyl group, a cyano group, or a nitro group.

Next, the compound (ZI-3) will be described.

The compound (ZI-3) is a compound represented by the following Formula (ZI-3) that has a phenacyl sulfonium salt structure.

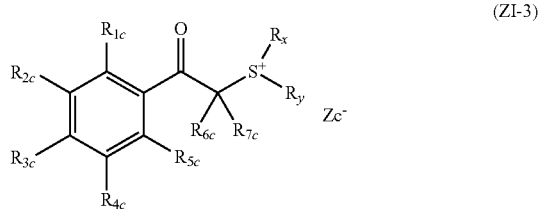

(ZI-3)

In Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonyl alkyl group, an allyl group, or a vinyl group.

Any two or more groups among $R_{1c}$ to $R_{5c}$, $R_{5c}$ and $R_{6c}$, $R_{6c}$ and $R_{7c}$, $R_{5x}$ and $R_x$, and $R_x$ and $R_y$ may form a ring structure by being bonded to each other respectively. The ring structure may contain an oxygen atom, a sulfur atom, a ketone group, an ester bond, or an amide bond.

Examples of the ring structure include an aromatic or non-aromatic hydrocarbon ring, an aromatic or non-aromatic heterocyclic ring, and a polycyclic fused ring obtained by combining two or more rings described above. The ring structure may be 3- to 10-membered ring for example. The ring structure is preferably 4- to 8-membered ring, and more preferably 5- or 6-membered ring.

Examples of the group formed by the bonding of any two or more groups among $R_{1c}$ to $R_{5c}$, the bonding of $R_{6c}$ and $R_{7c}$, and the bonding of $R_x$ and $R_y$ include a butylene group, a pentylene group, and the like.

As the group formed by the bonding of $R_{5c}$ and $R_{6c}$ and the bonding of $R_{5c}$ and $R_x$, a single bond or an alkylene group is preferable. Examples of the alkylene group include a methylene group, an ethylene group, and the like.

Zc⁻ represents an anion in Formula (3), and specific aspects thereof are as described above.

Specific examples of the alkoxy group in the alkoxycarbonyl group represented by $R_{1c}$ to $R_{5c}$ are the same as specific examples of the alkoxy group as $R_{1c}$ to $R_{5c}$ described above.

Specific examples of the alkyl group in the alkylcarbonyloxy group and the alkylthio group as $R_{1c}$ to $R_{5c}$ are the same as specific examples of the alkyl group as $R_{1c}$ to $R_{5c}$ described above.

Specific examples of the cycloalkyl group in the cycloalkylcarbonyloxy group as $R_{1c}$ to $R_{5c}$ are the same as specific examples of the cycloalkyl group as $R_{1c}$ to $R_{5c}$ described above.

Specific examples of the aryl group in the aryloxy group and the arylthio group as $R_{1c}$ to $R_{5c}$ are the same as specific examples of the aryl group as $R_{1c}$ to $R_{5c}$ described above.

Examples of the cation in the compound (ZI-2) or the compound (ZI-3) in the present invention include the cations described in paragraph [0036] and the following paragraphs in US2012/0076996.

Next, the compound (ZI-4) will be described.

The compound (ZI-4) is represented by Formula (ZI-4).

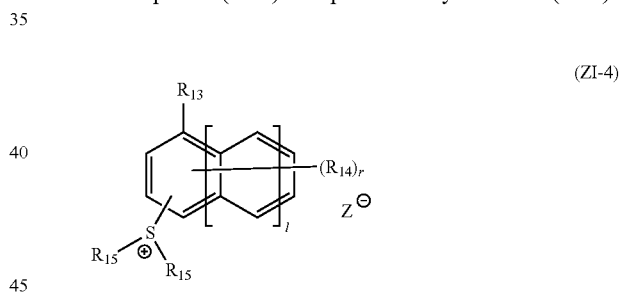

(ZI-4)

In Formula (ZI-4), $R_{13}$ represents a hydrogen atom, a fluorine atom, a hydroxyl group, an alkyl group, a cycloalkyl group, an alkoxy group, an alkoxycarbonyl group, or a cycloalkyl group. These groups may have a substituent.

In a case where there is a plurality of $R_{14}$'s, $R_{14}$'s each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

$R_{15}$'s each independently represent an alkyl group, a cycloalkyl group, or a naphthyl group. These groups may have a substituent. Two $R_{15}$'s may form a ring by being bonded to each other. In a case where two $R_{15}$'s form a ring by being bonded to each other, the ring skeleton may contain a heteroatom such as an oxygen atom or a nitrogen atom. In an aspect, it is preferable that two $R_{15}$'s represent an alkylene group and form a ring structure by being bonded to each other.

l represents an integer of 0 to 2.

r represents an integer of 0 to 8.

$Z^-$ represents the anion in Formula (3), and specific aspects thereof are as described above.

In Formula (ZI-4), the alkyl group represented by $R_{13}$, $R_{14}$, and $R_{15}$ is linear or branched. The alkyl group preferably has 1 to 10 carbon atoms. As the alkyl group, a methyl group, an ethyl group, a n-butyl group, a t-butyl group, and the like are preferable.

Examples of the cation of the compound represented by Formula (ZI-4) in the present invention include the cations described in paragraphs "0121", "0123", and "0124" in JP2010-256842A, paragraphs "0127", "0129", and "0130" in JP2011-076056A, and the like.

Next, the Formula (ZII) will be described.

In Formula (ZII), $R_{204}$ and $R_{205}$ each independently represent an aryl group, an alkyl group, or a cycloalkyl group.

As the aryl group represented by $R_{204}$ and $R_{205}$, a phenyl group or a naphthyl group is preferable, and a phenyl group is more preferable. The aryl group represented by $R_{204}$ and $R_{205}$ may be an aryl group having a heterocyclic structure having an oxygen atom, a nitrogen atom, a sulfur atom, and the like. Examples of the skeleton of the aryl group having a heterocyclic structure include pyrrole, furan, thiophene, indole, benzofuran, benzothiophene, and the like.

As the alkyl group and the cycloalkyl group represented by $R_{204}$ and $R_{205}$, for example, a linear or branched alkyl group having 1 to 10 carbon atoms (for example, a methyl group, an ethyl group, a propyl group, a butyl group, or a pentyl group) and a cycloalkyl group having 3 to 10 carbon atoms (a cyclopentyl group, a cyclohexyl group, or a norbornyl group) are preferable.

The aryl group, the alkyl group, and the cycloalkyl group represented by $R_{204}$ and $R_{205}$ may have a substituent. Examples of the substituent that the aryl group, the alkyl group, and the cycloalkyl group represented by $R_{204}$ and $R_{205}$ may have include an alkyl group (having 1 to 15 carbon atoms for example), a cycloalkyl group (having 3 to 15 carbon atoms for example), an aryl group (having 6 to 15 carbon atoms for example), an alkoxy group (having 1 to 15 carbon atoms for example), a halogen atom, a hydroxyl group, a phenylthio group, and the like.

$Z^-$ represents an anion in Formula (3), and specific aspects thereof are as described above.

In an aspect, the molecular weight of the acid generator is preferably equal to or smaller than 870, more preferably equal to or smaller than 800, even more preferably equal to or smaller than 700, and particularly preferably equal to or smaller than 600. In a case where the molecular weight of the acid generator is within the above range, DOF and LER are improved.

In the present invention, in a case where the compound generating an acid by being irradiated with actinic rays or radiation has a molecular weight distribution, the value of the weight-average molecular weight thereof is regarded as the standard of the molecular weight.

One kind of acid generator can be used singly, or two or more kinds of acid generators can be used in combination.

The content of the acid generator in the composition (total content in a case where the composition contains a plurality of kinds of acid generators) based on the total solid contents in the composition is preferably 0.1% to 30% by mass, more preferably 0.5% to 25% by mass, even more preferably 3% to 20% by mass, and particularly preferably 3% to 15% by mass.

In a case where the composition contains the compound represented by Formula (ZI-3) or (ZI-4) as an acid generator, the content of the acid generator contained in the composition (total content in a case where the composition contains a plurality of kinds of acid generators) based on the total solid contents in the composition is preferably 5% to 35% by mass, more preferably 8% to 30% by mass, even more preferably 9% to 30% by mass, and particularly preferably 9% to 25% by mass.

(C) Solvent

In a case where the actinic ray-sensitive or radiation-sensitive resin composition is prepared by dissolving the components described above, as a solvent, for example, it is possible to use an organic solvent such as alkylene glycol monoalkyl ether carboxylate, alkylene glycol monoalkyl ether, lactic acid alkyl ester, alkyl alkoxypropionate, cyclic lactone having 4 to 10 carbon atoms, a monoketone compound having 4 to 10 carbon atoms that may have a ring, alkylene carbonate, alkoxyalkyl acetate, or alkyl pyruvate.

As the alkylene glycol monoalkyl ether carboxylate, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate are preferable.

As the alkylene glycol monoalkyl ether, for example, propylene glycol monomethyl ether, propylene glycol monoethyl ether, propylene glycol monopropyl ether, propylene glycol monobutyl ether, ethylene glycol monomethyl ether, and ethylene glycol monoethyl ether are preferable.

As the lactic acid alkyl ester, for example, methyl lactate, ethyl lactate, propyl lactate, and butyl lactate are preferable.

As the alkyl alkoxypropionate, for example, ethyl 3-ethoxypropionate, methyl 3-methoxypropionate, methyl 3-ethoxypropionate, and ethyl 3-methoxypropionate are preferable.

As the cyclic lactone having 4 to 10 carbon atoms, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone are preferable.

As the monoketone compound having 4 to 10 carbon atoms that may contain a ring, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone are preferable.

As the alkylene carbonate, for example, propylene carbonate, vinylene carbonate, ethylene carbonate, and butylene carbonate are preferable.

As the alkoxyalkyl acetate, for example, 2-methoxyethyl acetate, 2-ethoxyethyl acetate, 2-(2-ethoxyethoxy)ethyl acetate, 3-methoxy-3-methyl butyl acetate, and 1-methoxy-2-propyl acetate are preferable.

As the alkyl pyruvate, for example, methyl piruvate, ethyl piruvate, and propyl piruvate are preferable.

Examples of solvents that can be preferably used include solvents having a boiling point equal to or higher than 130° C. at a normal temperature under normal pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl piruvate, 2-ethoxyethyl acetate, 2-(2-ethoxyethoxy)ethyl acetate, propylene carbonate, butyl butanoate, isoamyl acetate, and 2-hydroxymethyl isobutyrate.

One kind of solvent described above may be used singly, or two or more kinds of solvents described above may be used in combination.

As the organic solvent, a mixed solvent may be used which is obtained by mixing a solvent containing a hydroxyl group in the structure with a solvent that does not contain a hydroxyl group.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether, ethyl lactate, and the like. Among these, propylene glycol monomethyl ether and ethyl lactate are particularly preferable.

Examples of the solvent that does not contain a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylactamide, dimethyl sulfoxide, and the like. Among these, propylene glycol monomethyl ether acetate, ethyl ethoxypropionate, 2-heptanone, γ-butyrolactone, cyclohexanone, or butyl acetate is particularly preferable, and propylene glycol monomethyl ether acetate, ethyl ethoxypropionate, or 2-heptanone is most preferable.

The mixing ratio (mass ratio) between the solvent containing a hydroxyl group and the solvent that does not contain a hydroxyl group is 1/99 to 99/1, preferably 10/90 to 90/10, and more preferably 20/80 to 60/40. In view of coating uniformity, a mixed solvent containing the solvent that does not contain a hydroxyl group in an amount of equal to or greater than 50% by mass is particularly preferable.

It is preferable that the solvent is a mixed solvent formed of two or more kinds of solvents containing propylene glycol monomethyl ether acetate.

(D) Basic Compound

In order to suppress a performance change that occurs as time passes from exposure to heating, it is preferable that the actinic ray-sensitive or radiation-sensitive resin composition contains a basic compound.

Furthermore, from the viewpoint of DOF and EL performance, it is preferable that the actinic ray-sensitive or radiation-sensitive resin composition contains a basic compound. That is, the basic compound contained in the actinic ray-sensitive or radiation-sensitive resin composition moves to a protective film at the time of pre-baking after the formation of the protective film, and at the time of PEB, a portion of the basic compound returns to an unexposed portion in the actinic ray-sensitive or radiation-sensitive film. In this case, because the amount of the basic compound is reduced in an exposed portion, acids are easily diffused in the exposed portion. In contrast, because the amount of the basic compound increases in an unexposed portion, it is difficult for acids to be diffused in the unexposed portion. In this way, the contrast in acid diffusion between the exposed portion and the unexposed portion in the actinic ray-sensitive or radiation-sensitive film becomes great. Consequently, DOF and EL are further improved.

As the basic compound, for example, compounds having structures represented by the following Formulae (A) to (E) are preferable.

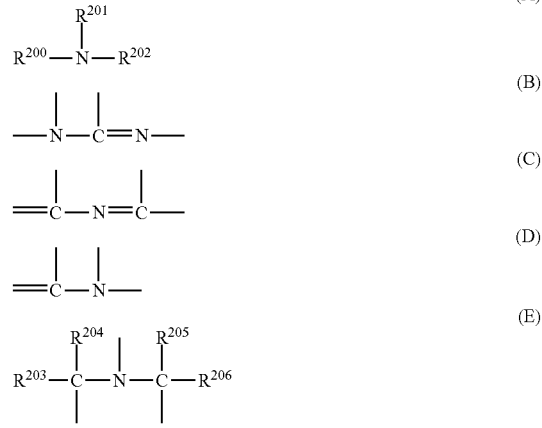

In Formulae (A) to (E), $R^{200}$, $R^{201}$, and $R^{202}$ may be the same as or different from each other and each represent a hydrogen atom, an alkyl group (preferably having 1 to 20 carbon atoms), a cycloalkyl group (preferably having 3 to 20 carbon atoms), or an aryl group (having 6 to 20 carbon atoms). $R^{201}$ and $R^{202}$ may form a ring by being bonded to each other.

In a case where the alkyl group has a substituent, as such an alkyl group, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each represent an alkyl group having 1 to 20 carbon atoms.

As the alkyl group in Formulae (A) to (E), an unsubstituted alkyl group is more preferable.

As the compound, for example, guanidine, aminopyrrolidine, pyrazole, pyrazoline, piperazine, aminomorpholine, aminoalkyl morpholine, piperidine, and the like are preferable. As the compound, for example, a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, an aniline derivative having a hydroxyl group and/or an ether bond, and the like are more preferable.

Examples of the compound having an imidazole structure include imidazole, 2,4,5-triphenylimidazole, benzimidazole, and the like. Examples of the compound having a diazabicyclo structure include 1,4-diazabicyclo[2,2,2]octane, 1,5-diazabicyclo[4,3,0]non-S-ene, 1,8-diazabicyclo[5,4,0]undec-7-ene, and the like. Examples of the compound having an onium hydroxide structure include triaryl sulfonium hydroxide, phenacyl sulfonium hydroxide, and sulfonium hydroxide having a 2-oxoalkyl group, and specific examples thereof include triphenyl sulfonium hydroxide, tris(t-butylphenyl)sulfonium hydroxide, bis(t-butylphenyl)iodonium hydroxide, phenacyl thiophenium hydroxide, 2-oxopropyl thiophenium hydroxide, and the like. Examples of the compound having an onium carboxylate structure include a compound in which an anion portion of a compound having an onium hydroxide structure becomes carboxylate, and examples thereof include acetate, adamantane-1-carboxylate, perfluoroalkyl carboxylate, and the like. Examples of the compound having a trialkylamine structure include tri (n-butyl)amine, tri(n-octyl)amine, and the like. Examples of the aniline compound include 2,6-diisopropylaniline, N,N-dimethylaniline, N,N-dibutylaniline, N,N-dihexylaniline, and the like. Examples of the alkylamine derivative having a hydroxyl group and/or an ether bond include ethanolamine, diethanolamine, triethanolamine, tris(methoxyethoxyethyl)amine, and the like. Examples of the aniline derivative having a hydroxyl group and/or an ether bond include N,N-bis(hydroxyethyl)aniline and the like.

Furthermore, as the basic compound, it is also possible to suitably use a compound described as a basic compound (XC) contained in the composition for forming a protective film (referred to as composition for forming an upper layer film or topcoat composition as well) described above.

One kind of each of the basic compounds described above is used singly, or two or more kinds of the basic compounds described above are used in combination.

The amount of the basic compound used based on the solid content in the actinic ray-sensitive or radiation-sensitive resin composition is preferably 0.001% to 10% by mass, and more preferably 0.01% to 5% by mass.

In the actinic ray-sensitive or radiation-sensitive resin composition, a ratio between the photoacid generator used and the basic compound used that is represented by photoacid generator/basic compound (molar ratio) is preferably 2.5 to 300. That is, in view of sensitivity and resolution, the ratio is preferably equal to or higher than 2.5 in terms of molar ratio. In view of inhibiting resolution from deteriorating due to the increase in thickness of a pattern with the passage of time to a post exposure baking treatment, the ratio is preferably equal to or lower than 300. Photoacid generator/basic compound (molar ratio) is more preferably 5.0 to 200, and even more preferably 7.0 to 150.

(E) Hydrophobic Resin

The actinic ray-sensitive or radiation-sensitive resin composition may contain a hydrophobic resin (E). As the hydrophobic resin, for example, the aforementioned resin (XB) contained in the composition for forming a protective film can be suitably used. Furthermore, as the hydrophobic resin, for example, "[4] Hydrophobic resin (D)" described in paragraphs "0389" to "0474" in JP2014-149409A and the like are also suitable.

The weight-average molecular weight of the hydrophobic resin (E) expressed in terms of standard polystyrene is preferably 1,000 to 100,000, more preferably 1,000 to 50,000, and even more preferably 2,000 to 15,000.

One kind of hydrophobic resin (E) may be used singly, or two or more kinds of hydrophobic resins (E) may be used in combination.

In the composition, the content rate of the hydrophobic resin (E) with respect to the total solid contents in the actinic ray-sensitive or radiation-sensitive resin composition is preferably 0.01% to 10% by mass, more preferably 0.05% to 8% by mass, and even more preferably 0.1% to 7% by mass.

(F) Surfactant

The actinic ray-sensitive or radiation-sensitive resin composition preferably further contains (F) surfactant. It is more preferable that the composition contains any of a fluorine-based surfactant and/or a silicon-based surfactant (a fluorine-based surfactant, a silicon-based surfactant, and a surfactant having both the fluorine atom and silicon atom) or two or more kinds of the surfactants described above.

In a case where the actinic ray-sensitive or radiation-sensitive resin composition contains (F) surfactant, it is possible to form a pattern having weak adhesiveness and few development defects with excellent sensitivity and resolution by using an exposure light source having a wavelength equal to or shorter than 250 nm, particularly, a wavelength equal to or shorter than 220 nm.

Examples of the fluorine-based surfactant and/or silicon-based surfactant include the surfactants described in JP1987-36663A (JP-S62-036663A), JP1986-226746A (JP-S61-226746A), JP1986-226745A (JP-S61-226745A), JP1987-170950A (JP-S62-170950A), JP1988-34540A (JP-S63-034540A), JP1995-230165A (JP-H07-230165A), JP1996-62834A (JP-H08-062834A), JP1997-54432A (JP-H09-054432A), JP1997-5988A (JP-H09-005988A), JP2002-277862A, U.S. Pat. Nos. 5,405,720A, 5,360,692A, 5,529,881A, 5,296,330A, 5,436,098A, 5,576,143A, 5,294,511A, and 5,824,451A. Furthermore, the following commercial surfactants can be used as they are.

As commercial surfactants, for example, it is possible to use fluorine-based surfactants or silicon-based surfactants such as FTOP EF301 and EF303 (manufactured by New Japanese Akita Kasei Co., Ltd), FLUORAD FC430, 431, and 4430 (manufactured by Sumitomo 3M Limited), MEGAFACE $F_{171}$, $F_{173}$, $F_{176}$, $F_{189}$, $F_{113}$, $F_{110}$, $F_{177}$, $F_{120}$, and R08 (manufactured by DIC Corporation), SURFLON S-382, SC101, 102, 103, 104, 105, and 106 (manufactured by ASAHI GLASS CO., LTD.), TROYZOL S-366 (manufactured by Troy Chemical Industries), GF-300 and GF-150 (manufactured by TOAGOSEI CO., LTD.), SURFLON S-393 (manufactured by AGC SEIMI CHEMICAL CO., LTD.), FTOP EF121, EF122A, EF122B, RF122C, EF125M, EF135M, EF351, EF352, EF801, EF802, and EF601 (manufactured by JEMCO), PF636, PF656, PF6320, and PF6520 (manufactured by OMNOVA Solutions Inc.), and FTX-204D, 208G, 218G, 230G, 204D, 208D, 212D, 218, and 222D (manufactured by NEOS COMPANY LIMITED). Furthermore, a polysiloxane polymer KP-341 (manufactured by Shin-Etsu Chemical Co., Ltd.) can also be used as a silicon-based surfactant.

As a surfactant, in addition to known ones described above, it is possible to use a surfactant using a polymer having a fluoroaliphatic group derived from a fluoroaliphatic compound manufactured by a telomerization method (referred to as a telomer method as well) or an oligomerization method (referred to as an oligomer method as well). The fluoroaliphatic compound can be synthesized by the method described in JP2002-090991A.

As the polymer having a fluoroaliphatic group, a copolymer of a monomer having a fluoroaliphatic group and (poly(oxyalkylene))acrylate and/or (poly(oxyalkylene))methacrylate is preferable. The copolymer may be a irregularly distributed copolymer or a block copolymer. Furthermore, examples of the poly(oxyalkylene) group include a poly(oxyethylene) group, a poly(oxypropylene) group, a poly(oxybutylene) group, and the like. In addition, the copolymer may be a unit having alkylene with different chain lengths, such as a block connection of poly(oxyethylene), oxypropylene, and oxyethylene or a block connection of poly(oxyethylene) and oxypropylene. The copolymer of a monomer having a fluoroaliphatic group and (poly (oxyethylene))acrylate (or methacrylate) is not limited to a binary copolymer, and may be a copolymer constituted with three or more components that is obtained by simultaneously copolymerizing a monomer having two or more kinds of different fluoroaliphatic groups or two or more kinds of different (poly(oxyalkylene)acrylate (or methacrylate), and the like.

Examples of commercial surfactants include MEGAFACE $F_{178}$, F-470, F-473, F-475, F-476, and F-472 (manufactured by DIC Corporation). Furthermore, for example, it is possible to use a copolymer of acrylate (methacrylate) having a $C_6F_{13}$ group and (poly(oxyalkylene))acrylate (or methacrylate), a copolymer of acrylate (or methacrylate) having a $C_3F_7$ group, (poly(oxyethylene))acrylate (or methacrylate), and (poly(oxypropylene))acrylate (or methacrylate), and the like.

In addition, it is possible to use surfactants other than the fluorine-based surfactant and/or the silicon-based surfactant. Specifically, for example, it is possible to use nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octyl phenol ether and polyoxyethylene nonyl phenol ether, polyoxyethylene.polyoxypropylene block copolymers, sorbitan fatty acid esters such as sorbitan monolaurate, sorbitan monopalminate, sorbitan monostearate, sorbitan monooleate, sorbitan trioleate, and sorbitan tristerate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tirstearate, and the like.

One kind of each of these surfactants may be used singly, or some of the surfactants may be used in combination.

The amount of (F) surfactant used with respect to the total amount of the actinic ray-sensitive or radiation-sensitive resin composition (except for solvents) is preferably 0.01% to 10% by mass, and more preferably 0.1% to 5% by mass.

(G) Carboxylic Acid Onium Salt

The actinic ray-sensitive or radiation-sensitive resin composition may contain (G) carboxylic acid onium salt. Examples of the carboxylic acid onium salt include a carboxylic aid sulfonium salt, a carboxylic acid iodonium salt, a carboxylic acid ammonium salt, and the like. Particularly, as (G) carboxylic acid onium salt, an iodonium salt and a sulfonium salt are preferable. Furthermore, it is preferable that a carboxylate residue of (G) carboxylic acid onium salt does not contain an aromatic group and a carbon-carbon double bond. Particularly, as an anionic portion, a linear, branched, or cyclic (monocyclic or polycyclic) alkyl carboxylate anion having 1 to 30 carbon atoms is preferable, and an anion of carboxylic acid in which some or all of the alkyl groups are substituted with a fluorine atom is more preferable. The alkyl chain may contain an oxygen atom. In a case where the alkyl chain contains an oxygen atom, transparency with respect to light having a wavelength equal to or shorter than 220 nm is secured, sensitive and resolution are enhanced, and pattern density and exposure margin are improved.

Examples of the anion in the carboxylic acid substituted with fluorine include anions of fluoroacetic acid, difluoroacetic acid, trifluoroacetic acid, pentafluoropropionic acid, heptafluorobutyric acid, nonafluoropentanoic acid, perfluorodecanoic acid, perfluorotridecanoic acid, perfluorocyclohexane carboxylic acid, 2,2-bistrifluoromethyl propionate, and the like.

(G) Carboxylic acid onium salt can be synthesized by reacting sulfonium hydroxide, iodonium hydroxide, or ammonium hydroxide with carboxylic acid and silver oxide in an appropriate solvent.

The content of (G) carboxylic acid onium salt in the composition with respect to the total solid contents in the actinic ray-sensitive or radiation-sensitive resin composition is preferably 0.1% to 20% by mass, more preferably 0.5% to 10% by mass, and even more preferably 1% to 7% by mass.

(H) Other Additives

If necessary, the actinic ray-sensitive or radiation-sensitive resin composition can further contain a dye, a plasticizer, a photosensitizer, a light absorber, an alkali-soluble resin, a dissolution inhibitor, a compound (for example, a phenol compound having a molecular weight equal to or smaller than 1,000, or an alicyclic or aliphatic compound having a carboxyl group) promoting solubility in a developer, and the like.

The phenol compound having a molecular weight of equal to or smaller than 1,000 can by easily synthesized by those in the related art with reference to the methods described in, for example, JP1992-122938A (JP-H04-122938A), JP1990-28531A (JP-H02-028531A), U.S. Pat. No. 4,916,210A, EP219294B, and the like.

Specific examples of the alicyclic or aliphatic compound having a carboxyl group include a carboxylic acid derivative having a steroid structure, such as cholic acid, deoxycholic acid, or lithocholic acid, an adamantane carboxylic acid derivative, adamantane dicarboxylic acid, cyclohexane carboxylic acid, cyclohexane dicarboxylic acid, and the like, but the present invention is not limited to these.

Examples of the method for forming an actinic ray-sensitive or radiation-sensitive film on a substrate include a method of coating a substrate with the actinic ray-sensitive or radiation-sensitive resin composition. The coating method is not particularly limited, and it is possible to use a spin coating method, a spray method, a roller coating method, a dip coating method, and the like known in the related art. Among these, a spin coating method is preferable.

If necessary, after the actinic ray-sensitive or radiation-sensitive film is formed, the substrate may be heated (prebake; PB). By PB, it is possible to form a uniform film by removing insoluble residual solvents. In a step a, the temperature of prebake performed after the formation of the actinic ray-sensitive or radiation-sensitive film is not particularly limited, but is preferably 50° C. to 160° C., and more preferably 60° C. to 140° C.

The substrate on which the actinic ray-sensitive or radiation-sensitive film will be formed is not particularly limited, and it is possible to use an inorganic substrate such as silicon, SiN, and $SiO_2$; an inorganic substrate for coating such as Spin on Glass (SOG); substrates that are generally used in a semiconductor manufacturing process such as Integrated Circuit (IC), a process of manufacturing a circuit board of liquid crystals, a thermal head, and the like, and other photofabrication lithography processes.

Before the actinic ray-sensitive or radiation-sensitive film is formed, an antireflection film may be provided on the substrate by coating.

As the antireflection film, it is possible to use any of inorganic film-type antireflection films such as titanium, titanium dioxide, titanium nitride, chromium oxide, carbon, and amorphous silicon and organic film-type antireflection films formed of a light absorber and a polymer material. As the organic antireflection film, it is possible to use commercial organic antireflection films such as a DUV30 series and a DUV-40 series manufactured by Brewer Science, Inc., AR-2, AR-3, and AR-5 manufactured by Shipley, and an ARC series such as ARC29A manufactured by NISSAN CHEMICAL INDUSTRIES, LTD.

<Use of Chemical Liquid>

The chemical liquid according to the above embodiment is preferably used for manufacturing semiconductors. Specifically, in a semiconductor device manufacturing process including a lithography step, an etching step, an ion implantation step, a peeling step, and the like, the chemical liquid is used for treating an organic substance after each step is finished or before the next step is started. Specifically, the chemical liquid is suitably used as a prewet solution, a developer, a rinsing solution, a peeling solution, and the like. For example, the chemical liquid can also be used for rinsing of edge line of semiconductor base materials before and after the coating with resist.

Furthermore, the chemical liquid can also be used as a diluent of a resin contained in a composition for forming a resist film used for manufacturing semiconductors. That is, the chemical liquid can be used as a solvent for a composition for forming a resist film.

The chemical liquid may be used by being diluted with another organic solvent and/or water, and the like.

In addition, the chemical liquid can be used as a slurry for polishing used in Chemical Mechanical Planarization (CMP). For example, abrasive grains, an oxidant, and the like may be added to the chemical liquid, and the resulting mixture can be used as a slurry for CMP polishing. Moreover, the chemical liquid can also be used as a solvent for diluting the slurry for CMP polishing.

The chemical liquid can also be used as a washing solution used for washing a substrate after CMP. Furthermore, the chemical liquid can be used as a solvent used in the washing solution. The washing solution may be diluted with another organic solvent and/or water, and the like.

The chemical liquid can also be suitably used for other uses in addition to the manufacturing of semiconductors. The chemical liquid can be used as a developer for polyimide, a resist for lens, and a resist for lens, a rinsing solution, and the like.

In addition, the chemical liquid can also be used as a solvent for medical uses or for washing. Particularly, the chemical liquid can be suitably used for washing containers, piping, base materials (for example, a wafer and glass), and the like.

EXAMPLES

Hereinafter, the present invention will be more specifically described based on examples. The materials, the amount and proportion of the materials used, the details of treatments, the procedure of treatments, and the like shown in the following examples can be appropriately modified as long as the gist of the present invention is maintained. Accordingly, the scope of the present invention is not limited to the following examples.

Purification of Chemical Liquid Containing Organic Solvent

Examples 1 to 17 and Comparative Examples 1 to 5

The purification device shown in FIG. 7 was prepared. Table 1 describes the materials of the filter media accommodated in the housing of each of the filter units the purification device comprises, and the like. In the column of "Type", whether the accommodated filter is a first filter or a second filter is described.

Specifically, the material of each filter medium is described in "Material". Particularly, for the first filter medium, the material of each layer is described. "Layer 1" and "Layer 2" mean that "Layer 1" and "Layer 2" are laminated in this order from the primary side.

In some examples, a tertiary filter unit is not used, and in this case, the column of "Tertiary filter unit" in Table 1 is left blank.

The abbreviations in the columns of Table 1 mean the following.

The materials of the first filter medium are as below.
"Nylon": nanofiber layer formed of nylon
"HDPE": nanoporous membrane layer formed of high density polyethylene (HDPE)
"Ion exchange nylon": nanofiber layer formed of nylon having ion exchange group The materials of the second filter medium are as below.
"PTFE": nanoporous membrane layer formed of polytetrafluoroethylene
"HDPE": nanoporous membrane layer formed of HDPE
"Nylon": nanofiber layer formed of nylon Particularly, regarding type, "The same as secondary" described for the filter medium of Comparative Example 1 means that the filter accommodated in the housing of the primary filter unit is the same as the filter accommodated in the secondary filter unit.

By using the purification device described above, a substance to be purified containing the solvent of the type described in Table 1 was purified, thereby obtaining a chemical liquid containing a solvent. The abbreviations in the column of "Substance to be purified" in Table 1 mean the following.

1: Butyl acetate (manufactured by FUJIFILM Electronic Materials Co., Ltd. (FFEM))
2: PGMEA/PGME (30/70 (volume/volume) mixture, the raw material is manufactured by FUJIFILM Electronic Materials Co., Ltd. (FFEM))
3: Cyclohexanone (manufactured by FFEM)
4: 4-Methyl-2-pentanol (manufactured by FFEM)

Specifically, the chemical liquid was generated by the following method. First, 40 L of the substance to be purified was introduced into a manufacturing tank of the purification device. Then, circulation purification was performed in which the purified substance to be purified that had been purified by each filter was introduced again into the manufacturing tank. This operation was repeated 10 times, thereby obtaining a chemical liquid.

<Evaluation of Defect Inhibition Performance of Chemical Liquid>

The defect inhibition performance of the chemical liquid manufactured using the manufacturing device described above was evaluated by the following method. The results are shown in Table 1.

First, a silicon oxide film substrate having a diameter of 300 mm was prepared.

Then, by using a wafer surface inspection device (SP-5; manufactured by KLA-Tencor Corporation), particles having a diameter equal to or greater than 30 nm that were present on the substrate was detected. Thereafter, by using a wafer surface defect analyzer (G6 manufactured by Applied Materials, Inc), the elements constituting the defects were analyzed, and the counted number of particles with a carbon atom content greater than 75% was evaluated the number of defects (the counted number was adopted as an initial value). Subsequently, the substrate was set in a spin jetting device, and while the substrate was being rotated, each of the chemical liquids was jetted to the surface of the substrate at a flow rate of 1.5 L/min. Then, the substrate was spin-dried.

Thereafter, by the same method as that described above, the number of defects was counted (the counted number was adopted as a counted value), and then a difference between the initial value and the counted value (initial value−counted value) was calculated. Based on the following standards, the obtained result was evaluated. The results are shown in Table 1.
- "1": The difference between the initial value and the counted value of the number of defects was equal to or smaller than 10.
- "2": The difference between the initial value and the counted value of the number of defects was 11 to 100.
- "3": The difference between the initial value and the counted value of the number of defects was 101 to 200.
- "4": The difference between the initial value and the counted value of the number of defects was 201 to 1,000.
- "5": The difference between the initial value and the counted value of the number of defects was greater than 1,001.

<Measurement of Pot Life of Filter Medium>

By using the purification device described above, each substance to be purified was continuously purified. In the middle of the process, whenever the amount of the liquid passing the device became 10,000 kg, the chemical liquid obtained after purification was collected for test. Then, by using a coater/developer LITHIUS manufactured by Tokyo Electron Limited, a 300 mm silicon substrate was coated with each of the chemical liquids for test for 60 seconds. Subsequently, for the obtained silicon substrate with a coating film, by using a wafer surface foreign substance inspection device SP-5 manufactured by KLA-Tencor Corporation, number of foreign substances having a diameter equal to or greater than 30 nm was counted. The amount of the liquid passing the device that was determined at a point in time when the counted number became twice the initial value was adopted as the pot life of the filter medium.

The result was calculated as a ratio determined on the premise that the pot life obtained in a case where only the first filter is used is 1, and evaluated based on the following standards. The results are shown in Table 1.
1: The pot life was equal to or longer than 10.
2: The pot life was equal to or longer than 5 and shorter than 10.
3: The pot life was equal to or longer than 2 and shorter than 5.
4: The pot life was longer than 1 and shorter than 2.
5: The pot life was equal to or shorter than 1.

Examples 18 to 20 and Comparative Examples 6 and 7

The purification device shown in FIG. 7 was prepared. Table 2 describes the materials of the filter media accommodated in the housing of each of the filter units the purification device comprises, and the like. In "Ra/R0", a value of Ra/R0 calculated from the Hansen solubility parameters of the substance to be purified and the material of the second filter medium is described. The meanings of the titles of other columns are the same as those in Table 1.

The abbreviations relating to the substance to be purified mean the following.
"1": Cyclohexanone
"2": PGMEA
"3": Diethyl carbonate The materials of the first filter medium are as below.
"Hydrophilized HDPE": a nanoporous membrane layer formed of HDPE hydrophilized by a plasma treatment.
A water contact angle of the filter medium surface measured at 25° C. by using a contact angle meter was 50°.
"HDPE": a nanoporous membrane layer formed of HDPE The material of the second filter medium is as below.
"HDPE": a nanoporous membrane layer formed of HDPE First, 40 L of the substance to be purified described in Table 2 was introduced into a manufacturing tank of the purification device described above. Then, circulation filtration was performed in which the purified substance to be purified that had been purified by each filter was introduced again into the manufacturing tank. This operation was repeated 10 times, thereby obtaining a chemical liquid. By the same method as that described above, the defect inhibition performance of the obtained chemical liquid was evaluated. The results are shown in Table 2.

By using each of the purification devices described in Table 2, the pot life of the filter medium was measured by the same method as that described above. The results are shown in Table 2.

Purification of Chemical Liquid Containing Water

Examples 21 to 37 and Comparative Examples 8 and 9

The purification device shown in FIG. 7 was prepared. Table 3 describes the materials of the filter media accommodated in the housing of each of the filter units the purification device comprises, and the like. The meanings of the titles of the columns are the same as those in Table 1.

The materials of the first filter medium are as below.
"Nylon": nanofiber layer formed of nylon
"HDPE 1": a nanoporous membrane layer formed of HDPE hydrophilized by a plasma treatment. A water contact angle of the filter medium surface measured at 25° C. by using a contact angle meter was 50°.
"HDPE": a nanoporous membrane layer formed of HDPE The materials of the second filter medium are as below.
"PTFE": a nanoporous membrane layer formed of polytetrafluoroethylene. The polytetrafluoroethylene was hydrophilized by a plasma treatment, and a water contact angle thereof measured at 25° C. by using a contact angle meter was 45°.
"HDPE2": a nanoporous membrane layer formed of HDPE. The HDPE was hydrophilized by a plasma treatment, and a water contact angle thereof measured at 25° C. by using a contact angle meter was 50°.
"PESU": nanoporous membrane layer formed of polyether sulfone.

The substance to be purified (40 L) described in Table 3 was introduced into a manufacturing tank of the purification device described above. Then, circulation filtration was performed in which the purified substance to be purified that had been purified by each filter was introduced again into the manufacturing tank. This operation was repeated 10 times, thereby obtaining a chemical liquid.

The abbreviations in the column of "Substance to be purified" in Table 3 mean the following.

By the same method as that described above, the defect inhibition performance of the obtained chemical liquid was evaluated. Furthermore, by the same method as that described above, the pot life of the filter medium was measured. The results are shown in Table 3.

1: FHD-5 (aqueous alkaline developer)
2: FHD-402 (aqueous alkaline developer)

Purification of Actinic Ray-Sensitive or Radiation-Sensitive Resin Composition

Examples 38 to 48 and Comparative Examples 10 and 11

First, by the following method, an actinic ray-sensitive or radiation-sensitive resin composition 1 was prepared.
(Actinic Ray-Sensitive or Radiation-Sensitive Resin Composition 1)
Resin synthesized according to the following synthesis method: 0.77 g
Synthesis of Resin
According to the following synthesis scheme, 11.9 g of a monomer (1), 8.0 g of a monomer (1-2), 15.1 g of a monomer (1-3), and 1.12 g of a polymerization initiator V-601 (manufactured by Wako Pure Chemical Industries, Ltd.) were dissolved in 129.0 g of cyclohexanone, thereby obtaining a mixed solution.
Then, 69.5 g of cyclohexanone was put into a reaction container, the mixed solution was added dropwise for 4 hours to the cyclohexanone in the reaction container kept at 85° C. in a nitrogen gas atmosphere, thereby obtaining a reaction solution. The reaction solution was stirred for 2 hours while being heated, and then left to cool to room temperature. Thereafter, 49.6 g of methanol and 4.9 g of triethylamine were added to the reaction solution, and the reaction solution was stirred and heated for 18 hours at 50° C. and then left to cool to room temperature. Subsequently, 200 g of ethyl acetate and 200 g of water were added to the reaction solution such that liquid separation occurred, and an organic layer was collected. The organic layer was washed three times with water, and then the solvent was distilled away under reduced pressure. The residual solids were dissolved in 200 g of propylene glycol monomethyl ether acetate (PGMEA), subjected to azeotropic dehydration by distilling away the solvent, and then 198.5 g of cyclohexanone was added thereto, thereby obtaining a solution. The solution was then added dropwise to 2,336 g of a mixed solution of n-heptane and ethyl acetate (n-heptane/ethyl acetate=9/1 (mass ratio)) such that solids were precipitated, and the solids were filtered. Thereafter, the filtered solids were washed by being sprinkled with 701 g of a mixed solution of n-heptane and ethyl acetate (n-heptane/ethyl acetate=9/1 (mass ratio)). Subsequently, the washed solids were dried under reduced pressure, thereby obtaining 23.8 g of a resin (A-1). The compositional ratio in the resin calculated by $^1$H-NMR and $^{13}$C-NMR was repeating unit (a)/repeating unit (c)/repeating unit (b)=30/20/50 (molar ratio). The scheme shows the resin synthesis method by simplifying the method.

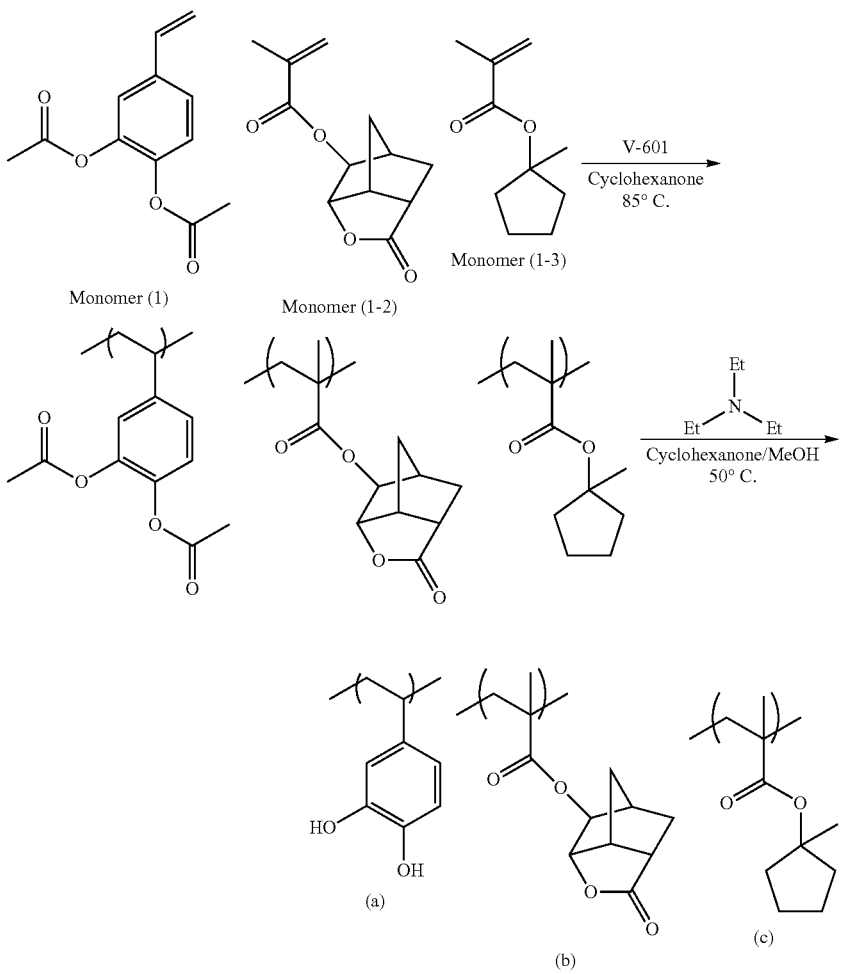

The following acid generator: 0.23 g

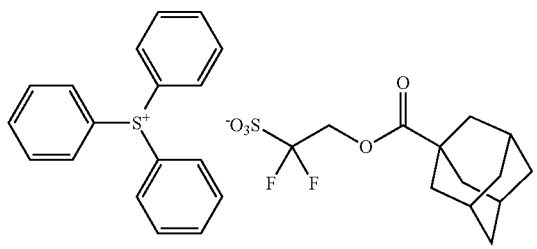

The following acid diffusion controller: 0.03 g

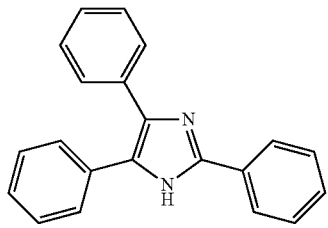 [SMILES: c1ccc(-c2nc(-c3ccccc3)c(-c3ccccc3)[nH]2)cc1]

Solvent:
Propylene glycol monomethyl ether acetate (PGMEA): 60 g
Propylene glycol monomethyl ether (PGME): 15 g Thereafter, the purification device shown in FIG. 7 was prepared. Table 4 describes the materials of the filter media accommodated in the housing of each of the filter units the purification device comprises, and the like. The meanings of the titles of the columns are the same as those in Table 1.
The materials of the first filter are as below.
"Nylon": nanofiber layer formed of nylon
"HDPE": nanoporous membrane layer formed of HDPE
The materials of the second filter medium are as below.
"PTFE": nanoporous membrane layer formed of PTFE
"HDPE": nanoporous membrane layer formed of HDPE
"Nylon": nanofiber layer formed of nylon The substance to be purified (40 L) described in Table 4 was introduced into a manufacturing tank of the purification device described above. Then, circulation filtration was performed in which the purified substance to be purified that had been purified by each filter was introduced again into the manufacturing tank. This operation was repeated 10 times, thereby obtaining a chemical liquid.

The abbreviation in the column of "Substance to be purified" in Table 4 means the following.
"1": Actinic ray-sensitive or radiation-sensitive resin composition 1

A resist pattern was formed by the following method by using the obtained chemical liquid, and the way the defects occurred was evaluated. Furthermore, by the method described above, the pot life of the filter medium was measured.

<Formation of Resist Pattern (Line and Space Pattern)/EUV Exposure (Solvent Development)>

A silicon wafer was coated with ARC29SR (manufactured by Brewer Science, Inc.) as a composition for forming an organic antireflection film, and the wafer was baked for 60 seconds at 205° C. such that an antireflection film having a thickness of 86 nm was formed on the silicon wafer. The antireflection film was coated with the prewet solution described in the following Table 4 and then coated with the chemical liquid, and the wafer was baked for 60 seconds at 120° C., thereby forming a resist film having a thickness of 40 nm on the silicon wafer.

By using an EUV exposure machine (Micro Exposure Tool manufactured by Exitech Corporation, NA 0.3, Quadrupole, outer a: 0.68, inner a: 0.36) and an exposure mask (mask having line/space=1/1 and a space width (width of light transmitting portion)=10 nm), the silicon wafer comprising a resist film was pattern-wise exposed. After the pattern-wise exposure, the silicon wafer having an exposed resist film was placed on a heated hot plate such that the silicon wafer side faced down, and subjected to baking for 60 seconds at a temperature of 90° C. The baked resist film was puddle-developed for 30 seconds by using a developer, and then rinsed. Then, the wafer was rotated for 30 seconds at a rotation speed of 2,000 rpm, thereby obtaining a 1:1 line and space pattern.

<Evaluation of Pattern Forming Properties>

After the pattern was formed, the upper surface of the line patterns and the space portions were observed using a critical-dimension scanning electron microscope (S9380II manufactured by Hitachi, LTD.). In this way, the way the defects occurred in the formed pattern having a line width of 10 nm was checked. The obtained pattern observation results were classified 1 to 3. The results are shown in Table 4.
"1": A pattern having a line width of 10 nm was formed.
"2": Defects occurred in a portion of the pattern.
"3": The pattern had a lot of defects.

<Evaluation of Pot Life of Filter Medium>
The pot life of the filter medium was evaluated by the same method as that described above. The results are shown in Table 4.

TABLE 2

| | Substance to be purified Type | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|
| | | Material | Pore size (nm) | Type | Layer 1 Material | Layer 2 Material | Pore size (nm) | Type | Material | Pore size (nm) | Type | Defect inhibition performance | Pot life of filter medium |
| Example 1 | 1 | PTFE | 10 | Second | Nylon | HDPE | 2 | First | | | | 2 | 2 |
| Example 2 | 1 | PTFE | 10 | Second | Nylon | HDPE | 10 | First | | | | 2 | 2 |
| Example 3 | 1 | PTFE | 10 | Second | Nylon | HDPE | 50 | First | HDPE | 10 | Second | 2 | 2 |
| Example 4 | 1 | HDPE | 2 | Second | Nylon | HDPE | 10 | First | | | | 2 | 1 |
| Example 5 | 1 | HDPE | 2 | Second | Nylon | HDPE | 10 | First | HDPE | 2 | Second | 1 | 1 |
| Example 6 | 1 | PTFE | 10 | Second | Nylon | HDPE | 10 | First | HDPE | 2 | Second | 2 | 2 |
| Example 7 | 1 | Nylon | 10 | Second | Nylon | HDPE | 10 | First | HDPE | 2 | Second | 2 | 1 |
| Example 8 | 1 | PTFE | 100 | Second | Nylon | HDPE | 10 | First | | | | 3 | 3 |
| Example 9 | 1 | PTFE | 200 | Second | Nylon | HDPE | 10 | First | | | | 3 | 3 |
| Example 10 | 1 | Nylon | 10 | Second | Nylon | HDPE | 10 | First | | | | 2 | 1 |

TABLE 2-continued

| | Substance to be purified Type | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|
| | | Material | Pore size (nm) | Type | Layer 1 Material | Layer 2 Material | Pore size (nm) | Type | Material | Pore size (nm) | Type | Defect inhibition performance | Pot life of filter medium |
| Example 11 | 1 | PTFE | 10 | Second | Nylon | HDPE | 10 | First | PTFE | 10 | Second | 3 | 2 |
| Example 12 | 2 | PTFE | 10 | Second | Nylon | HDPE | 10 | First | | | | 2 | 2 |
| Example 13 | 3 | PTFE | 10 | Second | Nylon | HDPE | 10 | First | | | | 2 | 2 |
| Example 14 | 4 | PTFE | 10 | Second | Nylon | HDPE | 10 | First | | | | 2 | 2 |
| Example 15 | 1 | | | | Nylon | HDPE | 10 | First | PTFE | 10 | Second | 3 | 3 |
| Example 16 | 1 | | | | Nylon | HDPE | 10 | First | HDPE | 2 | Second | 2 | 3 |
| Example 17 | 1 | PTFE | 10 | Second | Ion exchange Nylon | HDPE | 10 | First | | | | 2 | 1 |
| Comparative Example 1 | 1 | Same as secondary filter unit | | First | Nylon | HDPE | 10 | First | | | | 2 | 5 |
| Comparative Example 2 | 1 | | | | Nylon | HDPE | 10 | First | | | | 3 | 5 |
| Comparative Example 3 | 1 | | | | Nylon | HDPE | 50 | First | | | | 3 | 5 |
| Comparative Example 4 | 1 | PTFE | 100 | Second | HDPE | | 10 | Second | PTFE | 10 | Second | 4 | 3 |
| Comparative Example 5 | 1 | PTFE | 100 | Second | HDPE | | 10 | Second | PTFE | 10 | Second | 4 | 3 |

TABLE 3

| | Substance to be purified Type | Ra/R0 | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|---|
| | | | Material | Pore size (nm) | Type | Layer 1 Material | Layer 2 Material | Pore size (nm) | Type | Material | Pore size (nm) | Type | Defect inhibition performance | Pot life of filter medium |
| Example 18 | 1 | 0.76 (HDPE and cyclohexane) | HDPE | 2 | Second | Hydrophilized HDPE | HDPE | 10 | First | HDPE | 2 | Second | 1 | 1 |
| Example 19 | 2 | 0.92 (HDPE and PGMEA) | HDPE | 2 | Second | Hydrophilized HDPE | HDPE | 10 | First | HDPE | 2 | Second | 1 | 1 |
| Example 20 | 3 | 0.55 (HDPE and diethyl carbonate) | HDPE | 2 | Second | Hydrophilized HDPE | HDPE | 10 | First | HDPE | 2 | Second | 3 | 2 |
| Comparative Example 6 | 1 | 0.55 (HDPE and diethyl carbonate) | HDPE | 2 | Second | N/A | HDPE | 10 | First | HDPE | 2 | Second | 4 | 1 |
| Comparative Example 7 | 3 | 0.55 (HDPE and diethyl carbonate) | HDPE | 2 | Second | N/A | HDPE | 10 | First | HDPE | 2 | Second | 4 | 2 |

TABLE 4

| | Substance to be purified Type | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|
| | | Material | Pore size (nm) | Type | Layer 1 Material | Layer 2 Material | Pore size (nm) | Type | Material | Pore size (nm) | Type | Defect inhibition performance | Pot life of filter medium |
| Example 21 | 1 | HDPE2 | 2 | Second | Nylon | HDPE1 | 10 | First | | | | 2 | 1 |
| Example 22 | 1 | HDPE2 | 2 | Second | Nylon | HDPE1 | 10 | First | | | | 2 | 1 |
| Example 23 | 1 | HDPE2 | 10 | Second | Nylon | HDPE1 | 10 | First | | | | 2 | 1 |
| Example 24 | 1 | PESU | 2 | Second | Nylon | HDPE1 | 10 | First | | | | 2 | 2 |
| Example 25 | 1 | PTFE | 10 | Second | Nylon | HDPE1 | 10 | First | | | | 2 | 2 |
| Example 26 | 1 | HDPE2 | 10 | Second | Nylon | HDPE1 | 10 | First | HDPE | 2 | Second | 1 | 1 |

TABLE 4-continued

| | Substance to be purified Type | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|
| | | Material | Pore size (nm) | Type | Layer 1 Material | Layer 2 Material | Pore size (nm) | Type | Material | Pore size (nm) | Type | Defect inhibition performance | Pot life of filter medium |
| Example 27 | 1 | PTFE | 10 | Second | Nylon | HDPE1 | 10 | First | HDPE | 2 | Second | 1 | 2 |
| Example 28 | 1 | PESU | 2 | Second | Nylon | HDPE1 | 10 | First | HDPE | 2 | Second | 1 | 2 |
| Example 29 | 2 | HDPE2 | 2 | Second | Nylon | HDPE1 | 10 | First | | | | 2 | 1 |
| Example 30 | 2 | PTFE | 10 | Second | Nylon | HDPE1 | 10 | First | | | | 2 | 2 |
| Example 31 | 2 | PESU | 2 | Second | Nylon | HDPE1 | 10 | First | | | | 2 | 2 |
| Example 32 | 2 | HDPE2 | 200 | Second | Nylon | HDPE1 | 50 | First | | | | 3 | 1 |
| Example 33 | 1 | HDPE2 | 200 | Second | Nylon | HDPE1 | 10 | First | | | | 3 | 3 |
| Example 34 | 1 | HDPE2 | 200 | Second | Nylon | HDPE1 | 10 | First | | | | 3 | 3 |
| Example 35 | 1 | PESU | 200 | Second | Nylon | HDPE1 | 10 | First | | | | 3 | 3 |
| Example 36 | 1 | HDPE2 | 200 | Second | Nylon | HDPE1 | 10 | First | PESU | 2 | Second | 2 | 3 |
| Example 37 | 1 | HDPE2 | 10 | Second | Nylon | HDPE | 10 | First | | | | 3 | 1 |
| Comparative Example 8 | 1 | | | | Nylon | HDPE1 | 10 | First | | | | 4 | 5 |
| Comparative Example 9 | 1 | | | | Nylon | HDPE1 | 50 | First | | | | 5 | 5 |

TABLE 5

| | Substance to be purified Type | Type of filter medium (Primary filter unit) | | | Type of filter medium (Secondary filter unit) | | | | Type of filter medium (Tertiary filter unit) | | | Evaluation | |
|---|---|---|---|---|---|---|---|---|---|---|---|---|---|
| | | Material | Pore size (nm) | Type | Layer 1 Material | Layer 2 Material | Pore size (nm) | Type | Material | Pore size (nm) | Type | Pattern forming properties | Pot life of filter medium |
| Example 38 | 1 | HDPE | 2 | Second | Nylon | HDPE | 10 | First | | | | 2 | 1 |
| Example 39 | 1 | HDPE | 10 | Second | Nylon | HDPE | 10 | First | | | | 2 | 1 |
| Example 40 | 1 | PTFE | 10 | Second | Nylon | HDPE | 10 | First | | | | 2 | 2 |
| Example 41 | 1 | Nylon | 2 | Second | Nylon | HDPE | 10 | First | | | | 2 | 1 |
| Example 42 | 1 | HDPE | 2 | Second | Nylon | HDPE | 10 | First | HDPE | 2 | Second | 1 | 1 |
| Example 43 | 1 | PTFE | 10 | Second | Nylon | HDPE | 10 | First | HDPE | 2 | Second | 1 | 2 |
| Example 44 | 1 | HDPE | 2 | Second | Nylon | HDPE | 10 | First | Nylon | 10 | Second | 1 | 1 |
| Example 45 | 1 | HDPE | 100 | Second | Nylon | HDPE | 10 | First | | | | 2 | 3 |
| Example 46 | 1 | HDPE | 100 | Second | Nylon | HDPE | 10 | First | | | | 2 | 3 |
| Example 47 | 1 | Nylon | 100 | Second | Nylon | HDPE | 10 | First | | | | 2 | 3 |
| Example 48 | 1 | HDPE | 100 | Second | Nylon | HDPE | 10 | First | PTFE | 10 | Second | 2 | 3 |
| Comparative Example 10 | 1 | | | | Nylon | HDPE | 10 | First | | | | 3 | 5 |
| Comparative Example 11 | 1 | | | | Nylon | HDPE | 50 | First | | | | 3 | 5 |

Examples 49 to 69

The purification device shown in FIG. 7 was prepared. Table 5 describes the materials of the filter media accommodated in the housing of each of the filter units the purification device comprises, and the like. In the column of "Type", whether the accommodated filter is a first filter or a second filter is described.

Specifically, the material of each filter medium is described in "Material". Particularly, for the first filter medium, the material of each layer is described. "Layer 1", "Layer 2", and "Layer 3" mean that "Layer 1", Layer 2, and "layer 3" are laminated in this order from the primary side.

In some examples, a tertiary filter unit is not used, and in this case, the column of "tertiary filter unit" in Table 5 is left blank.

In Examples 62 to 66 and 68 to 69, a quaternary filter unit is additionally disposed on the secondary side of the tertiary filter unit.

The abbreviations in the columns of Table 5 mean the following.

The materials of the first filter medium are as below.
"IEX": ion exchange-type membrane whose surface is modified with sulfonic acid group (manufactured by Pall Corporation)
"PTFE": nanoporous membrane layer formed of polytetrafluoroethylene (manufactured by Pall Corporation)
"Nylon": nanofiber layer formed of nylon
"UPE": nanoporous membrane layer containing ultra-high-molecular-weight polyethylene
"HDPE": nanoporous membrane layer formed of high density polyethylene (HDPE)

The materials of the second filter medium are as below.
"PTFE": nanoporous membrane layer formed of polytetrafluoroethylene
"PP": nanoporous membrane layer formed of polypropylene
"Oktlex": nanoporous membrane layer constituted with ultra-high-molecular-weight polyethylene as base material and obtained by modifying the surface thereof with nylon-based compound The substance to be purified containing the solvent of the type described in Table 5 was purified using the purification device described above, thereby obtaining a chemical liquid containing a solvent. The abbreviations in the column of "Substance to be purified" in Table 5 mean the following.
1: Butyl acetate (manufactured by FUJIFILM Electronic Materials Co., Ltd. (FFEM))
2: PGMEA/PGME (30/70 (volume/volume) mixture, the raw material is manufactured by FUJIFILM Electronic Materials Co., Ltd. (FFEM))
3: Isoamyl acetate (manufactured by FFEM)
4: Cyclohexanone (manufactured by FFEM)
5: PGMEA (manufactured by FFEM)

Specifically, the chemical liquid was generated by the following method. First, 40 L of the substance to be purified was introduced into the purification device. Then, circulation filtration was performed in which the purified substance to be purified that had been purified by each filter was introduced again into the manufacturing tank. This operation was repeated 10 times, thereby obtaining a chemical liquid.

<Evaluation of Defect Inhibition Performance of Chemical Liquid>

The defect inhibition performance of the chemical liquid manufactured using the manufacturing device described above was evaluated by the following method. The results are shown in Table 5.

First, a silicon oxide film substrate having a diameter of 300 mm was prepared.

Then, by using a wafer surface defect inspection device (SP-5; manufactured by KLA-Tencor Corporation), particles having a diameter equal to or greater than 30 nm that were present on the substrate were detected. Thereafter, by using a wafer surface defect analyzer (G6 manufactured by Applied Materials, Inc), the elements constituting the defects were analyzed, and the counted number of particles with a carbon atom content greater than 75% was evaluated the number of defects (the counted number was adopted as an initial value). Subsequently, the substrate was set in a spin jetting device, and while the substrate was being rotated, each of the chemical liquids was jetted to the surface of the substrate at a flow rate of 1.5 L/min. Then, the substrate was spin-dried.

Thereafter, by the same method as that described above, the number of defects was counted (the counted number was adopted as a counted value), and then a difference between the initial value and the counted value (initial value–counted value) was calculated. Based on the following standards, the obtained results were evaluated. The results are shown in Table 5.

"0": The difference between the initial value and the counted value of the number of defects was equal to or smaller than 5.

"1": The difference between the initial value and the counted value of the number of defects was 6 to 10.

"2": The difference between the initial value and the counted value of the number of defects was 11 to 100.

"3": The difference between the initial value and the counted value of the number of defects was 101 to 200.

"4": The difference between the initial value and the counted value of the number of defects was 201 to 1,000.

"5": The difference between the initial value and the counted value of the number of defects was greater than 1,001.

<Measurement of Pot Life of Filter Medium>

By using the purification device described above, each substance to be purified was continuously purified. In the middle of the process, whenever the amount of the liquid passing the device became 10,000 kg, the chemical liquid obtained after purification was collected for test. Then, by using a coater/developer LITHIUS manufactured by Tokyo Electron Limited, a 300 mm silicon substrate was coated with each of the chemical liquids for test for 60 seconds. Subsequently, for the obtained silicon wafer with a coating film, by using a wafer surface foreign substance inspection device SP-5 manufactured by KLA-Tencor Corporation, number of foreign substances having a diameter equal to or greater than 30 nm was counted. The amount of the liquid passing the device that was determined at a point in time when the counted number became twice the initial value was adopted as the pot life of the filter medium.

The result was calculated as a ratio determined on the premise that the pot life obtained in a case where only the first filter is used is 1, and evaluated based on the following standards.

The results are shown in Table 5.
0: The pot life was equal to or longer than 15.
1: The pot life was equal to or longer than 10 and shorter than 15.
2: The pot life was equal to or longer than 5 and shorter than 10.
3: The pot life was longer than 2 and shorter than 5.
4: The pot life was longer than 1 and shorter than 2.
5: The pot life was equal to or shorter than 1.

In Table 5, "Pore size" represents the pore size of the filter medium.

The column of "Difference (size of cumulative 75%–size of cumulative 10%)" shows a difference between a size (nm) of cumulative 75% and a size (nm) of cumulative 10% in a cumulative pore distribution of the filter medium (size (nm) of cumulative 75%–size (nm) of cumulative 10%).

The column of "Ratio (size of cumulative 75%/size of cumulative 10%)" shows a ratio of a size (nm) of cumulative 75% to a size (nm) of cumulative 10% in the pore distribution of the filter medium.

TABLE 6

| | Substance to be purified Type | Type of filter medium (Primary filter unit) | | | Type of filter medium (Secondary filter unit) | | | | | | | | |
|---|---|---|---|---|---|---|---|---|---|---|---|---|---|
| | | Material | Pore size (nm) | Type | Layer 1 Material | Layer 2 Material | Layer 3 Material | Pore size (nm) | Size of comulative 10% (nm) | Size of comulative 75% (nm) | Difference (size of comulative 75%-size of comulatie 10%) | Ratio (size of comulative 75%/size of comulatie 10%) | Type |
| Example 49 | 1 | PTFE | 10 | Second | IEX | UPE | | 15 | 3 | 10 | 7 | 3.3 | First |
| Example 50 | 1 | PTFE | 10 | Second | IEX | Nylon | UPE | 12 | 1 | 10 | 9 | 10.0 | First |
| Example 51 | 1 | PTFE | 10 | Second | PTFE | Nylon | UPE | 30 | 3 | 20 | 17 | 6.7 | First |
| Example 52 | 1 | PTFE | 10 | Second | Nylon | PTFE | | 15 | 3 | 10 | 7 | 3.3 | First |
| Example 53 | 1 | PP | 200 | Second | IEX | UPE | | 15 | 3 | 10 | 7 | 3.3 | First |

TABLE 6-continued

| | | | | | | | | | | | | | |
|---|---|---|---|---|---|---|---|---|---|---|---|---|---|
| Example 54 | 1 | PP | 200 | Second | IEX | Nylon | UPE | 12 | 1 | 10 | 9 | 10.0 | First |
| Example 55 | 1 | PP | 200 | Second | PTFE | Nylon | UPE | 15 | 2 | 10 | 8 | 5.0 | First |
| Example 56 | 1 | PP | 200 | Second | Nylon | PTFE | | 30 | 1 | 20 | 19 | 20.0 | First |
| Example 57 | 1 | PP | 200 | Second | IEX | PTFE | | 30 | 1 | 20 | 19 | 20.0 | First |
| Example 58 | 2 | PP | 200 | Second | IEX | PTFE | | 30 | 1 | 20 | 19 | 20.0 | First |
| Example 59 | 3 | PP | 200 | Second | IEX | PTFE | | 30 | 1 | 20 | 19 | 20.0 | First |
| Example 60 | 4 | PP | 200 | Second | IEX | PTFE | | 30 | 1 | 20 | 19 | 20.0 | First |
| Example 61 | 5 | PP | 200 | Second | IEX | PTFE | | 30 | 1 | 20 | 19 | 20.0 | First |
| Example 62 | 1 | PP | 200 | Second | Nylon | HDPE | | 30 | 1 | 20 | 19 | 20.0 | First |
| Example 63 | 2 | PP | 200 | Second | Nylon | HDPE | | 30 | 1 | 20 | 19 | 20.0 | First |
| Example 64 | 3 | PP | 200 | Second | Nylon | HDPE | | 30 | 1 | 20 | 19 | 20.0 | First |
| Example 65 | 4 | PP | 200 | Second | Nylon | HDPE | | 30 | 1 | 20 | 19 | 20.0 | First |
| Example 66 | 5 | PP | 200 | Second | Nylon | HDPE | | 30 | 1 | 20 | 19 | 20.0 | First |
| Example 67 | 1 | PTFE | 10 | Second | IEX | UPE | | 15 | 8 | 10 | 2 | 1.3 | First |
| Example 68 | 5 | PP | 200 | Second | Nylon | HDPE | | 30 | 18 | 20 | 2 | 1.1 | First |
| Example 69 | 5 | PP | 200 | Second | Nylon | HDPE | | 30 | 15 | 20 | 5 | 1.3 | First |

| | Type of filter medium (Tertiary filter unit) | | | Type of filter medium (quaternary filter unit) | | | Evaluation | |
|---|---|---|---|---|---|---|---|---|
| | Material | Pore size (nm) | Type | Material | Pore size (nm) | Type | Defect inhibition performance | Pot life of filter medium |
| Example 49 | | | | | | | 1 | 2 |
| Example 50 | | | | | | | 1 | 2 |
| Example 51 | | | | | | | 1 | 2 |
| Example 52 | | | | | | | 1 | 2 |
| Example 53 | PTFE | 10 | Second | | | | 1 | 1 |
| Example 54 | PTFE | 10 | Second | | | | 1 | 1 |
| Example 55 | PTFE | 10 | Second | | | | 1 | 1 |
| Example 56 | PTFE | 10 | Second | | | | 1 | 1 |
| Example 57 | PTFE | 10 | Second | | | | 1 | 1 |
| Example 58 | PTFE | 10 | Second | | | | 1 | 1 |
| Example 59 | PTFE | 10 | Second | | | | 1 | 1 |
| Example 60 | PTFE | 10 | Second | | | | 1 | 1 |
| Example 61 | PTFE | 10 | Second | | | | 1 | 1 |
| Example 62 | Oktlex | 3 | Second | PTFE | 5 | Second | 0 | 0 |
| Example 63 | Oktlex | 3 | Second | PTFE | 5 | Second | 0 | 0 |
| Example 64 | Oktlex | 3 | Second | PTFE | 5 | Second | 0 | 0 |
| Example 65 | Oktlex | 3 | Second | PTFE | 5 | Second | 0 | 0 |
| Example 66 | Oktlex | 3 | Second | PTFE | 5 | Second | 0 | 0 |
| Example 67 | | | | | | | 3 | 3 |
| Example 68 | Oktlex | 3 | Second | PTFE | 5 | Second | 2 | 2 |
| Example 69 | Oktlex | 3 | Second | PTFE | 5 | Second | 1 | 1 |

As shown in the above table, by the comparison of Examples 49 to 66, it has been revealed that the effects are further improved in a case where the purification device has a tertiary filter unit (more preferably, in a case where the purification device has a tertiary filter unit and a quaternary filter unit).

Furthermore, by the comparison of Examples 49 to 52 with Example 67, it has been revealed that the effects are further improved in a case where the difference (size of cumulative 75%–size of cumulative 10%) is equal to or greater than 3 nm.

Furthermore, by the comparison of Examples 62 to 66 with Example 69, it has been revealed that the effects are further improved in a case where the ratio (size of cumulative 75%/size of cumulative 10%) is 2.0 to 20.0.

Examples 70 to 83

The purification device shown in FIG. 7 was prepared. Table 6 describes the materials of the filter media accommodated in the housing of each of the filter units the purification device comprises, and the like. In the column of "Type", whether the accommodated filter is a first filter or a second filter is described.

Specifically, the material of each filter medium is described in "Material". Particularly, for the first filter medium, the material of each layer is described. "Layer 1", "Layer 2", and "Layer 3" mean that "Layer 1", "Layer 2, and "layer 3" are laminated in this order from the primary side.

In some examples, a tertiary filter unit is not used, and in this case, the column of "Tertiary filter unit" in Table 6 is left blank.

In Example 80, a quaternary filter unit is additionally disposed on the secondary side of the tertiary filter unit.

The abbreviations in the columns of Table 6 mean the following.

The materials of the first filter medium are as below.
"IEX": ion exchange-type membrane whose surface is modified with sulfonic acid group (manufactured by Pall Corporation)
"PTFE": nanoporous membrane layer formed of polytetrafluoroethylene (manufactured by Pall Corporation)
"Nylon": nanofiber layer formed of nylon
"UPE": nanoporous membrane layer containing ultra-high-molecular-weight polyethylene
"HDPE1": nanoporous membrane layer formed of HDPE hydrophilized by a plasma treatment. A water contact angle of the filter medium surface measured at 25° C. by using a contact angle meter was 50°.

The materials of the second filter are as below.
"PP": nanoporous membrane layer formed of polypropylene "HDPE": nanoporous membrane layer formed of high density polyethylene (HDPE)

"Oktlex": nanoporous membrane layer constituted with ultra-high-molecular-weight polyethylene as base material and obtained by modifying the surface thereof with nylon-based compound The substance to be purified containing the solvent of the type described in Table 6 was purified using the purification device described above, thereby obtaining a chemical liquid containing a solvent. The abbreviations in the column of "Substance to be purified" in Table 6 mean the following.

1: FHD-5 (aqueous alkaline developer)
2: FHD-402 (aqueous alkaline developer)

Specifically, the chemical liquid was generated by the following method. First, 40 L of the substance to be purified was introduced into the purification device. Then, circulation filtration was performed in which the purified substance to be purified that had been purified by each filter was introduced again into the manufacturing tank. This operation was repeated 10 times, thereby obtaining a chemical liquid.

The defect inhibition performance of the obtained chemical liquid was measured by the same method as that used in <Examples 49 to 69> described above. Furthermore, the pot life of the filter medium was measured by the method in <Examples 49 to 69> described above. The results are shown in Table 6.

In Table 6, "Pore size" represents the pore size of the filter medium

The column of "Difference (size of cumulative 75%–size of cumulative 10%)" shows a difference between a size (nm) of cumulative 75% and a size (nm) of cumulative 10% in a cumulative pore distribution of the filter medium (size (nm) of cumulative 75%–size (nm) of cumulative 10%).

The column of "Ratio (size of cumulative 75%/size of cumulative 10%)" shows a ratio of a size (nm) of cumulative 75% to a size (nm) of cumulative 10% in the pore distribution of the filter medium.

TABLE 7

| | Substance to be purified Type | Type of filter medium (Primary filter unit) | | | Type of filter medium (Secondary filter unit) | | | | | | | Difference (size of comulative 75%-size of comulatie 10%) | Ratio (size of comulative 75%/size of comulatie 10%) | |
|---|---|---|---|---|---|---|---|---|---|---|---|---|---|---|
| | | Material | Pore size (nm) | Type | Layer 1 Material | Layer 2 Material | Layer 3 Material | Pore size (nm) | Size of comulative 10% (nm) | Size of comulative 75% (nm) | | | | Type |
| Example 70 | 1 | PP | 200 | Second | IEX | UPE | | 15 | 3 | 10 | | 7 | 3.3 | First |
| Example 71 | 1 | PP | 200 | Second | IEX | Nylon | UPE | 12 | 1 | 10 | | 9 | 10.0 | First |
| Example 72 | 1 | PP | 200 | Second | PTFE | Nylon | UPE | 15 | 2 | 10 | | 8 | 50 | First |
| Example 73 | 1 | PP | 200 | Second | Nylon | PTFE | | 30 | 1 | 20 | | 19 | 20.0 | First |
| Example 74 | 2 | PP | 200 | Second | IEX | UPE | | 15 | 3 | 10 | | 7 | 3.3 | First |
| Example 75 | 2 | PP | 200 | Second | IEX | Nylon | UPE | 12 | 1 | 10 | | 9 | 10.0 | First |
| Example 76 | 2 | PP | 200 | Second | PTFE | Nylon | UPE | 15 | 2 | 10 | | 8 | 5.0 | First |
| Example 77 | 2 | PP | 200 | Second | Nylon | HDPE1 | | 30 | 1 | 20 | | 19 | 20.0 | First |
| Example 78 | 1 | PP | 200 | Second | Nylon | HDPE1 | | 30 | 1 | 20 | | 19 | 20.0 | First |
| Example 79 | 1 | PP | 200 | Second | Nylon | HDPE1 | | 30 | 1 | 20 | | 19 | 20.0 | First |
| Example 80 | 1 | PP | 200 | Second | Nylon | HDPE1 | | 30 | 1 | 20 | | 19 | 20.0 | First |
| Example 81 | 1 | PP | 200 | Second | IEX | UPE | | 15 | 8 | 10 | | 2 | 1.3 | First |
| Example 82 | 1 | PP | 200 | Second | Nylon | HDPE1 | | 30 | 18 | 20 | | 2 | 1.1 | First |
| Example 83 | 1 | PP | 200 | Second | Nylon | HDPE1 | | 30 | 15 | 20 | | 5 | 1.3 | First |

| | Type of filter medium (Tertiary filter unit) | | | Type of filter medium (quaternary filter unit) | | | Evaluation | |
|---|---|---|---|---|---|---|---|---|
| | Material | Pore size (nm) | Type | Material | Pore size (nm) | Type | Defect inhibition performance | Pot life of filter medium |
| Example 70 | | | | | | | 2 | 2 |
| Example 71 | | | | | | | 2 | 2 |
| Example 72 | HDPE | 10 | Second | | | | 2 | 1 |
| Example 73 | HDPE | 10 | Second | | | | 2 | 1 |
| Example 74 | HDPE | 10 | Second | | | | 2 | 1 |
| Example 75 | HDPE | 10 | Second | | | | 2 | 1 |
| Example 76 | HDPE | 10 | Second | | | | 2 | 1 |
| Example 77 | HDPE | 10 | Second | | | | 2 | 1 |
| Example 78 | HDPE | 10 | Second | | | | 2 | 1 |
| Example 79 | Oktlex | 3 | Second | | | | 2 | 1 |
| Example 80 | Oktlex | 3 | Second | HDPE | 5 | Second | 0 | 0 |
| Example 81 | | | | | | | 3 | 2 |
| Example 82 | Oktlex | 3 | Second | HDPE | 5 | Second | 2 | 2 |
| Example 83 | Oktlex | 3 | Second | HDPE | 5 | Second | 1 | 1 |

EXPLANATION OF REFERENCES

10: first filter
11a, 11b, 11c: layer
12, 21: filter medium
13, 22: core
14, 23: cap
15, 24: liquid inlet
20: second filter
30: filer unit
31: body
32: lid
33(a), 33(b): pipe line
34, 53, 57, 62: liquid inlet
35, 54, 58, 63: liquid outlet
41, 42: internal pipe line
43: filter
50, 60: filtering device
51(a) to 51(d): pipe line
52: primary filter unit
56: secondary filter unit
61: tertiary filter unit
70, 80: purification device
71: manufacturing tank
72: filling device
73(a) to 73(g): pipe line
74(a) to 74(f): valve
75(a), 75(b): pipe line
81: distillation column
90: manufacturing device
91: mixing device
92(a) to 92(c): storage tank
93(a), 93(b): reactor

What is claimed is:

1. A filtering device comprising:
a first filter unit including a first filter, which satisfies at least one condition selected from the group consisting of the following conditions 1 to 3, and a housing accommodating the first filter; and
a second filter unit including a second filter different from the first filter and a housing accommodating the second filter,
wherein the first filter unit and the second filter unit are independently disposed in a pipe line through which a substance to be purified is supplied,
condition 1: the first filter has a filter medium including two or more layers containing materials different from each other,
condition 2: the first filter has a filter medium including two or more layers having different pore structures,
condition 3: the first filter has a filter medium including one layer in which different materials are mixed together, and
wherein in a cumulative pore distribution of the filter medium that the first filter has, a difference between a size of cumulative 10% and a size of cumulative 75% is equal to or greater than 3 nm.

2. The filtering device according to claim 1, wherein a ratio of a size of cumulative 75% to a size of cumulative 10% is 2.0 to 20.0.

3. The filtering device according to claim 1, wherein a pore size of a filter medium that the second filter has is equal to or smaller than 200 nm.

4. The filtering device according to claim 1, wherein a pore size of a filter medium that the second filter has is equal to or smaller than 100 nm.

5. The filtering device according to claim 1, wherein a pore size of a filter medium that the second filter has is equal to or smaller than a pore size of the filter medium that the first filter has.

6. The filtering device according to claim 1, wherein the second filter unit is on a secondary side of the first filter unit, and
a pore size of a filter medium that the second filter has is equal to or smaller than a pore size of the filter medium that the first filter has.

7. The filtering device according to claim 1, wherein the second filter unit is disposed on a primary side of the first filter unit.

8. The filtering device according to claim 7, wherein a pore size of a filter medium that the second filter has is equal to or greater than a pore size of the filter medium that the first filter has.

9. The filtering device according to claim 1, wherein the second filter unit is further disposed on a secondary side of the first filter unit,
a pore size of a filter medium included in the second filter unit disposed on the secondary side is equal to or smaller than a pore size of the filter medium that the first filter has, and
the filter medium that the first filter has includes a layer containing a base material having undergone a surface treatment.

10. The filtering device according to claim 1, wherein the first filter has a filter medium including two or more layers containing materials different from each other.

11. The filtering device according to claim 1, wherein a filter medium that the second filter has contains the same material as the material of any of the two or more layers.

12. The filtering device according to claim 1, wherein in a relationship among Hansen solubility parameters $\delta Dp$, $\delta Pp$, and $\delta Hp$ and an interaction radius R0 of at least one kind of filter medium selected from the group consisting of the filter medium that the first filter has and a filter medium that the second filter has and Hansen solubility parameters $\delta Ds$, $\delta Ps$, and $\delta Hs$ of the substance to be purified, provided that Ra is represented by an equation of $Ra^2=4(\delta Ds-\delta Dp)^2+(\delta Ps-\delta Pp)^2+(\delta Hs-\delta Hp)^2$, a ratio of Ra to R0 is equal to or lower than 1.0.

13. The filtering device according to claim 1, wherein the first filter has a filter medium including two or more layers having pore structures different from each other.

14. The filtering device according to claim 1, wherein the first filter has a filter medium including a layer having pore structures different from each other in a thickness direction.

15. The filtering device according to claim 1, wherein the filter medium that the first filter has includes a layer containing a base material having an ion exchange group.

16. The filtering device according to claim 1, wherein the filter medium that the first filter has includes a layer containing a base material having undergone a surface treatment selected from the group consisting of a chemical modification treatment and a plasma treatment and a layer containing a base material having not undergone a surface treatment.

17. The filtering device according to claim 1,
wherein at least one kind of filter selected from the group consisting of the first filter and the second filter is capable of being backwashed.

18. The filtering device according to claim 1,
wherein the filter medium that the first filter has and a filter medium that the second filter has contain at least one kind of material selected from the group consisting of nylon, polyethylene, polypropylene, polyfluorocarbon, cellulose, diatomite, polystyrene, glass, and polysulfone.

19. The filtering device according to claim 1,
wherein at least one kind of filter medium selected from the group consisting of the filter medium that the first filter has and a filter medium that the second filter has includes at least one kind of layer selected from the group consisting of a nanoporous membrane layer and a nanofiber layer.

20. The filtering device according to claim 19,
wherein the filter medium that the first filter has includes at least the nanoporous membrane layer and the nanofiber layer.

21. The filtering device according to claim 1,
wherein the filter medium that the first filter has includes a non-sieving membrane layer having a pore size distribution of 10 to 50 nm, a sieving membrane layer having a pore size distribution of 2 to 50 nm, and a nylon nanofiber layer.

22. The filtering device according to claim 21,
wherein the nylon nanofiber layer is between the non-sieving membrane layer and the sieving membrane layer.

23. The filtering device according to claim 21,
wherein the non-sieving membrane layer is between the sieving membrane layer and the nylon nanofiber layer.

24. The filtering device according to claim 21,
wherein the sieving membrane layer is between the non-sieving membrane layer and the nylon nanofiber layer.

25. The filtering device according to claim 18,
wherein the first filter further includes a porous support constituted with one layer or two or more layers.

26. The filtering device according to claim 1,
wherein the first filter is capable of being backwashed by causing a washing solution to flow from the secondary side of the first filter unit to the primary side of the first filter unit.

27. A purification device comprising:
the filtering device according to claim 1; and
a tank which is on a primary side of the filtering device and capable of storing a substance to be purified.

28. The purification device according to claim 27,
wherein a secondary side of the first filter unit is connected to the tank through a pipe line, and
a filtered substance to be purified having been filtered through at least the first filter is capable of being sent back to the tank through the pipe line.

29. The purification device according to claim 27, further comprising;
a distillation device on a primary side of the filtering device.

30. The purification device according to claim 27, further comprising;
a circulable path in the filtering device.

31. The filtering device according to claim 1,
wherein a pore size of the filter medium that the first filter has is equal to or greater than 12 nm and less than 50 nm.

32. A chemical liquid manufacturing device comprising:
the filtering device according to claim 1; and
a mixing device preparing a substance to be purified by mixing one raw material or two or more raw materials together.

33. A filtering device comprising:
a first filter unit including a first filter, which satisfies at least one condition selected from the group consisting of the following conditions 1 to 3, and a housing accommodating the first filter,
a second filter unit including a second filter different from the first filter and a housing accommodating the second filter,
a tertiary filter unit, and
a quaternary filter unit,
wherein the first filter unit, the second filter unit, the tertiary filter unit and the quaternary filter unit are independently disposed in a pipe line through which a substance to be purified is supplied,
condition 1: the first filter has a filter medium including two or more layers containing materials different from each other,
condition 2: the first filter has a filter medium including two or more layers having different pore structures,
condition 3: the first filter has a filter medium including one layer in which different materials are mixed together, and
wherein in a cumulative pore distribution of the filter medium that the first filter has, a difference between a size of cumulative 10% and a size of cumulative 75% is equal to or greater than 3 nm.

34. The filtering device according to claim 33,
wherein a ratio of a size of cumulative 75% to a size of cumulative 10% is 2.0 to 20.0.

35. The filtering device according to claim 33,
wherein a pore size of the filter medium that the first filter has is equal to or greater than 12 nm and less than 50 nm.

* * * * *